United States Patent
Price et al.

(10) Patent No.: US 11,304,002 B2
(45) Date of Patent: Apr. 12, 2022

(54) SINGLE TRANSDUCER AUDIO IN/OUT DEVICE

(71) Applicant: SIGMASENSE, LLC., Wilmington, DE (US)

(72) Inventors: John Christopher Price, Austin, TX (US); Phuong Huynh, Fairfax, VA (US); Daniel Keith Van Ostrand, Leander, TX (US); Patrick Troy Gray, Cedar Park, TX (US)

(73) Assignee: SIGMASENSE, LLC., Wilmington, DE (US)

( * ) Notice: Subject to any disclaimer, the term of this patent is extended or adjusted under 35 U.S.C. 154(b) by 0 days.

(21) Appl. No.: 16/947,687

(22) Filed: Aug. 12, 2020

(65) Prior Publication Data

US 2022/0053269 A1 Feb. 17, 2022

(51) Int. Cl.
*H03G 5/00* (2006.01)
*H04R 3/04* (2006.01)
*H03M 1/00* (2006.01)
*H04R 1/28* (2006.01)
*H04R 3/00* (2006.01)

(52) U.S. Cl.
CPC .............. *H04R 3/04* (2013.01); *H03M 1/001* (2013.01); *H04R 1/2803* (2013.01)

(58) Field of Classification Search
CPC ........ H04R 3/04; H04R 1/2803; H03M 1/001
USPC ..................................................... 381/98, 96
See application file for complete search history.

(56) References Cited

U.S. PATENT DOCUMENTS

| | | |
|---|---|---|
| 6,218,972 B1 | 4/2001 | Groshong |
| 6,665,013 B1 | 12/2003 | Fossum et al. |
| 7,528,755 B2 | 5/2009 | Hammerschmidt |
| 8,031,094 B2 | 10/2011 | Hotelling |
| 8,089,289 B1 | 1/2012 | Kremin et al. |
| 8,279,180 B2 | 10/2012 | Hotelling et al. |
| 8,547,114 B2 | 10/2013 | Kremin |
| 8,587,535 B2 | 11/2013 | Oda et al. |
| 8,625,726 B2 | 1/2014 | Kuan |

(Continued)

FOREIGN PATENT DOCUMENTS

| | | |
|---|---|---|
| CN | 103995626 A | 8/2014 |
| CN | 104182105 A | 12/2014 |

OTHER PUBLICATIONS

Baker; How delta-sigma ADCs work, Part 1; Analog Applications Journal; Oct. 1, 2011; 6 pgs.

(Continued)

*Primary Examiner* — Ammar T Hamid
(74) *Attorney, Agent, or Firm* — Garlick & Markison; Timothy W. Markison; Patricia M. Healy

(57) ABSTRACT

An audio in/out device includes an audible in/out transducer operable to convert an audible input signal to an audio receive (RX) signal and convert an audio transmit (TX) signal to an audible output signal. The audio in/out device further includes an audio receive/transmit (RX/TX) circuit operable to convert a digital TX signal to the audio TX signal for transmission to the audible in/out transducer, receive the audio RX signal from the audible in/out transducer, and convert the audio RX signal into a digital transmit/receive (Tx/Rx) signal. The digital Tx/Rx signal includes a representation of the audio RX signal.

16 Claims, 36 Drawing Sheets
(16 of 36 Drawing Sheet(s) Filed in Color)

(56) References Cited

U.S. PATENT DOCUMENTS

| | | | |
|---|---|---|---|
| 8,982,097 B1 | 3/2015 | Kuzo et al. | |
| 9,201,547 B2 | 12/2015 | Elias | |
| 2010/0177846 A1* | 7/2010 | Rofougaran | H04B 1/30 375/295 |
| 2011/0063154 A1 | 3/2011 | Hotelling et al. | |
| 2011/0298745 A1 | 12/2011 | Souchkov | |
| 2012/0278031 A1 | 11/2012 | Oda | |
| 2013/0278447 A1 | 10/2013 | Kremin | |
| 2014/0327644 A1 | 11/2014 | Mohindra | |
| 2015/0091847 A1 | 4/2015 | Chang | |
| 2015/0346889 A1 | 12/2015 | Chen | |
| 2016/0182989 A1* | 6/2016 | Kim | H04R 7/02 381/163 |
| 2016/0188049 A1 | 6/2016 | Yang et al. | |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

* cited by examiner communication system 10 computing device 12, 13 computing device 12, 13 computing device 12, 13 computing device 12, 13 audio in/out device 65 audio in/out device 65

DAC module 104

TX reference signal 95 mic mode
audio in/out device 65 mic & speaker mode
audio in/out device 65 electrical variation of transducer from audio in current variation of transducer from audio out current variation of transducer from audio in Vin_1 = Vin_2

Vout audio in/out device 65 audio in/out device 65 audio in/out device 65 audio in/out device 65 audio in/out device 65 audio in/out device 65 audio in/out device 65 audio in/out device 65 audio in/out device 65 acoustic imaging device 300 acoustic imaging device 300

DSC = drive sense circuit
Cs = self capacitance
Cm = mutual capacitance touch screen with sensors &
drive-sense circuits 16 touch indication circuit 218 touch indication circuit 218

SINGLE TRANSDUCER AUDIO IN/OUT DEVICE

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to communication systems and more particularly to a single transducer audio in/out device of a communication system.

Description of Related Art

Data communication involves sending data from one device to another device via a communication medium (e.g., a wire, a trace, a twisted pair, a coaxial cable, air, etc.). The devices range from dies within an integrated circuit (IC), to ICs on a printed circuit board (PCB), to PCBs within a computer, to computers, to networks of computers, and so on.

Data is communicated via a wired and/or a wireless connection and is done so in accordance with a data communication protocol. Data communication protocols dictate how the data is to be formatted, encoded/decoded, transmitted, and received. For example, a wireless data communication protocol such as IEEE 802.11 dictates how wireless communications are to be done via a wireless local area network. As another example, Sony/Philips Digital Interface Format (SPDIF) dictates how digital audio signals are transmitted and received. As yet another example, Inter-Integrated Circuit (I²C) is a two-wire serial protocol to connect devices such as microcontrollers, digital to analog converters, analog to digital converters, peripheral devices to a computer, and so on.

In addition, data communication protocols dictate how transmission errors are to be handled. For example, wireless communications often experience data errors, so the protocol dictates a form of forward error correction (e.g., Reed Solomon encoding, Turbo encoded, etc.) be used. As another example, wired communications experience much less data errors than wireless communications so the protocol dictates a form of feedback error correction (e.g., resend request, etc.) be used.

For some data communications, digital data is modulated with an analog carrier signal and transmitted/received via a modulated radio frequency (RF) signal. For other data communications, the digital data is transmitted "as is" via a wire or metal trace on a PCB. Regardless of the data communication protocol, digital data is in binary form where a logic "1" value is represented by a voltage that is at least 90% of the positive rail voltage and a logic "0" is represented by a voltage it is at most 10% of the negative rail voltage.

BRIEF DESCRIPTION OF THE SEVERAL VIEWS OF THE DRAWING(S)

The patent or application file contains at least one drawing executed in color. Copies of this patent or patent application publication with color drawing(s) will be provided by the Office upon request and payment of the necessary fee.

DETAILED DESCRIPTION OF THE INVENTION

Figure 1:
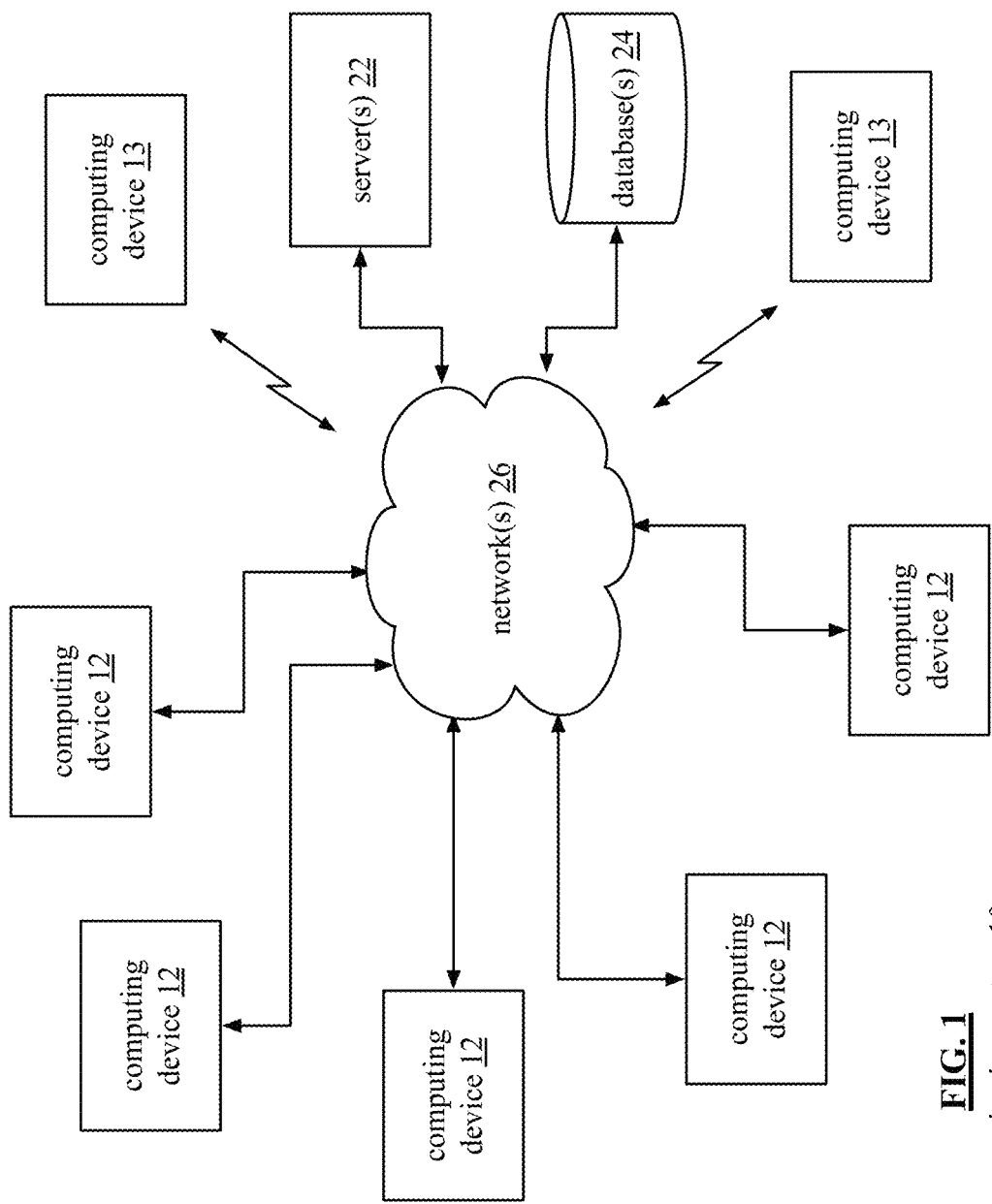
FIG. 1 is a schematic block diagram of an embodiment of a communication system in accordance with the present invention.

FIG. 1 is a schematic block diagram of an embodiment of a communication system 10 that includes a plurality of wired computing devices 12, a plurality of wireless computing devices 13, one or more servers 22, one or more databases 24, and one or more networks 26. Embodiments of computing devices 12 and 13 are similar in construct and/or functionality with a difference being the computing devices 12 couple to the network(s) 26 via a wired network card and the wireless communication devices 13 coupled to the network(s) 26 via a wireless connection. In an embodiment, a computing device can have both a wired network card and a wireless network card such that it is both computing devices 12 and 13.

A computing device 12 and/or 13 may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12 and 13 will be discussed in greater detail with reference to one or more of FIGS. 2-3A.

A server 22 is a special type of computing device that is optimized for processing large amounts of data requests in parallel. A server 22 includes similar components to that of the computing devices 12 and/or 13 with more robust processing modules, more main memory, and/or more hard drive memory (e.g., solid state, hard drives, etc.). Further, a server 22 is typically accessed remotely; as such it does not generally include user input devices and/or user output devices. In addition, an embodiment of a server is a standalone separate computing device and/or may be a cloud computing device.

A database 24 is a special type of computing device that is optimized for large scale data storage and retrieval. A database 24 includes similar components to that of the computing devices 12 and/or 13 with more hard drive memory (e.g., solid state, hard drives, etc.) and potentially with more processing modules and/or main memory. Further, a database 24 is typically accessed remotely; as such it does not generally include user input devices and/or user output devices. In addition, an embodiment of a database 24 is a standalone separate computing device and/or may be a cloud computing device.

The network(s) 26 includes one or more local area networks (LAN) and/or one or more wide area networks (WAN), which may be a public network and/or a private network. A LAN may be a wireless-LAN (e.g., Wi-Fi access point, Bluetooth, ZigBee, etc.) and/or a wired LAN (e.g., Firewire, Ethernet, etc.). A WAN may be a wired and/or wireless WAN. For example, a LAN is a personal home or business's wireless network and a WAN is the Internet, cellular telephone infrastructure, and/or satellite communication infrastructure.

The wired computing devices 12 and/or the wireless computing devices 13 communicate sensed data within the communication system 10. For example, wired computing devices 12 and/or the wireless computing devices 13 include or connect to one or more single transducer audio in/out devices (also referred to herein as "audio in/out devices") for communicating audio information within the communication system 10. The audio information communication is between devices and/or is within a device. A single transducer audio in/out device is operable to convert sound waves to an electrical signal (e.g., operate as a microphone) and convert electrical signals to a sound output (e.g., operate as a speaker) using a single transducer. The single transducer audio in/out device is discussed in more detail with reference to FIGS. 2-3 and 4-23.

In another example, the wired computing devices 12 and/or the wireless computing devices 13 include or connect to one or more single transducer acoustic imaging devices (also referred to herein as "acoustic imaging devices") for detecting and image mapping objects in proximity to the communication system 10. A single acoustic imaging device is operable to convert an electrical detection signal to an acoustic detection signal (e.g., ultrasound waves) and, when the acoustic detection signal reflects off of an object, to convert an acoustic reflection signal to an electrical reflection signal using a single transducer. The time between the detection signal is sent and the reflection signal is received is used to calculate the transducer's distance from the object and generate an image.

For example, the single transducer acoustic imaging device is a sonar (sound navigation and ranging) device for mapping an ocean floor. As another example, the single transducer acoustic imaging device is an ultrasound machine for generating images of internal organs and/or other bodily materials. The single transducer acoustic imaging device is discussed in more detail with reference to FIGS. 3A and 24-25.

In another example, the wired computing devices 12 and/or the wireless computing devices 13 include or connect to one or more touch screens with sensors and drive sense circuits for communicating touch sense data within the communication system 10. The touch sense data communication is between devices and/or is within a device. The touch screen with sensors and drive sense circuits is discussed in more detail with reference to FIGS. 3A and 26-35B.

Figure 2:
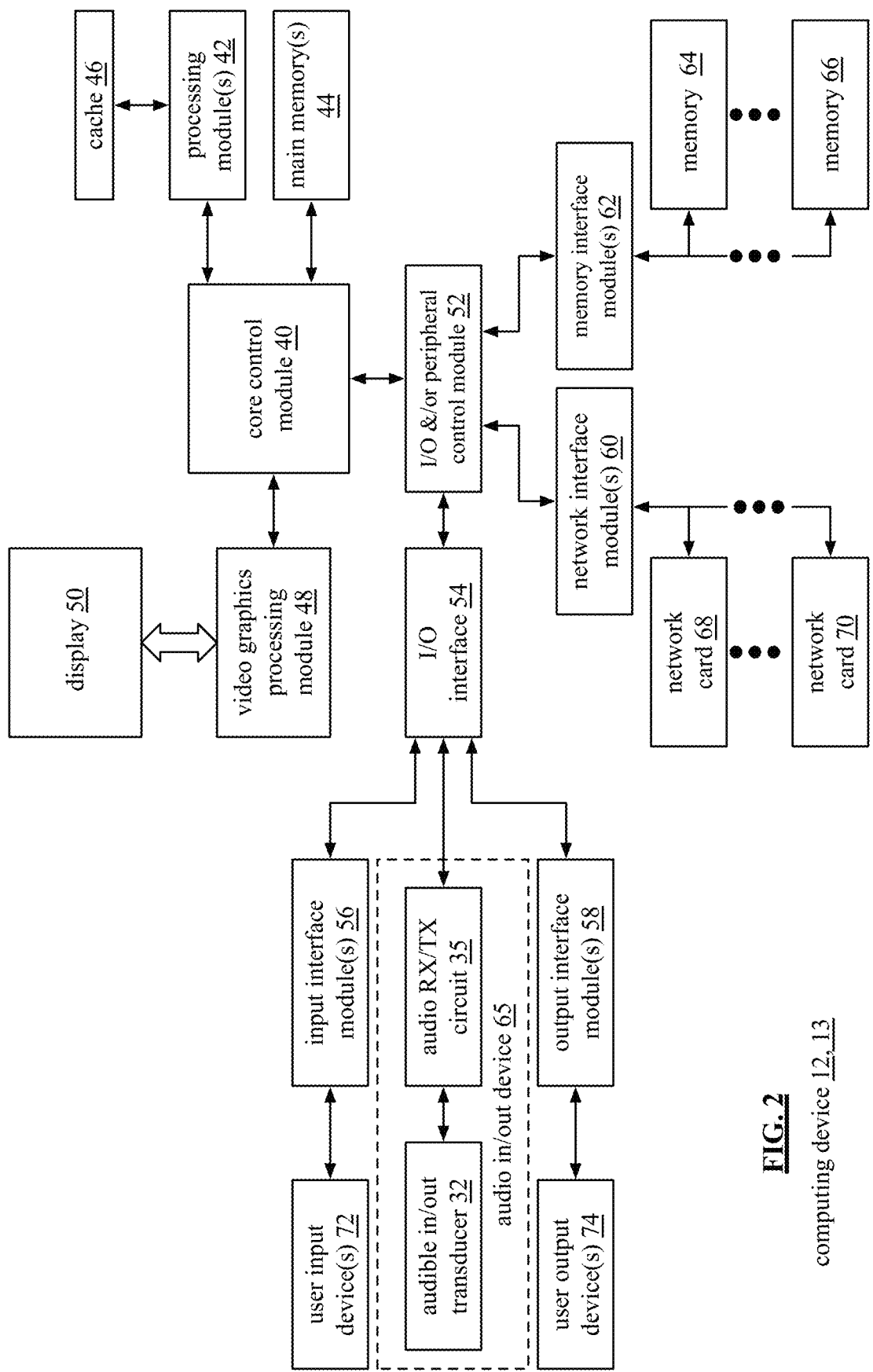
FIG. 2 is a schematic block diagram of an embodiment of a computing device in accordance with the present invention.

FIG. 2 is a schematic block diagram of an embodiment of a computing device 12 or 13 that includes a core control module 40, one or more processing modules 42, one or more main memories 44 (e.g., volatile memory), cache memory 46, a video graphics processing module 48, a display 50, an Input-Output (I/O) and/or peripheral control module 52, one or more input interface modules 56, one or more output interface modules 58, an integrated (i.e., built in) audio in/out device 65, one or more network interface modules 60, and one or more memory interface modules 62.

A processing module 42 is described in greater detail at the end of the detailed description of the invention section and, in an alternative embodiment, has a direct connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieved from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 (i.e., non-volatile memory) includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and a network, or networks, via the I/O and/or peripheral control module 52, the network interface module(s) 60, and a network card 68 or 70. A network card 68 or 70 includes a wireless communication unit (e.g., for a wireless computing device 13) or a wired communication unit (e.g., for a wired computing device 12). A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and the user input device(s) 72 via the input interface module(s) 56 and the I/O and/or peripheral control module 52. A user input device 72 includes a keypad, a keyboard, control switches, a touchpad, a microphone, a camera, etc. An input interface module 56 includes a software driver and a hardware connector for coupling a user input device to the I/O and/or peripheral control module 52. In an embodiment, an input interface module is in accordance with one or more Universal Serial Bus (USB) protocols.

The core control module 40 coordinates data communications between the processing module(s) 42 and the user output device(s) 74 via the output interface module(s) 58 and the I/O and/or peripheral control module 52. A user output device 74 includes a speaker, etc. An output interface module 58 includes a software driver and a hardware connector for coupling a user output device 58 to the I/O and/or peripheral control module 52. In an embodiment, an output interface module 58 is in accordance with one or more audio codec protocols.

The core control module 40 coordinates data communications between the processing module(s) 42 and the audio in/out device(s) 65 and the I/O and/or peripheral control module 52. The audio in/out device 65 includes an audible in/out transducer 32 and an audio receive/transmit (RX/TX) circuit 35. In comparison to the user input device(s) 72 and the user output device(s) 74, the audio in/out device 65 is both an input and output device.

A transducer has varying electrical characteristics (e.g., capacitance, inductance, impedance, current, voltage, etc.) based on varying physical conditions (e.g., pressure, temperature, biological, chemical, etc.). As such, a transducer functions to convert one form of energy (e.g., force, sound, etc.) into another form of energy (e.g., electrical signal). Sound transducers include dynamic transducers, condenser transducers, electret condenser transducers, ribbon transducers, piezoelectric transducers, etc. Piezoelectric transducers consist of materials that experience the piezoelectric effect. The piezoelectric effect is the ability of certain materials to generate an electric charge in response to applied mechanical stress such as the presence of sound waves. Examples of piezoelectric materials include quartz crystals, piezoelectric ceramics, and certain kinds of biological matter.

Acoustic or sound transducers typically include two types: input transducers (or sound to electrical transducers (e.g., a microphone, noise sensor, etc.)) and output actuators (or electrical to sound transducers (e.g., a speaker)). A microphone is operable to convert the air pressure variations of a sound wave into an electrical signal and a speaker is operable to convert an electrical signal into a sound wave for output. In conventional audio devices, for every microphone transducer, there is a corresponding speaker transducer.

Due to the unique circuitry of the audio receive/transmit (RX/TX) circuit 35, a single audible in/out transducer 32 is operable as both a microphone and a speaker. In general, the audio RX/TX circuit 35 is operable to drive the single audible in/out transducer 32 using a generated TX signal for output while receiving and processing an RX signal representative of sound from the single audible in/out transducer 32. The audio receive/transmit (RX/TX) circuit 35 of the audio in/out device 65 will be discussed in further detail with reference to FIGS. 4-23.

While one audible in/out transducer 32 is shown here, multiple audible in/out transducers 32 and audio receive/transmit (RX/TX) circuits 35 can be used for multiple speaker/microphone implementations. For example, stereophonic ("stereo") sound is a method of sound reproduction that creates the illusion of multi-directional sound perspective. For stereo sound, two or more independent audio channels (i.e., signals) are used and thus two transducers, where one channel feeds one transducer (e.g., a left speaker) and another channel feeds the other (e.g., a right speaker). In monoaural ("mono") sound, one signal is used. A mono sound signal can be copied to multiple speakers thus requiring more transducers or to a single speaker thus requiring one transducer. Surround sound uses more than two channels and thus more than two transducers to produce a more immersive sound experience coming from multiple directions.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50. While not shown, the computing device 12 or 13 further includes a BIOS (Basic Input Output System) memory coupled to the core control module 40.

Figure 3:
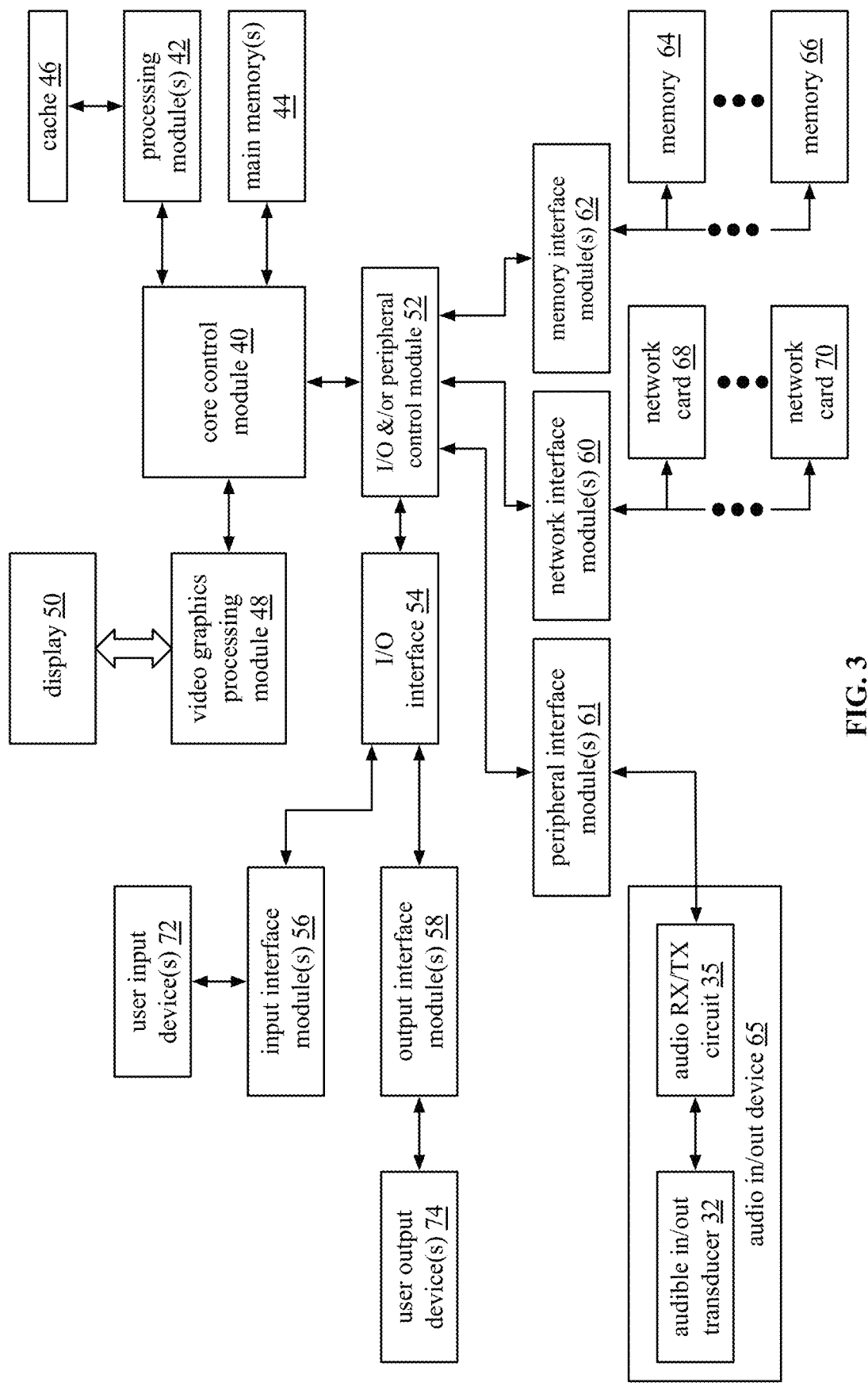
FIG. 3 is a schematic block diagram of another embodiment of a computing device in accordance with the present invention.

FIG. 3 is a schematic block diagram of another embodiment of a computing device 12 or 13 that includes a core control module 40, one or more processing modules 42, one or more main memories 44, cache memory 46, a video graphics processing module 48, an Input-Output (I/O) peripheral control module 52, one or more input interface modules 56, one or more output interface modules 58, one or more network interface modules 60, one or more peripheral interface module(s) 61, one or more memory interface modules 62, and an audio in/out device 65.

Computing device 12 or 13 operates similarly to computing device 12 or 13 of FIG. 2 except for the addition of the one or more peripheral interface module(s) 61 and that the audio in/out device 65 is a peripheral device external to the computing device 12 or 13 (as opposed to the built in example shown in FIG. 2).

The core control module 40 coordinates data communications between the processing module(s) 42 and peripheral audio in/out device 65 via the peripheral interface module(s) 61 and the I/O and/or peripheral control module 52. The peripheral audio in/out device 65 may be a single ear mono headset requiring one audible in/out transducer 32 and one audio TX/RX circuit 35, a dual ear mono headset requiring two audible in/out transducers 32 and two audio TX/RX circuits 35, a stereo headset requiring two audible in/out transducers 32 and two audio TX/RX circuits 35, an external surround sound system requiring multiple audible in/out transducers 32 and multiple audio TX/RX circuits 35, and/or any other external device having dual speaker/microphone functionality (e.g., a speaker/microphone device for a conference table, etc.).

The peripheral audio in/out device 65 may include a noise canceling feature when applicable (e.g., when the peripheral audio in/out device 65 is a headset, headphones, earphones, ear buds, etc.). Because noise can be detected on the same line as transmission, the circuitry of the audio in/out device 65 allows for improved noise canceling in comparison to conventional noise canceling technology. The audio in/out device as a noise canceling speaker system is discussed in more detail with reference to FIGS. 18-23.

The peripheral interface module(s) 61 may include a software driver and a hardware connector for coupling the peripheral audio in/out device 65 to the I/O and/or peripheral control module 52. In an embodiment, the peripheral interface module(s) 61 is in accordance with one or more Universal Serial Bus (USB) protocols. In another embodiment, the peripheral interface module(s) 61 is in accordance with one or more audio codec protocols. The peripheral interface module(s) 61 may facilitate a network connection (e.g., via Bluetooth) between the audio in/out device 65 and the I/O and/or peripheral control module 52 of the computing device 12 or 13.

Figure 3A:
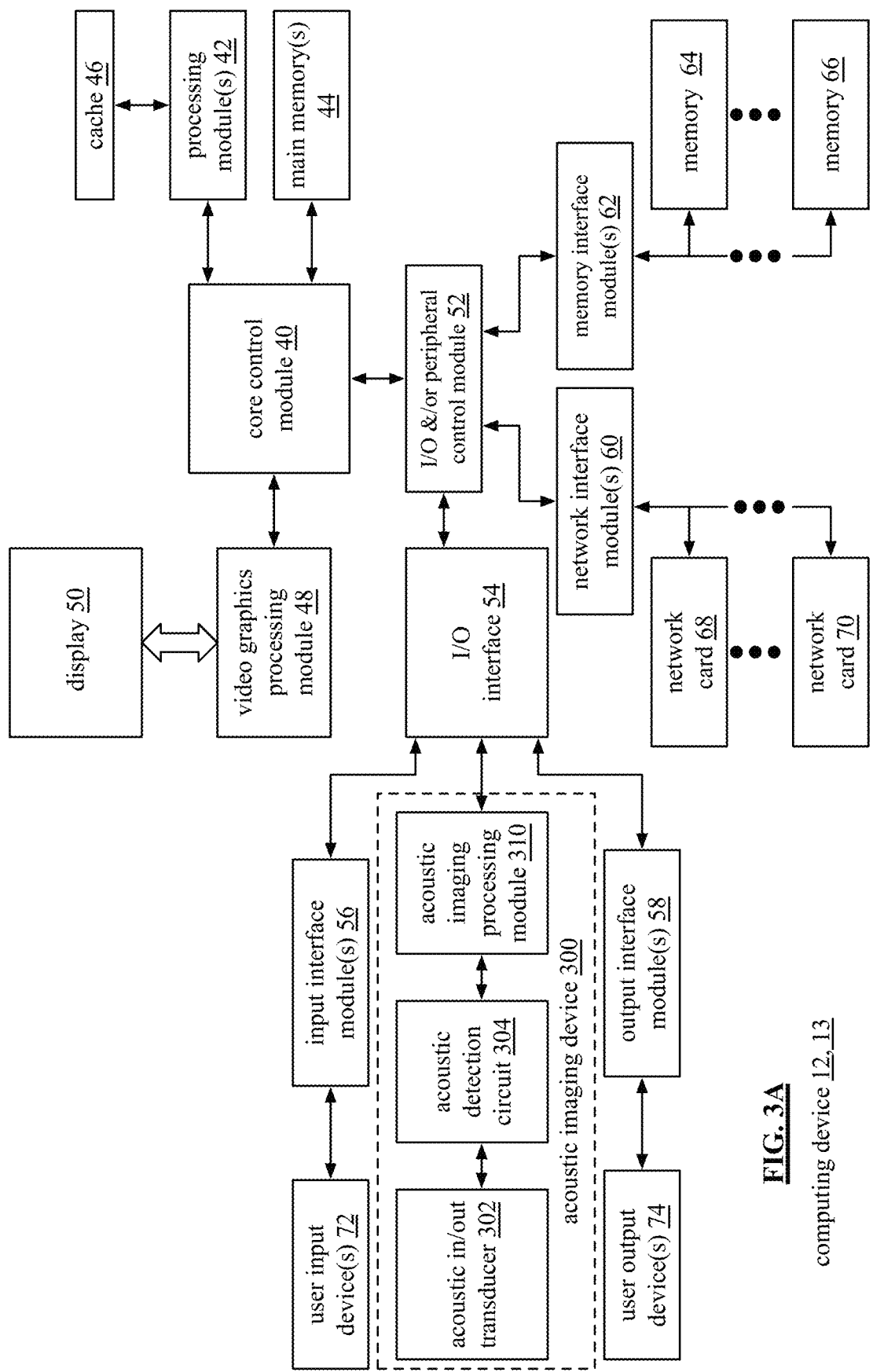
FIG. 3A is a schematic block diagram of another embodiment of a computing device in accordance with the present invention.

FIG. 3A is a schematic block diagram of another embodiment of a computing device 12 or 13 that includes a core control module 40, one or more processing modules 42, one or more main memories 44, cache memory 46, a video graphics processing module 48, an Input-Output (I/O) peripheral control module 52, one or more input interface modules 56, one or more output interface modules 58, one or more acoustic imaging devices 300, one or more network interface modules 60, and one or more memory interface modules 62. The computing device 12 or 13 of FIG. 3A may also include one or more audio in/out devices as discussed with reference to FIGS. 2 and/or 3.

Computing device 12 or 13 operates similarly to computing device 12 or 13 of FIG. 2 except that an acoustic imaging device 300 is integrated into the computing device 12 or 13 instead of the audio in/out device. The core control module 40 coordinates data communications between the processing module(s) 42 and the acoustic imaging device 300 and the I/O and/or peripheral control module 52.

The acoustic imaging device 300 includes an acoustic in/out transducer 302, an acoustic detection circuit 304, and an acoustic imaging processing module 310. The acoustic imaging processing module 310 may be part of the processing module(s) 42. The acoustic imaging device 300 is both an input and output device. The acoustic in/out transducer 302 is similar to the audible in/out transducer in that it functions to convert sound to and from an electrical signal. However, the acoustic in/out transducer 302 is affected by high frequency sound waves used for object detection and measurement that may be out of the human audible range (e.g., greater than 20 kHz). For example, the acoustic in/out transducer 302 is an ultrasonic piezoelectric transducer that is capable of generating and receiving ultrasonic vibrations.

Due to the unique circuitry of the acoustic detection circuit 304, a single acoustic in/out transducer 302 is operable to both transmit a detection signal and receive a reflected signal. In general, the acoustic detection circuit 304 is operable to drive the single acoustic in/out transducer 302 using a generated detection signal for output while receiving and processing a reflected signal representative of sound from the single acoustic in/out transducer 302. The acoustic detection circuit 304 detects a phase change between the transmitted detection signal and the received reflection signal and provides the phase change to the acoustic imaging processing module 310.

The acoustic imaging processing module 310 is operable to determine a time delay based off of the phase change and determine a distance measurement based off of the time delay. The distance measurement is used to generate imaging information. The acoustic imaging processing module 310 and the acoustic detection circuit 304 will be discussed in greater detail with reference to FIGS. 24-25.

While one acoustic in/out transducer 302 is shown here, multiple acoustic in/out transducers 302 and acoustic detection circuits 304 can be used to generate a plurality of distance measurements to generate three dimensional (3D) image mapping.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50. While not shown, the computing device 12 or 13 further includes a BIOS (Basic Input Output System) memory coupled to the core control module 40.

Figure 3B:
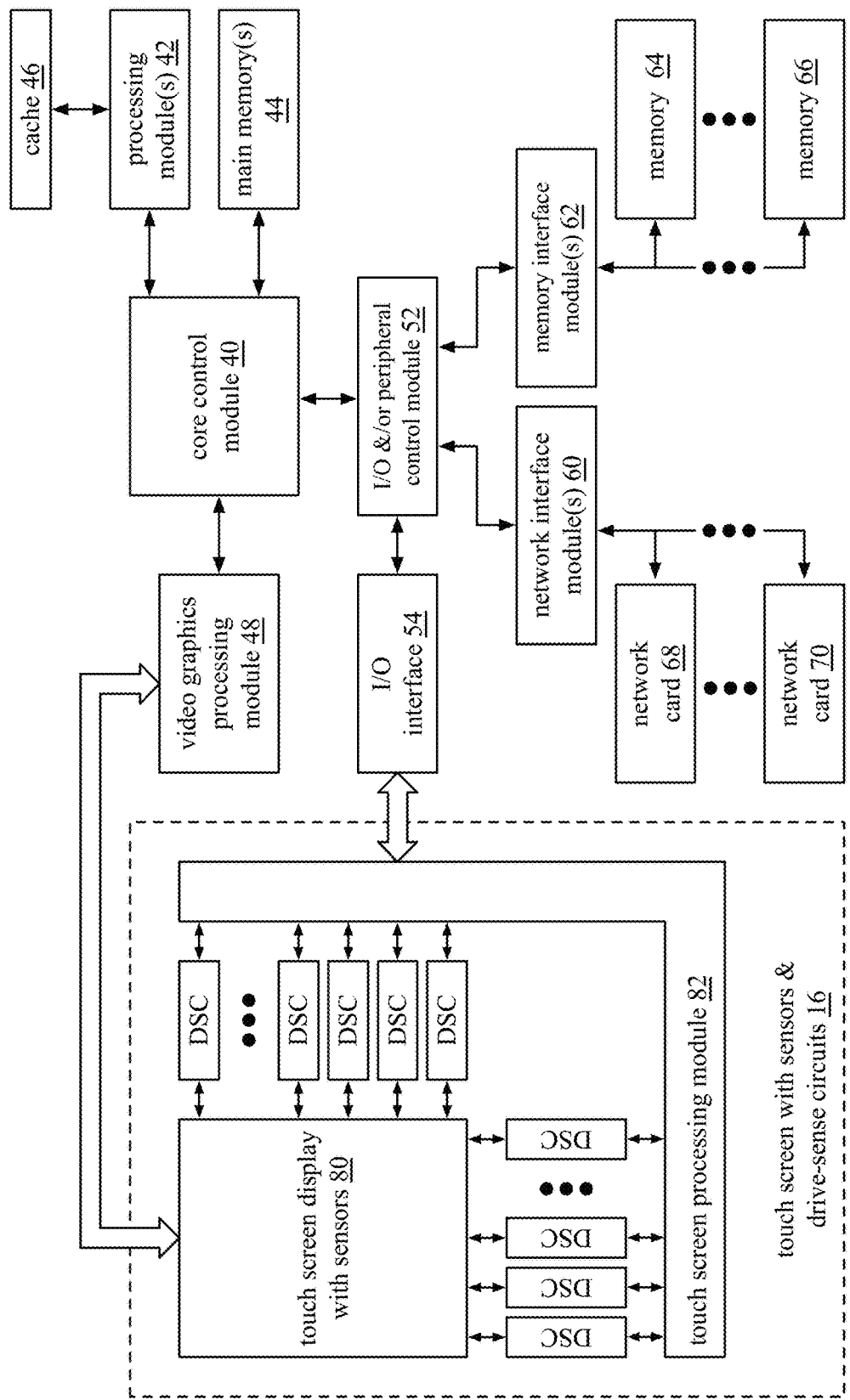
FIG. 3B is a schematic block diagram of another embodiment of a computing device in accordance with the present invention.

FIG. 3B is a schematic block diagram of another embodiment of a computing device 12 or 13 that includes a core control module 40, one or more processing modules 42, one or more main memories 44, cache memory 46, a video graphics processing module 48, a touch screen with sensors and drive sense circuits (DSC) 16, an Input-Output (I/O) peripheral control module 52, one or more input interface modules 56, one or more output interface modules 58, one or more network interface modules 60, and one or more memory interface modules 62. The touch screen with sensors and drive sense circuits (DSC) 16 includes a touch screen display integrated with a plurality of sensors 80, a plurality of drive-sense circuits (DSC), and a touch screen processing module 82. The computing device 12 or 13 of FIG. 3A may also include one or more audio in/out devices and/or one or more acoustic imaging devices 300 as discussed with reference to FIGS. 2-3A.

The computing device 12 or 13 operates similarly to computing device 12 or 13 of FIGS. 2 and 3 with the addition of a touch screen with sensors and drive sense circuits (DSC) 16 as an input device. The touch screen with sensors and drive sense circuits (DSC) is integrated with a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes).

Each sensor of the touchscreen with sensors and drive sense circuits (DSC) 16 is coupled to a drive-sense circuit (DSC). The DSCs provide electrode signals to the sensors and detect changes in electrical characteristics of the sensors. The DSCs will be described in greater detail with reference to FIGS. 26-29 and as described in co-pending patent application entitled, "DRIVE SENSE CIRCUIT WITH DRIVE-SENSE LINE," having a serial number of Ser. No. 16/113,379, and a filing date of Aug. 27, 2018. The drive-sense circuits (DSC) provide a representation of the detected change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
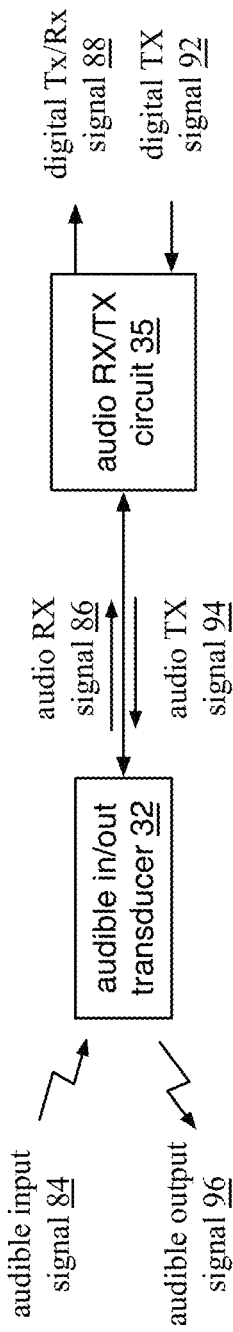
FIG. 4 is a schematic block diagram of an embodiment of an audio in/out device in accordance with the present invention.

FIG. 4 is a schematic block diagram of an embodiment of an audio in/out device 65 that includes an audible in/out transducer 32 and an audio transmit/receive (RX/TX) circuit 35. The audio in/out device 65 requires a single transducer for both audio input and output functionality.

Transducers are operable to convert one form of energy (e.g., pressure, temperature, biological, chemical, etc.) to another (e.g., capacitance, inductance, impedance, current, voltage, etc.). For example, a microphone is a transducer that is operable to convert the air pressure variations of a sound wave into an electrical signal and a speaker is a transducer that is operable to convert an electrical signal into a sound wave for output. In conventional audio devices, for every microphone transducer, there is a corresponding speaker transducer. However, due to the unique circuitry of the audio receive/transmit (RX/TX) circuit 35, a single audible in/out transducer 32 is operable as both a microphone and a speaker.

In an example of operation, an audible input signal 84 (e.g., sound waves) changes the electrical characteristics of the audible in/out transducer 32 which produces an audio RX signal 86. For example, the audible in/out transducer 32 is a piezoelectric transducer that generates an electric charge (and thus the electrical audio RX signal 86) in response to the presence of sound waves due to the piezoelectric effect. The audio RX/TX circuit 35 receives the audio RX signal 86 produced by the audible in/out transducer 32.

The audio RX/TX circuit 35 is further operable to receive a digital TX signal 92 (e.g., from a processing module, etc.) that contains audio information for transmission to the audible in/out transducer 32. The audio RX/TX circuit 35 regulates the audible in/out transducer 32 voltage to be substantially equal to a voltage reference signal based on the digital TX signal 92 such that the digital TX signal 92 is transmitted to the audio RX/TX circuit 35 and the effect of the audio RX signal 86 is removed. The electrical characteristics of the audible in/out transducer 32 are affected by the audio TX signal 94 which produces an audible output signal 96 (e.g., sound waves).

To regulate the audible in/out transducer 32 voltage, the audio RX/TX circuit 35 detects and compensates for the effect of the audio RX signal 86 on the audible in/out transducer 32 voltage. Thus, the output of the audio RX/TX circuit 35 is a digital Tx/Rx signal 88 which includes a representation of the audio RX signal 86 and a transmit signal (delayed due to circuitry lag). With further processing, the audio RX signal can be extracted from the digital Tx/Rx signal 88. The audio RX/TX circuit 35 and the signals of the audio/in out device 65 will be discussed in more detail with reference to FIGS. 5-17.

Figure 5:
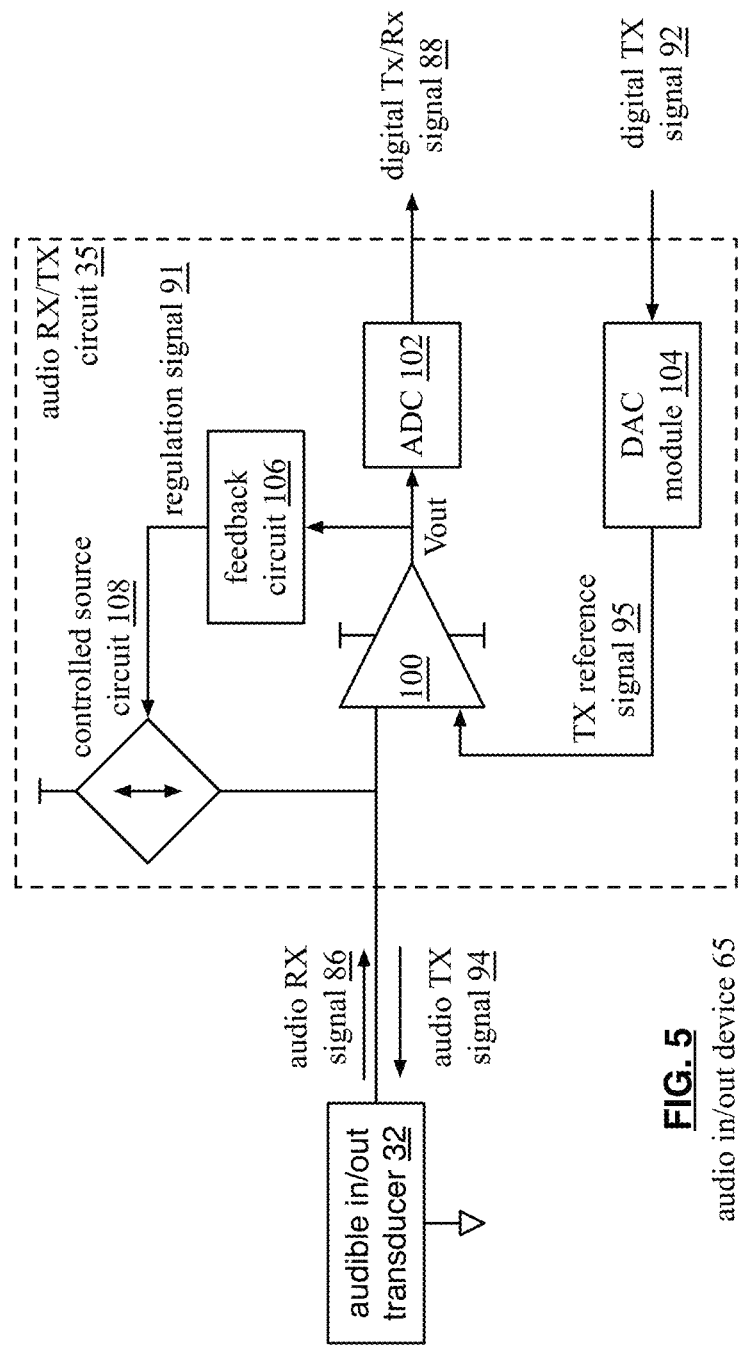
FIG. 5 is a schematic block diagram of another embodiment of an audio in/out device in accordance with the present invention.

FIG. 5 is a schematic block diagram of an embodiment of an audio in/out device 65 that includes an audible in/out transducer 32 and an audio transmit/receive (RX/TX) circuit 35. FIG. 5 operates similarly to the audio in/out device 65 of FIG. 4 except that the audio RX/TX circuit 35 is described in more detail. The audio RX/TX circuit 35 includes a non-inverting operational amplifier (op-amp) 100, an analog to digital converter (ADC) 102, a digital to analog converter (DAC) module 104, a feedback circuit 106, and a controlled source circuit 108.

The controlled source circuit 108 may be implemented in a variety of ways. For example, the controlled source circuit 108 is a current mirror circuit sourced via a DC input voltage. As another example, the controlled source circuit 108 is a current controlled current source or a voltage controlled current source. As yet another example, the controlled source circuit 108 is a bidirectional dependent voltage source circuit or a bidirectional dependent current source circuit (e.g., a Howland current pump circuit that produces a voltage controlled current and requires one op-amp and multiple resistors).

The feedback circuit 106 may be implemented with a controlled source regulation circuit, a biasing circuit, a wire, etc. The ADC 102 may be implemented as one of: a flash ADC, a successive approximation ADC, a ramp-compare ADC, a Wilkinson ADC, an integrating ADC, a delta encoded ADC, and/or a sigma-delta ADC of desired resolution (e.g., 8-bit, 16-bit, 32-bit, etc.).

The DAC module 104 includes a DAC. The DAC may be implemented as one of: a sigma-delta DAC, a pulse width modulator DAC, a binary weighted DAC, a successive approximation DAC, and/or a thermometer-coded DAC of desired resolution (e.g., 8-bit, 16-bit, 32-bit, etc.).

In an example of operation, the DAC module 104 receives a digital TX signal 92 (e.g., from a processing module, etc.) that includes audio information for transmission to the audible in/out transducer 32. The DAC module 104 generates an analog voltage reference signal (TX reference signal 95) based on the digital TX signal 94. The TX reference signal 95 includes a DC component and an oscillating component. The DAC module 104 and the TX reference signal 95 will be described in greater detail with reference to FIGS. 6-7.

An audible input signal 84 (e.g., sound waves) changes the electrical characteristics of the audible in/out transducer 32 such that the audible in/out transducer 32 produces an audio RX signal 86. The audio RX signal 86 affects the voltage on the audible in/out transducer 32 caused by transmitting an audio TX signal 94. The op-amp 100 compares the voltage of the audible in/out transducer 32 with the TX reference signal 95 to produce an analog comparison signal (Vout). For a non-inverting op-amp with unity gain, Vout is equal to the current on the audible in/out transducer 32 (e.g., a result of the audio RX signal 86 and the audio TX signal 94 currents) multiplied by an I-to-V loop gain. The I-to-V loop gain is the ratio of how much the voltage output changes as a result of a current change on the audible in/out transducer 32. The I-to-V loop gain is very high which allows for very small current changes (e.g., micro-amp differences) to be detected. For example, there can be a greater than 100 dB TX to RX ratio (e.g., 120 dB ratio) and still be able to detect the RX signal. As such, the Vout signal follows the current on the audible in/out transducer 32 and includes a representation of the audio RX signal 86 and a delayed audio TX signal 94 (due to circuitry delay).

The feedback circuit 106 generates a regulation signal 91 based on the Vout signal and provides the regulation signal 91 to the controlled source circuit 108. The regulation signal 91 may be the Vout signal (e.g., when the feedback circuit is a wire) or a processed version of the Vout signal depending on the components of the feedback circuit 106 and input requirements of the controlled source circuit 108.

The controlled source circuit 108 adjusts generation of its output based on the regulation signal 91 to compensate for the effects that the audio RX signal 86 has on the audible in/out transducer 32 voltage to keep the inputs of the op-amp 100 substantially matching. The output of the controlled source circuit 108 has a DC component and oscillating component such that the audible in/out transducer 32 voltage as measured at the op-amp 100 input will have a substantially matching DC component and oscillating component as the TX reference signal 95. Thus, the audio RX/TX circuit 35 operates as a control loop that regulates the audible in/out transducer 32 voltage to substantially match the voltage of the TX reference signal 95 by compensating for the effect that the audio RX signal 86 has on the audible in/out transducer 32 voltage.

The ADC 102 converts the Vout signal to a digital Tx/Rx signal 88 for output. The digital Tx/Rx signal 88 undergoes further processing such that the correct delayed transmit signal is extracted from the digital Tx/Rx signal 88 to produce the correct digital audio RX signal. A transmit signal delay occurs due to the circuitry lag in transmitting the TX reference signal 95 through the circuitry of the audio RX/TX circuit 35. For example, the bandwidth of the audio RX/TX circuit 35 is approximately 1 MHz, resulting in an approximately 1 microsecond delay between receiving the audio RX signal 86 and transmitting audio TX signal 94. Further processing of the digital Tx/Rx signal 88 is discussed in greater detail with reference to FIGS. 11-15.

In another embodiment, the audio RX/TX circuit 35 further includes a DAC connected to the output of the ADC 102 and the input of the feedback circuit 106. Instead of providing the Vout signal at the output of the op-amp 100 to the feedback circuit 106, the Vout signal is provided to the ADC 102 and converted to the digital Tx/Rx signal 88. The digital Tx/Rx signal 88 is provided to the DAC where the DAC converts the digital Tx/Rx signal 88 to an analog signal. The DAC then provides the analog signal to the feedback circuit 106 where the feedback circuit 106 converts the analog signal to the regulation signal 91.

Figure 6:
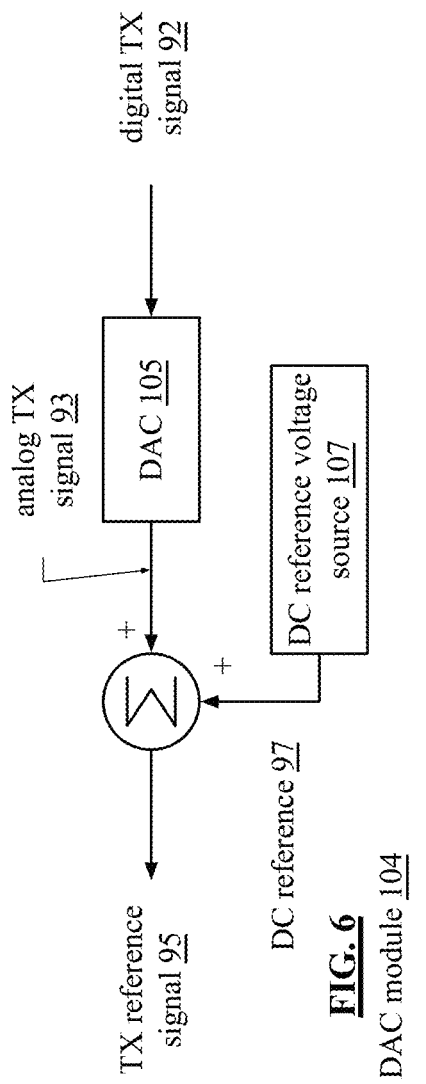
FIG. 6 is a schematic block diagram of an embodiment of a digital to analog converter (DAC) module in accordance with the present invention.

FIG. 6 is a schematic block diagram of an embodiment of a digital to analog converter (DAC) module 104 that includes a DAC 105, a DC (direct current) reference voltage source 107, and a summing circuit. The DAC 105 may be implemented in a variety of ways. For example, the DAC is one of: a sigma-delta DAC, a pulse width modulator DAC, a binary weighted DAC, a successive approximation DAC, and/or a thermometer-coded DAC of adequate resolution (e.g., 8-bit, 16-bit, 32-bit, etc.).

The DAC 105 converts a digital TX signal 92 (received from a processing module, etc.) to an analog TX signal 93 having a waveform (e.g., sinusoidal (as shown), square, triangular, polygonal, multiple step, etc.), a frequency, a phase, and a magnitude. The DC reference voltage source 107 produces a DC reference 97 component of the TX reference signal 95. The DC reference 97 is a DC voltage at a desired DC level. For example, the DC reference 97 is set and/or adjusted to a desired magnitude to avoid op-amp saturation and to stay within the operating range of the op-amp. The summing circuit combines the analog TX signal 93 with the DC reference 97 to produce the TX reference signal 95.

Figure 7:
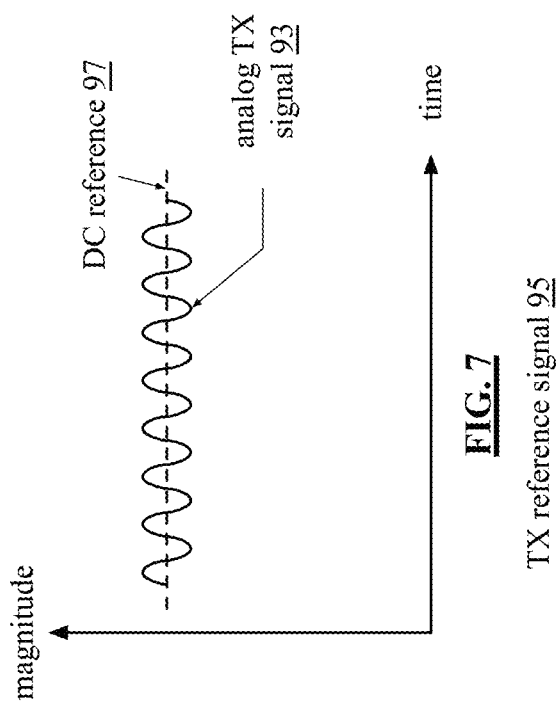
FIG. 7 is an example of a transmit (TX) reference signal in accordance with the present invention.

FIG. 7 is an example of a transmit (TX) reference signal 95 in the time domain. The TX reference signal 95 includes an analog TX signal 93 and a DC (direct current) reference 97 component. The analog TX signal 93 is an oscillating component of the transmit (TX) reference signal 95 having a waveform (e.g., sinusoidal (as shown), square, triangular, polygonal, multiple step, etc.), a frequency, a phase, and a magnitude. The DC reference 97 component is at a particular magnitude. For example, the DC reference 97 is a DC voltage in the range of a few hundred milli-volts to tens of volts or more.

The frequency of the analog TX signal 93 may vary so that it can be tuned to the impedance of the audible in/out transducer and/or to be off-set in frequency from other sensor signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

Figure 8:
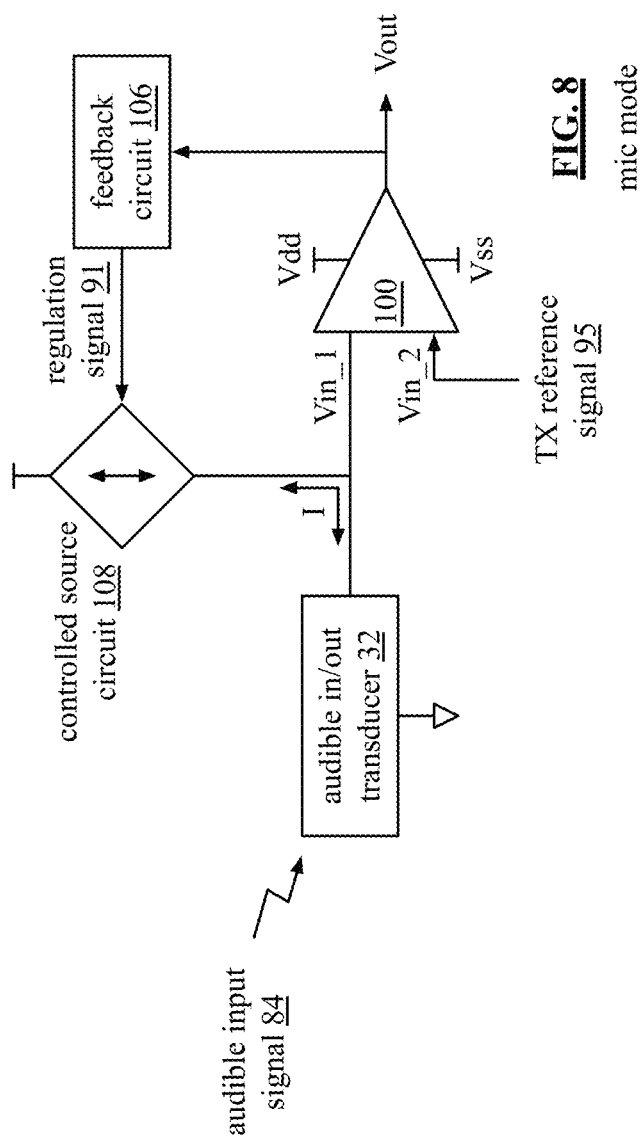
FIG. 8 is a schematic block diagram of an embodiment of an audio input/output device in a microphone (mic) only mode in accordance with the present invention.

FIG. 8 is a schematic block diagram of an embodiment of an audio input/output device 65 in a microphone (mic) only mode. The audio input/output device 65 operates similarly to the audio input/output device 65 of FIGS. 4-5 and includes an audible in/out transducer 32 and a portion of an audio RX/TX circuit 35. The portion of the audio RX/TX circuit 35 shown includes an non-inverting op-amp 100, a feedback circuit 106, and a controlled source circuit 108.

In this example, the controlled source circuit 108 is a voltage controlled current source (bidirectional or one directional) that produces a current signal to keep the inputs to the op-amp 100 substantially matching. The op-amp 100 is powered by a positive supply Vdd and a negative supply Vss. Voltage that is common between either of the op-amp 100 inputs and ground is referred to as common mode voltage (Vcm).

In a microphone only mode, the TX reference signal 95 is a voltage reference signal set to a common mode voltage (Vcm) of zero because there is no audio transmit signal to output to the audible in/out transducer 32. The electrical characteristics of the audible in/out transducer 32 change based on a received audible input signal 84 (sound waves) and the changes in electrical characteristics produce a current signal. The current signal produced by the controlled source circuit 108 as affected by the current signal produced by the audible in/out transducer 32 is represented as the current signal "I."

The op-amp 100 compares the audible in/out transducer 32 voltage (Vin_1) with the TX reference signal 95 (Vin_2) to produce an analog comparison signal Vout. The output of the op-amp 100 (Vout) varies based on the current signal I such that Vout includes a representation of the audible input signal 84. The feedback circuit 106 generates a regulation signal 91 based on the Vout signal and provides the regulation signal 91 to the controlled source circuit 108. The controlled source circuit 108 adjusts generation of its current signal output based on the regulation signal 91 so that the audible in/out transducer 32 voltage remains substantially equal to the TX reference signal 95 (e.g., at zero volts).

Figure 8A:
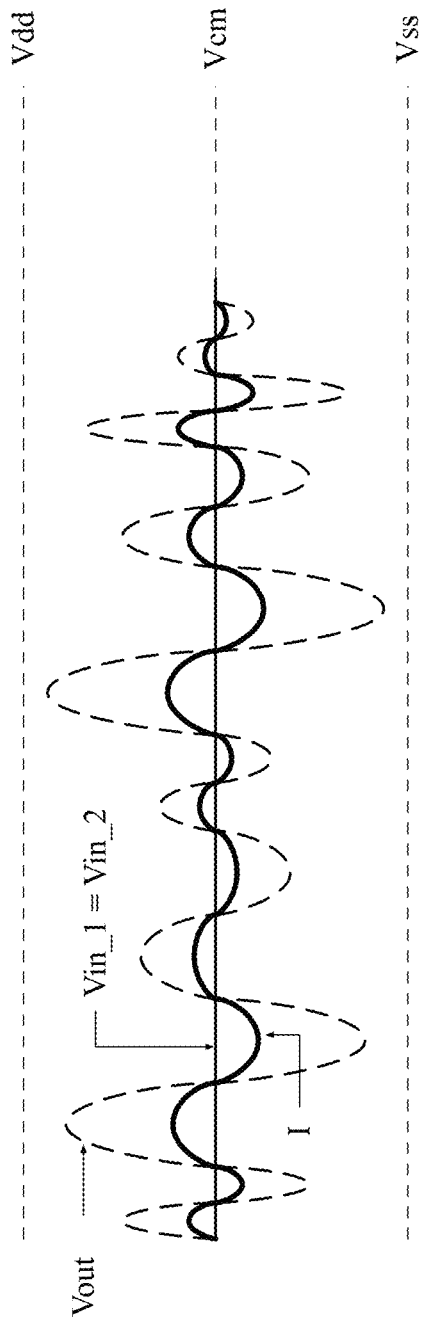
FIG. 8A is an example of signals of the audio in/out device of FIG. 8 in accordance with the present invention.

FIG. 8A is an example of signals of the audio in/out device 65 of FIG. 8 when the audio in/out device 65 is operating in a microphone (mic) only mode. The bolded signal is the current signal I. The current signal I is the current signal produced by the controlled source circuit 108 as affected by the current signal generated by the audible in/out transducer 32 due to the audible input signal 84.

The TX reference signal 95 (Vin_2) is set to a common mode voltage (Vcm) at zero volts because there is no audio transmit signal to output to the audible in/out transducer 32. Therefore, both Vin_1 and Vin_2 are shown as flat lines at Vcm (e.g., at zero). The voltage output signal Vout follows the current signal I and has a high I-to-V gain. Thus, Vout includes a representation of the current generated based on the audible input signal 84. The output signal Vout is further processed to accurately extract the representation of the current generated based on the audible input signal 84.

Figure 9:
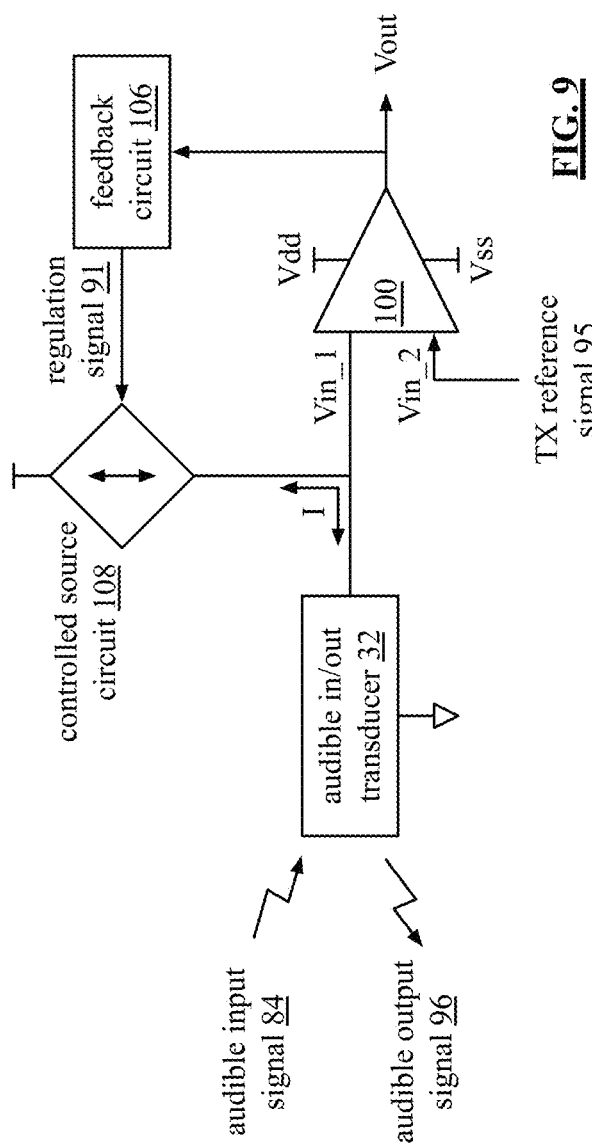
FIG. 9 is a schematic block diagram of an embodiment of an audio input/output device in a microphone (mic) and speaker mode in accordance with the present invention.

FIG. 9 is a schematic block diagram of an embodiment of an audio input/output device 65 in a microphone (mic) and speaker mode. The audio input/output device 65 operates similarly to the audio input/output device 65 of FIGS. 4-5 and includes an audible in/out transducer 32 and a portion of the audio RX/TX circuit 35. The portion of the audio RX/TX circuit 35 includes the non-inverting op-amp 100, the feedback circuit 106, and the controlled source circuit 108.

In this example, the controlled source circuit 108 is a voltage controlled current source (bidirectional or one directional) that produces a current signal to keep the inputs to the op-amp 100 substantially equal. In a microphone and speaker mode, the TX reference signal 95 is a voltage reference signal (Vin_2) set to a particular output voltage signal representative of the audio transmit signal for transmission to the audible in/out transducer 32.

The electrical characteristics of the audible in/out transducer 32 change based on a received audible input signal 84 (sound waves) to produce a current signal. The current produced by the controlled source circuit 108 as affected by the current signal produced by the audible in/out transducer 32 is represented as the current signal "I." The electrical characteristics of the audible in/out transducer 32 change based on the current signal produced by the controlled source circuit and the changes in electrical characteristics produce an audible output signal 96.

As the electrical characteristics of the audible in/out transducer 32 change due to the audible input signal 84 the current signal provided by the controlled source circuit 108 changes so that the audible in/out transducer 32 voltage (Vin_1) remains substantially equal to the TX reference signal 95 (Vin_2). The op-amp 100 compares the audible in/out transducer 32 voltage (Vin_1) with the TX reference signal 95 (Vin_2) to produce a comparison signal Vout. The output of the op-amp 100 (Vout) varies based on the current signal I such that Vout includes a representation of the audible input signal 84 and a transmit signal (delayed due to circuitry lag).

The feedback circuit 106 generates a regulation signal 91 based on the Vout signal and provides the regulation signal 91 to the controlled source circuit 108. The controlled source circuit 108 adjusts generation of its current signal output based on the regulation signal 91 to keep the inputs of the op-amp 100 substantially matching. The current signal output is received by the audible in/out transducer which causes electrical characteristic changes in the audible in/out transducer 32 to produce the audible output signal 96 (e.g., sound waves).

FIGS. 9A-9D are examples of signals of the audio in/out device 65 of FIG. 9 when the audio in/out device 65 is operating in a microphone (mic) and speaker mode. While pure tones sinusoids are shown for simplicity purposes, other waveforms can be used.

Figure 9A:
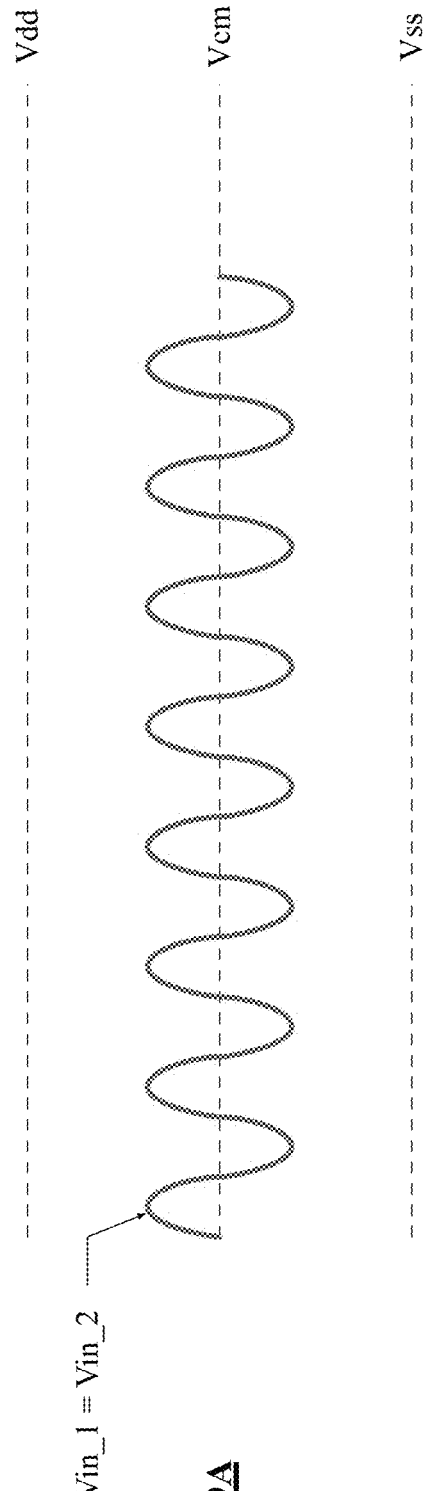
FIGS. 9A-9D are examples of signals of the audio in/out device of FIG. 9 in accordance with the present invention.

FIG. 9A shows an example of transmit signals of the audio in/out device 65. The TX reference signal 95 (Vin_2) is an analog voltage reference signal generated based on a desired transmit signal for transmission to the audible in/out transducer 32. The voltage signal on the audible in/out transducer 32 (Vin_1) is regulated by the current signal produced by the controlled source circuit so that it substantially matches the TX reference signal 95 (Vin_2).

As such, the Vin_1 signal is regulated to be substantially equal to the signal Vin_2 signal as shown. Here, example sinusoidal signals Vin_1 and Vin_2 are shown having a magnitude within the voltage supply rails (Vdd and Vss) of the op-amp 100.

Figure 9B:
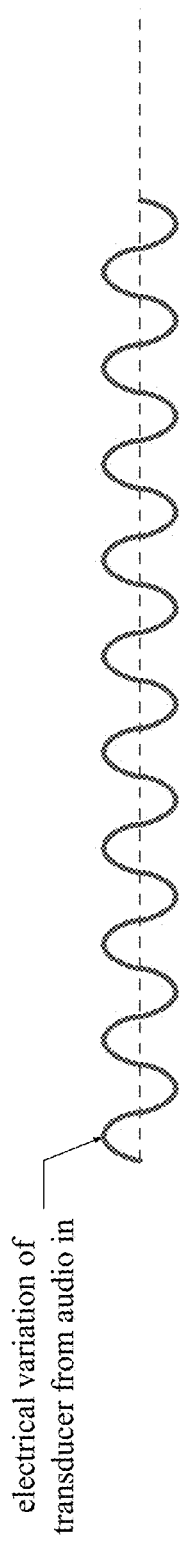

FIG. 9B shows a signal representative of the electrical variation of the audible in/out transducer 32 due to the audible input signal 84. When voltage is regulated, the audible in/out transducer 32 current, impedance, and/or other electrical characteristics vary. When current is regulated, the audible in/out transducer 32 voltage, impedance, and/or other electrical characteristics vary.

Figure 9C:
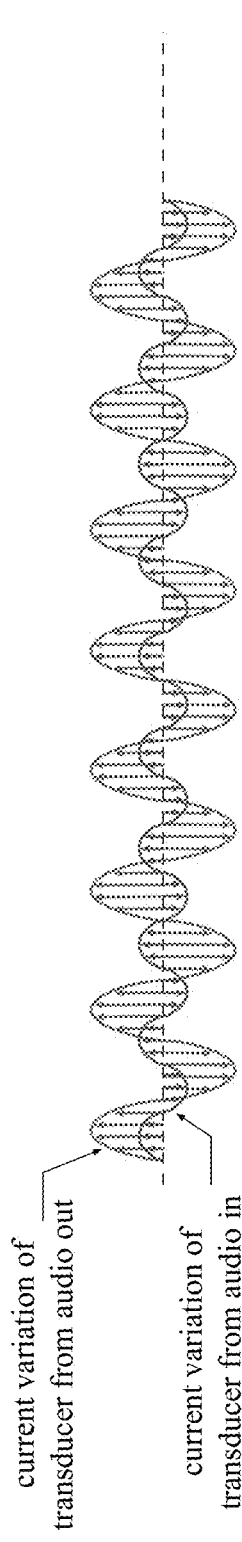

FIG. 9C shows a signal representative of current variation of the audible in/out transducer 32 from audio out compared with a signal representative of the current variation of the audible in/out transducer 32 due to audio in. A combination of the two current signals represents the current on the audible in/out transducer which affects the voltage of the audible in/out transducer.

Figure 9D:
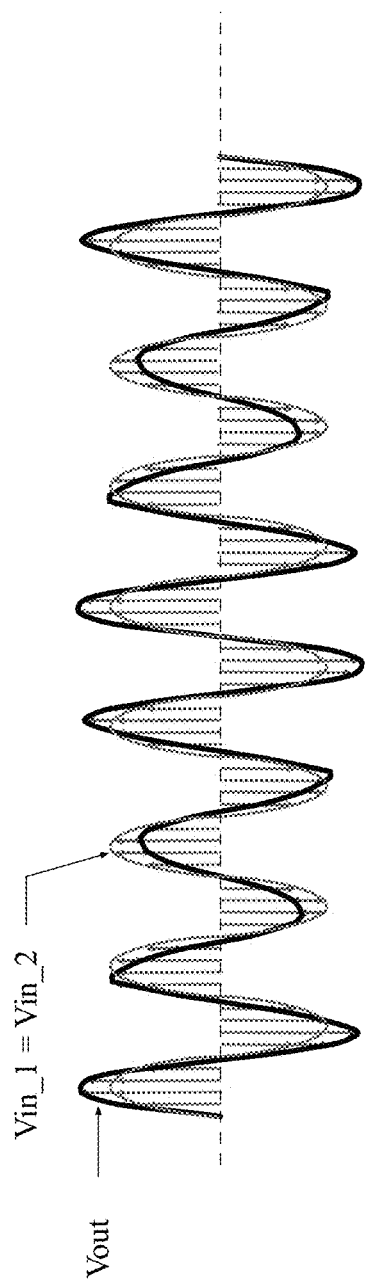

FIG. 9D shows an output signal Vout that is generated at the output of an op-amp when the inputs to the op-amp include the audible in/out transducer 32 voltage (e.g., Vin_1 affected by the current variation of the audible in/out transducer 32 due to audio out and the current variation of the audible in/out transducer 32 due to audio in) and the TX reference signal (Vin_2).

The output signal Vout follows the combination of the current variations of FIG. 9C such that Vout includes a representation of the audible input signal and a transmit signal. The output signal Vout requires further signal processing to extract the representation of the audible input signal while taking into account transmit signal delay.

Figure 10:
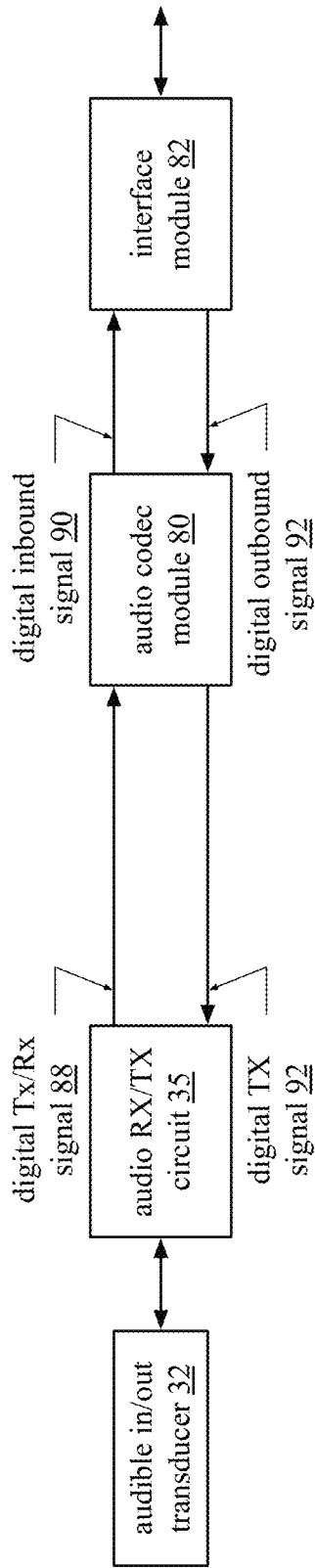
FIG. 10 is a schematic block diagram of another embodiment of an audio in/out device in accordance with the present invention.

FIG. 10 is a schematic block diagram of an audio in/out device 65 that includes an audible in/out transducer 32, an audio receive/transmit (RX/TX) circuit 35, an audio codec module 80, and an interface module 82. The audible in/out transducer 32 and the audio RX/TX circuit 35 operate similarly to the audio in/out devices 65 of previous Figures. The audio codec module 80 is operable extract a digital Rx signal from the digital Tx/Rx signal while taking into account transmit signal delay, format a digital Rx signal into a desired audio file format, and format an audio file into digital signals for transmitting to the audio RX/TX circuit 35.

An audio file format is a file format for storing digital audio data on a computer system. The three major groups of audio file formats include uncompressed audio format (e.g., waveform audio file format (WAV), audio interchange file format (AIFF), Au file format, etc.), lossless compressed audio format (e.g., free lossless audio codec (FLAC), Monkey's Audio, WavPack, moving picture experts group-4 (MPEG-4), Windows media audio lossless (WMA LossLess), etc.), and lossy compressed audio format (e.g., Opus, moving picture experts group-1 (MP3), Vorbis, Advanced Audio Coding (AAC), etc.).

Digital audio file formats are associated with a sampling rate. According to the Nyquist-Shannon sampling theorem (stating that sampling frequency must be greater than twice the maximum frequency one wishes to reproduce), audio sampling rate should be greater than 40 kHz because the human hearing range is between approximately 20 Hz to 20,000 Hz. For example, MP3 uses a sampling rate of 44.1 kHz. High resolution audio refers to audio files having a higher sampling frequency and/or bit depth than audio file formats at 44.1 kHz/16-bit. For example, WAV and FLAC use a sampling rate of 48 kHz or higher. Based on the desired digital inbound signal 90 formatting, the audio codec module 80 is operable to format (e.g., up-sample, down-sample, encode, compress, etc.) the digital Rx signal component of the digital Tx/Rx signal 88 accordingly.

In addition to audio file formatting, the audio codec module 80 is operable to adjust for transmit signal delays, adjust the magnitude of the digital outbound data 92 (e.g., volume control), and pre-scale the digital outbound signal 92. Pre-scaling reduces a high frequency signal to a lower frequency by integer division.

The interface module 82 includes a software driver and a hardware connector for coupling the audio codec module 80 of the audio in/out device 92 to other modules/devices of a computing device (e.g., a processing module) and/or a communication system. The interface module 82 may include one or more digital filters, a delay circuit, a digital to analog converter (DAC), an analog to digital converter (ADC), a buffer, etc., to coordinate timing of data flow and ensure compatibility of connected devices/components.

The interface module 82 is further operable transmit the digital inbound signal 90 in accordance with one or more inbound communication protocols and receive the digital outbound signal 92 in accordance with one or more outbound communication protocols.

For example, the interface module 82 formats digital inbound data in accordance with one or more wireless communication standards (e.g., GSM, CDMA, WCDMA, HSDPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling.

In an example of operation, the audible in/out transducer 32 is operable to provide an audio RX signal to the audio RX/TX circuit 35 based on a received audible input signal (e.g., sound waves). The audio RX/TX circuit 35 outputs a digital Tx/Rx signal 88 to the audio codec module 80 where the digital Tx/Rx signal 88 includes a representation of the audio RX signal.

The audio codec module 80 processes the digital Tx/Rx signal 88 to extract a digital audio Rx portion of the digital Tx/Rx signal 88 and format it into a desired audio file format to produce a digital inbound signal 90. For example, the audio codec module 80 encodes and compresses a digital audio RX signal into a lossless compressed audio format. The interface module 82 may further process the digital inbound signal 90 (e.g., via digital filtering) and/or control the digital inbound signal 90 (e.g., delay, buffer) such that is transmitted to another module and/or device correctly and/or in accordance with one or more communication protocols.

Likewise, the interface module 82 is operable to receive an audio file for transmission to the audible in/out transducer 32 (e.g., via a processing module, etc.). The interface module 82 may process the audio file (e.g., via digital filtering) to produce a digital outbound signal 92 and/or control the transmission of the digital outbound signal 92 (e.g., delay, buffer) so that is received correctly by the audio codec module 80. The audio codec module 80 is operable to process the digital outbound signal 92 to produce the digital TX signal 92. For example, the audio codec module 80 decodes and decompresses the digital outbound signal 92 having a particular audio file format to produce the digital TX signal 92.

The audio RX/TX circuit 35 receives the digital TX signal 92 from the audio codec module 80 and converts it to an audio TX signal for transmission to the audible in/out transducer 32 for output as sound.

Figure 11:
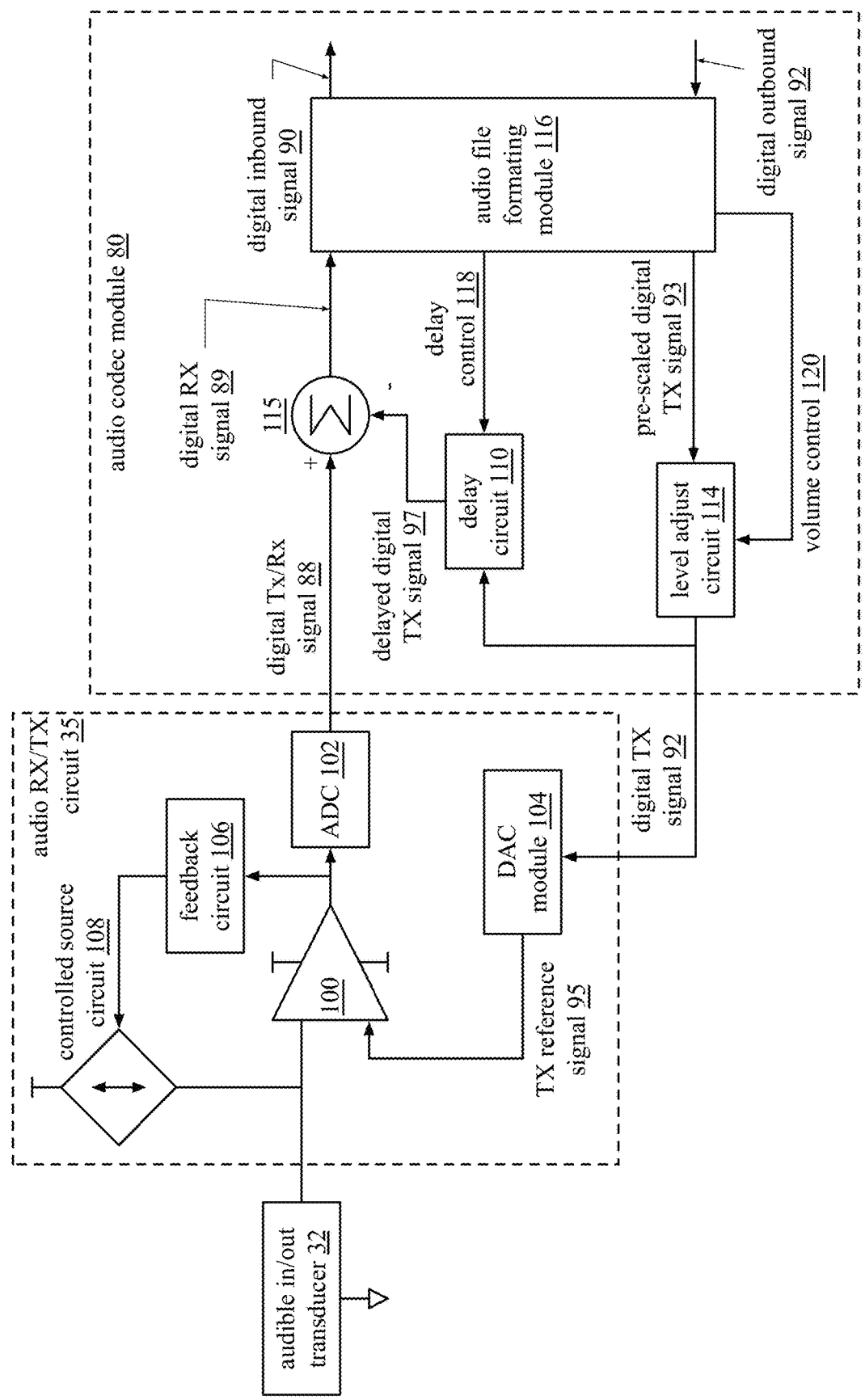
FIG. 11 is a schematic block diagram of another embodiment of an audio in/out device in accordance with the present invention.

FIG. 11 is a schematic block diagram of an audio in/out device 65 that includes an audible in/out transducer 32, an audio receive/transmit (RX/TX) circuit 35, and an audio codec module 80. The audio RX/TX circuit 35 includes a non-inverting operational amplifier (op-amp) 100, an analog to digital converter (ADC) 102, a digital to analog converter (DAC) module 104, a feedback circuit 106, and a controlled source circuit 108. The audio RX/TX circuit 35 and the audible in/out transducer 32 operate similarly to the audio RX/TX circuit 35 and the audible in/out transducer 32 of previous Figures.

The audio codec module 80 includes a delay circuit 110, a level adjust circuit 114, a summing circuit 115, and an audio file formatting module 116. The delay circuit 110 may be implemented using a timer circuit (e.g., a digital timer circuit using flip flops). The level adjust circuit 114 may be implemented by cascaded and differentially switched complimentary metal-oxide semiconductor (CMOS) transistors, by a non-inverting op-amp level shifter, etc. The delay circuit 110 may also include level adjust functionality to adjust the magnitude of the delayed signal.

The audio file formatting module 116 is operable to format digital signals into a desired audio file format for output and to format received digital audio files into digital signals for transmitting to the audio RX/TX circuit 35. For example, the audio file formatting module 116 is operable to up-sample, down-sample, digital filter, encode/decode, and compress/decompress signals to achieve a desired result. The audio file formatting module 116 is further operable to generate control signals to adjust for transmit signal delays, generate control signals to adjust the magnitude of the digital outbound data (e.g., volume control 120), and pre-scale the digital outbound signal 92. Pre-scaling reduces a high frequency signal to a lower frequency by integer division.

In an example of operation, the audio file formatting module 116 receives a digital outbound signal 92 (e.g., from a processing module via an interface module). The audio file formatting module 116 formats the digital outbound signal 92 into a desired digital transmit signal. The audio file formatting module 116 pre-scales the digital outbound signal 92 to produce the pre-scaled digital TX signal 93. The audio file formatting module 116 communicates a volume control signal 120 to the level adjust circuit 114. The level adjust circuit 114 adjusts the magnitude of the pre-scaled digital TX signal 93 in accordance with the volume control signal 120 to produce the digital TX signal 92. The digital TX signal 92 is provided to the DAC module 104 of the audio RX/TX circuit 35 and processed by the audio TX/RX circuit 35 as discussed with reference to previous Figures.

The audio file formatting module 116 communicates a delay control signal 118 to the delay circuit 110. The delay control signal 118 corresponds to the circuitry lag of the audio RX/TX circuit 35. The circuitry lag can be determined by disconnecting the audible in/out transducer 32 so that there is no audio signal received, applying a digital TX signal, and adjusting the delay circuit so that the output of the summing circuit is approximately zero.

The delay control signal 118 further includes a magnitude scale signal corresponding to an amount the magnitude of the digital TX signal 92 needs to be scaled to match the magnitude of the transmit component of the digital Tx/Rx signal 88. The digital Tx/Rx signal 88 is a digital voltage signal representative of the current changes on the audible in/out transducer 32. Therefore, the digital Tx/Rx signal 88 includes a voltage representation of a transmit current signal as affected by a receive current signal where the voltage representations are affected by the I-to-V gain of the audio RX/TX circuit 35 loop. To determine the magnitude of the transmit component of the digital Tx/Rx signal 88, the impedance of the audio in/out transducer 32 and the gain of the audio RX/TX circuit 35 loop need to be determined. These values can be determined by a calibration process where the gain of the audio RX/TX circuit 35 loop and the impedance of the of the audio in/out transducer 32 are measured while no audio RX signal is received.

The digital TX signal 92 is provided to the delay circuit 110 where the delay circuit 110 delays and magnitude adjusts the digital TX signal in accordance with the delay control signal 118 to produce a delayed digital TX signal 97. For example, the bandwidth of the audio RX/TX circuit 35 is approximately 1 MHz, resulting in an approximately 1 microsecond delay between generating the TX reference signal and transmitting an audio TX signal 94. Thus, the delay circuit 110 holds the digital TX signal 92 for approximately 1 microsecond to correct for the circuitry lag.

The summing circuit 115 receives the digital Tx/Rx signal 88 from the audio RX/TX circuit 35 and subtracts the delayed digital TX signal 97 from the digital Tx/Rx signal 88 to produce a digital RX signal 89. With the delayed and magnitude adjusted digital TX signal 97, the correct transmit signal is subtracted from the digital Tx/Rx signal 88 such that the correct digital Rx signal 89 is produced. The audio file formatting module 116 formats the digital Rx signal 89 into a desired audio file format to produce the digital inbound signal 90.

Figure 12:
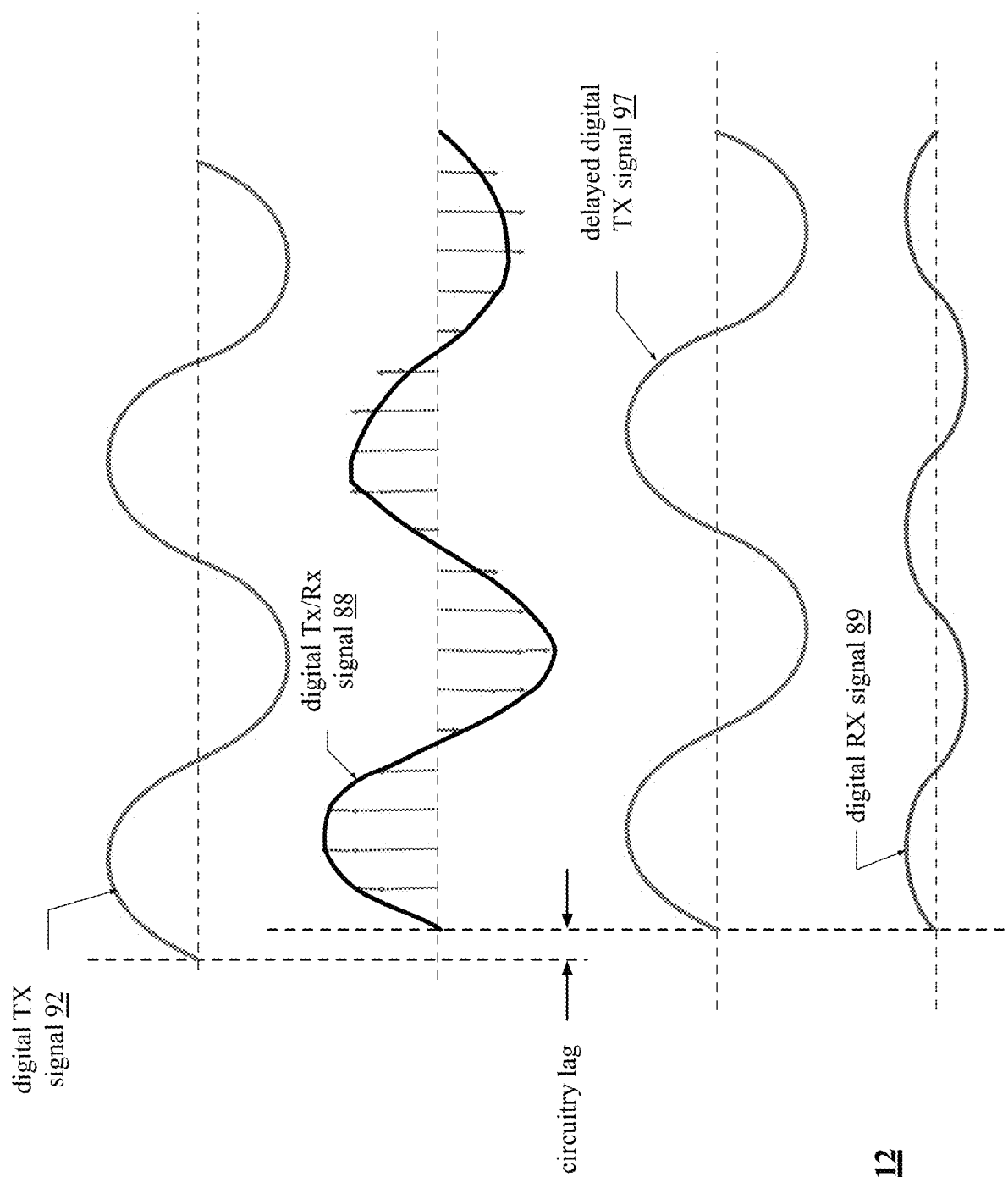
FIG. 12 is an example of signals of the audio in/out device of FIG. 11 in accordance with the present invention.

FIG. 12 is an example of signals of the audio in/out device 65 of FIG. 11. The audio codec module 80 of FIG. 11 outputs a digital TX signal 92 to the audio RX/TX circuit 35. The digital Tx/Rx signal 88 is output from the audio RX/TX circuit 35 at some time after the digital TX signal 92 is received by the audio RX/TX circuit 35 due to circuitry lag (e.g., approximately 1 microsecond). The digital Tx/Rx signal 88 is a digital voltage signal representative of the current changes on the audible in/out transducer 32. Therefore, the digital Tx/Rx signal 88 includes a voltage representation of a transmit current signal (blue) as affected by a receive current signal (red) where the voltage representations are affected by the I-to-V gain of the audio RX/TX circuit 35 loop.

In order to subtract the correct digital TX signal from the digital Tx/Rx signal 88 to produce the digital RX signal 89, the digital TX signal is delayed by the delay circuit by the amount of circuitry lag. In addition to delaying the digital TX signal, the delay circuit adjusts the magnitude of the digital TX signal based on the impedance of the audible in/out transducer and the gain of the audio RX/TX circuit 35 loop such that the magnitude of the delayed digital TX signal matches the magnitude of the transmit component of the digital Tx/Rx signal 88. Thus, subtracting the delayed digital TX signal 97 from the digital Tx/Rx signal 88 produces the correct digital RX signal 89 as shown at the bottom of the Figure.

Figure 13:
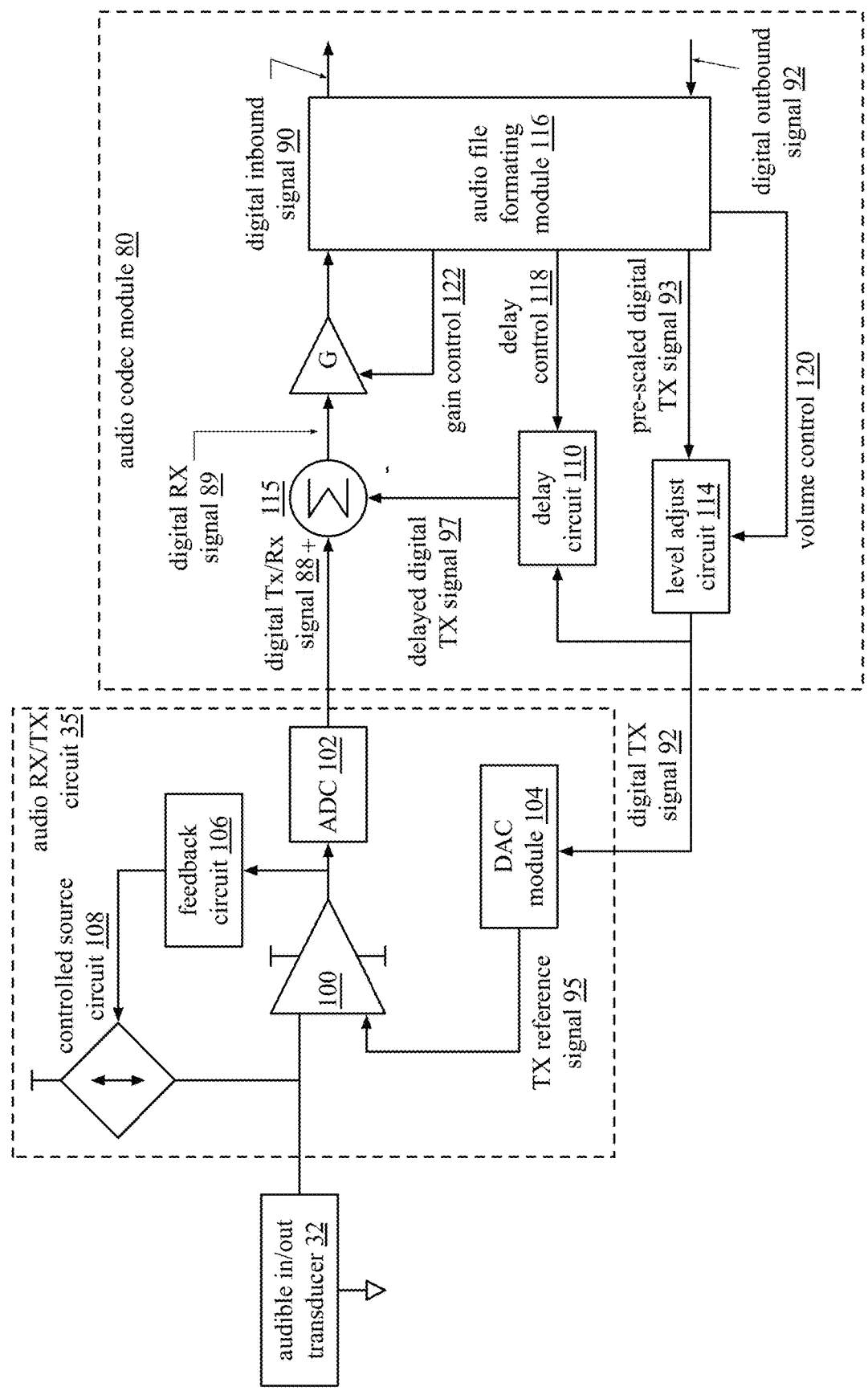
FIG. 13 is a schematic block diagram of another embodiment of an audio in/out device in accordance with the present invention.

FIG. 13 is a schematic block diagram of an audio in/out device 65 that includes an audible in/out transducer 32, an audio receive/transmit (RX/TX) circuit 35, and an audio codec module 80. FIG. 13 operates similarly to FIG. 11 except that the audio codec module 80 of FIG. 13 includes a gain stage after the summing circuit 115. The gain stage may be implemented by a non-inverting op-amp with variable resistors where the variable resistors can be adjusted to achieve a desired gain. The gain stage is operable to amplify the digital RX signal 89 to a level desired for input to the audio file formatting module 116.

The audio file formatting module 116 communicates a gain control 122 signal to the gain stage to adjust gain of the digital RX signal 89 for desired amplification. For example, depending on the desired audio file formatting, the audio file formatting module 116 sets the gain control 122 accordingly. The amplified digital RX signal is provided to the audio file formatting module 116 where the audio file formatting module 116 converts the amplified digital RX signal to the digital inbound signal 90.

Figure 14:
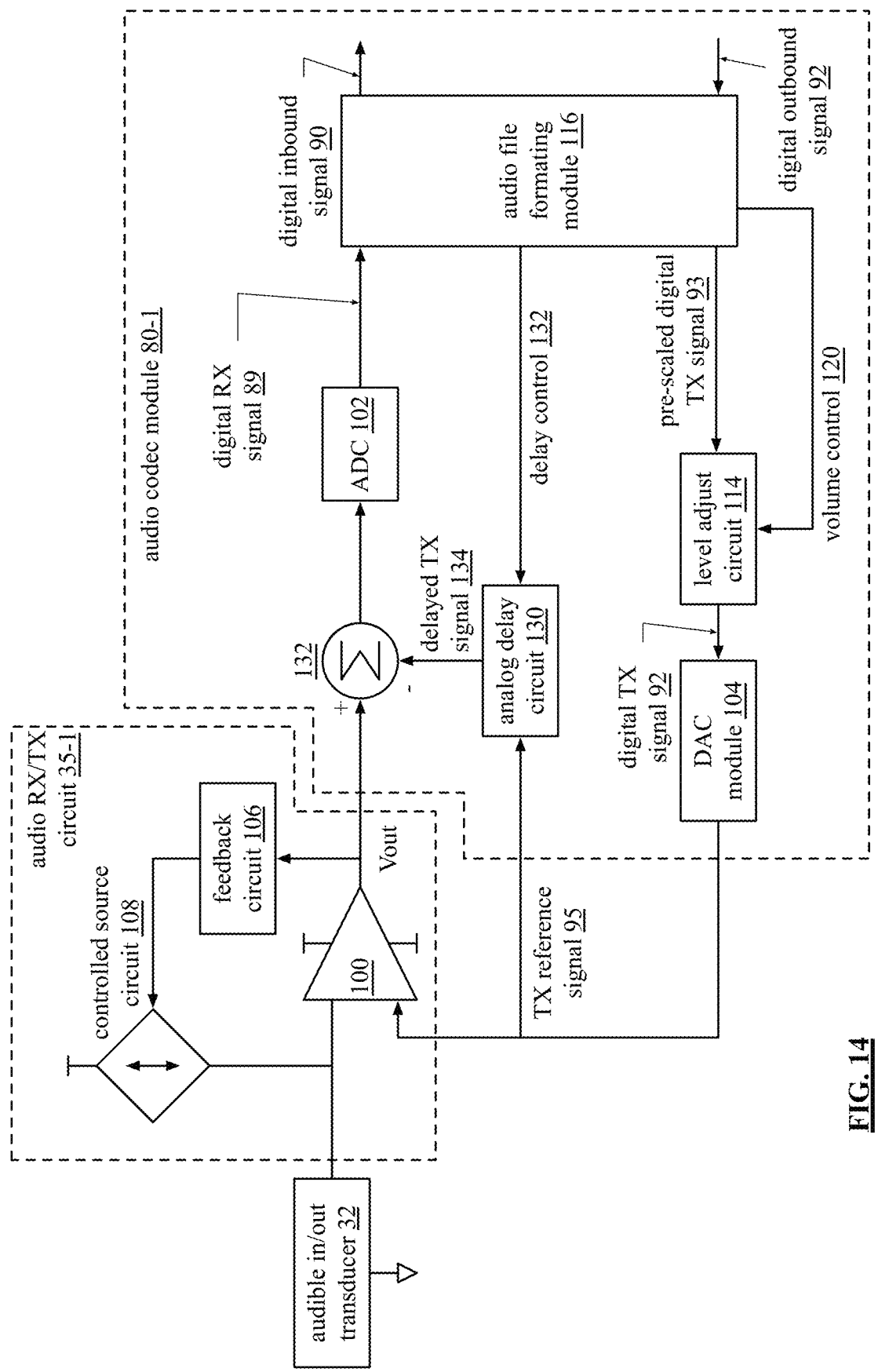
FIG. 14 is a schematic block diagram of another embodiment of an audio in/out device in accordance with the present invention.

FIG. 14 is a schematic block diagram of an embodiment of an audio in/out device 65 that includes an audible in/out transducer 32, an audio receive/transmit (RX/TX) circuit 35-1, and an audio codec module 80-1.

The audio RX/TX circuit 35-1 of FIG. 14 is an analog circuit that includes a non-inverting operational amplifier (op-amp) 100, a feedback circuit 106, and a controlled source circuit 108. The audio RX/TX circuit 35-1 and the audible in/out transducer 32 operate similarly to the audio RX/TX circuit 35 and the audible in/out transducer 32 of previous Figures except that the analog to digital converter (ADC) 102 and the digital to analog converter (DAC) module 104 are now included in the audio codec module 80-1.

The audio codec module 80-1 includes the ADC 102, the DAC module 104, an analog delay circuit 130, a level adjust circuit 114, a summing circuit 132, and an audio file formatting module 116. The analog delay circuit 130 may be implemented using a timer circuit (e.g., such as a differentiator circuit, a resistor-capacitor (RC) circuit delay line, etc.). The level adjust circuit 114 may be implemented by cascaded and differentially switched complimentary metal-oxide semiconductor (CMOS) transistors, by a non-inverting op-amp level shifter, etc. The analog delay circuit 130 may also include level adjust functionality to adjust the magnitude of the delayed signal.

The audio file formatting module 116 is operable to format digital signals into a desired audio file format for output and to format received digital audio files into digital signals for audio codec module 80-1 processing. The audio file formatting module 116 is operable to process (e.g., up-sample, down-sample, digital filter, encode/decode, compress/decompress, etc.) signals to achieve a desired audio format. The audio file formatting module 116 is further operable to generate control signals to adjust for transmit signal delays, generate control signals to adjust the magnitude of the digital outbound data (e.g., volume control 120), and pre-scale the digital outbound signal 92. Pre-scaling reduces a high frequency signal to a lower frequency by integer division.

In an example of operation, the audio file formatting module 116 receives a digital outbound signal 92 (e.g., from a processing module, via an interface module, etc.). The audio file formatting module 116 formats the digital outbound signal 92 into a desired digital transmit signal. The audio file formatting module 116 pre-scales the digital outbound signal 92 to produce the pre-scaled digital TX signal 93. The audio file formatting module 116 communicates a volume control signal 120 to the level adjust circuit 114.

The level adjust circuit 114 adjusts the magnitude of the pre-scaled digital TX signal 93 in accordance with the volume control signal 120 to produce the digital TX signal 92. The digital TX signal 92 is provided to the DAC module 104. The DAC module 104 generates an analog TX reference signal 95 based on the digital TX signal 92 and provides the analog TX reference signal 95 to an input of the op-amp 100 of the audio RX/TX circuit 35. The DAC module 104 is discussed in more detail with reference to FIG. 6.

The analog TX reference signal 95 is provided to the analog delay circuit 130. The audio file formatting module 116 communicates a delay control signal 132 corresponding to amount of delay created by the lag in the circuitry. The delay control signal 132 further includes a magnitude scale signal corresponding to an amount the magnitude of the analog TX reference signal 95 needs to be scaled to match the magnitude of the transmit component of the analog Vout signal. The analog TX reference signal 95 is delayed and magnitude adjusted in accordance with the delay control signal 132 to produce a delayed analog TX signal 134.

The summing circuit 132 receives the analog Vout signal from the audio RX/TX circuit 35 and subtracts the delayed analog TX signal 134 from the analog Vout signal to produce an analog RX signal. Subtracting the delayed analog TX signal 134 from the analog Vout signal while in analog domain as opposed to the digital domain is faster. Thus, the transmit delay correction of FIG. 14 is faster in comparison to the example of FIGS. 11-13. The ADC 102 converts the analog RX signal to a digital RX signal 89. The audio file formatting module 116 formats the digital RX signal 89 into a desired audio file format to produce the digital inbound signal 90.

Figure 15:
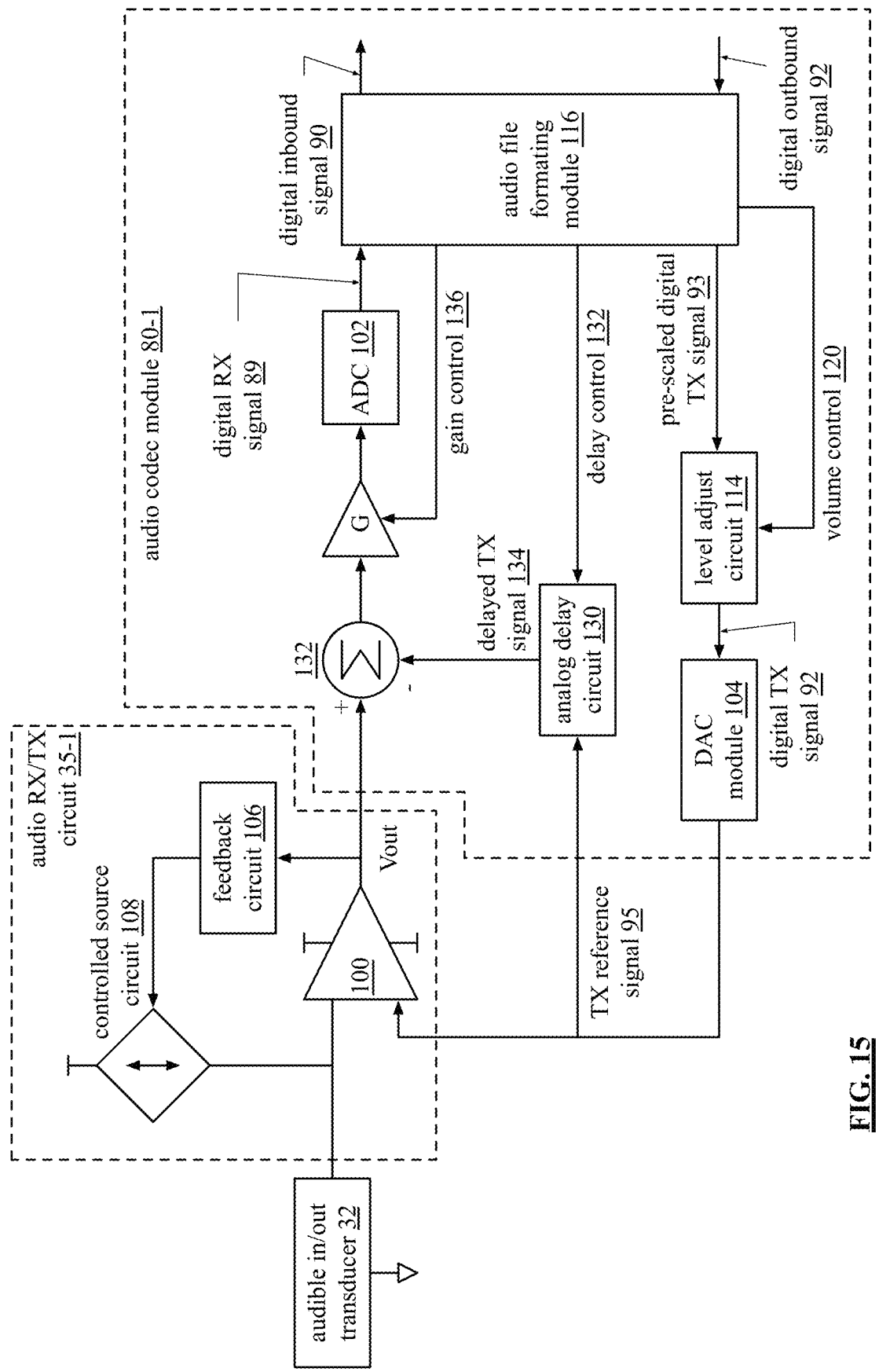
FIG. 15 is a schematic block diagram of another embodiment of an audio in/out device in accordance with the present invention.

FIG. 15 is a schematic block diagram of an embodiment of an audio in/out device 65 that includes an audible in/out transducer 32, an audio receive/transmit (RX/TX) circuit 35-1, and an audio codec module 80-1. FIG. 15 operates similarly to FIG. 14 except that the audio codec module 80-1 of FIG. 15 includes a gain stage after the summing circuit 132. The gain stage may be implemented by a non-inverting op-amp with variable resistors where the variable resistors can be adjusted to achieve a desired gain.

The audio file formatting module 116 communicates a gain control 136 signal to the gain stage to adjust gain of the analog audio RX signal for desired amplification. The gain stage amplifies the analog RX signal in accordance with the gain control 136 signal to a desired amplification for input to the ADC 102. The amplified analog RX signal is provided to the ADC 102 where it is converted to the digital RX signal 89. The audio file formatting module 116 converts the digital RX signal 89 to produce the digital inbound signal 90 for output.

Figure 16:
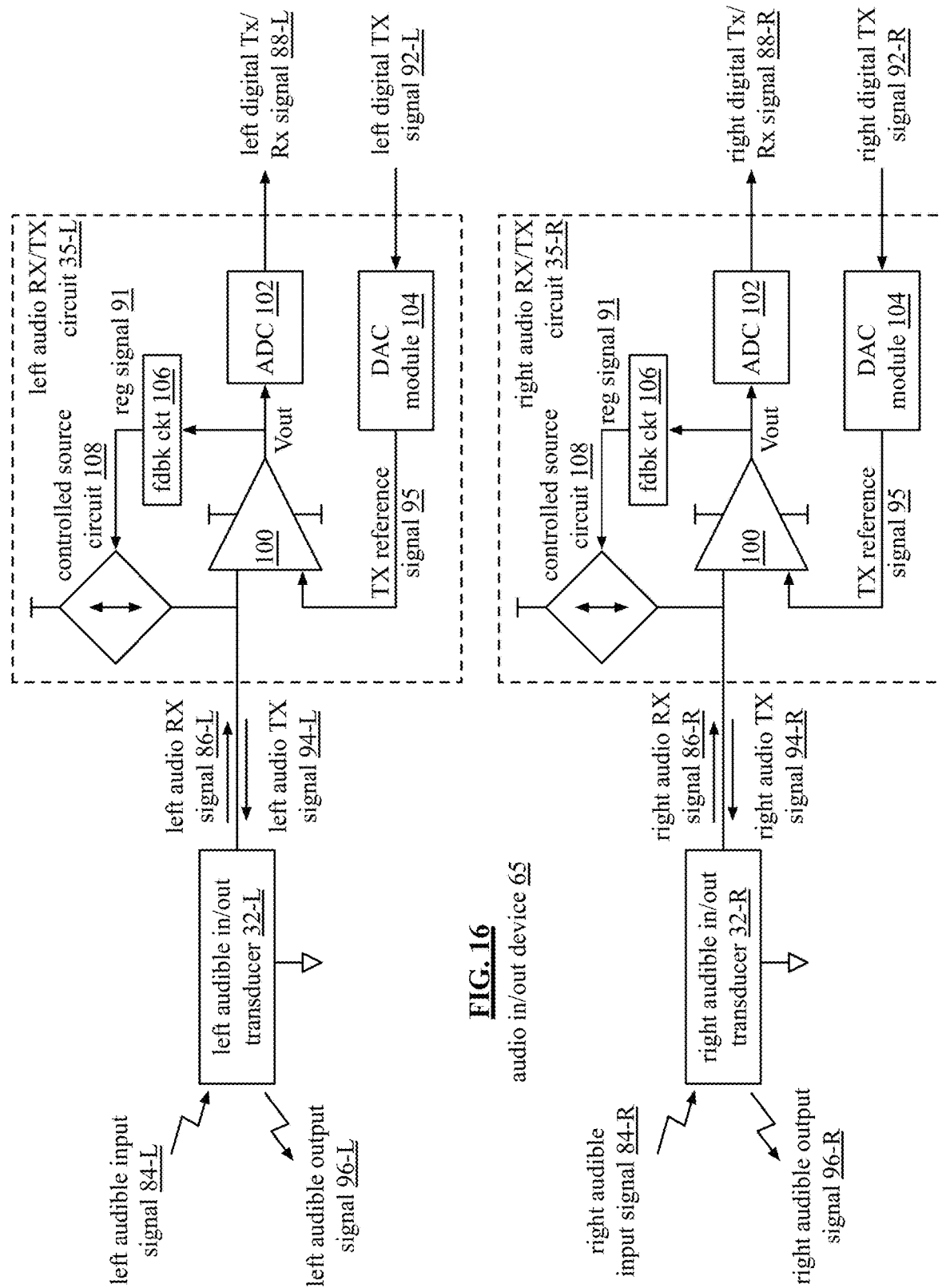
FIG. 16 is a schematic block diagram of another embodiment of an audio in/out device in accordance with the present invention.

FIG. 16 is a schematic block diagram of an embodiment of an audio in/out device 65 that includes a left audible in/out transducer 32-L, a right audible in/out transducer 32-R, a left audio RX/TX circuit 35-L, and a right audio RX/TX circuit 35-R. For example, the audio in/out device 65 is a stereophonic (stereo) headset, a stereo speaker pair, a conference speaker set, etc.

Stereo sound is a method of sound reproduction that creates the illusion of multi-directional sound perspective. For two speaker stereo sound, two independent audio channels (i.e., signals) are used and thus two transducers, where one channel feeds one transducer (e.g., a left speaker) and another channel feeds the other transducer (e.g., a right speaker).

While two audible in/out transducers 32-L and 32-R are shown, multiple audible in/out transducers can be used for multiple speaker/microphone implementations such as a surround sound. Surround sound uses more than two channels and thus more than two transducers to produce an immersive sound experience coming from multiple directions. In another embodiment, multiple audible in/out transducers are used but a single monoaural (mono) sound signal is copied to the multiple audible in/out transducers 32 (e.g., a two speaker mono headset).

The left audible in/out transducer 32-L and the right left audible in/out transducer 32-R operate similarly to the audible in/out transducers 32 of previous Figures. The left audio RX/TX circuit 35-L and the right audio RX/TX circuit 35-R operate similarly to the audio RX/TX circuit 35 of previous Figures and each include a non-inverting op-amp 100, an analog to digital converter (ADC) 102, a digital to analog (DAC) module 104, a feedback circuit 106, and a controlled source circuit 108.

In an example of operation, a left audible input signal 84-L (e.g., sound waves) changes the electrical characteristics of the left audible in/out transducer 32-L which produces a left audio RX signal 86-L. When the left audible in/out transducer 32-L is both receiving a left audio TX signal 94-L and transmitting a left audio RX signal 86-L, the voltage of the left audible in/out transducer 32-L generated as a result of the left audio TX signal 94-L is affected by the left audio RX signal 86-R. The op-amp 100 of the left audio RX/TX circuit 35-L compares the voltage of the left audible in/out transducer 32-L with analog voltage reference signal (a TX reference signal 95) to produce an analog comparison signal (Vout). The Vout signal includes a representation of the left audio RX signal 86-L as well a delayed transmit signal (due to circuitry delay). The ADC 102 converts the analog Vout signal to a left digital Tx/Rx signal 88-L for output.

The TX reference signal 95 is generated by the DAC module 104 based on a left digital TX signal 92-L provided to the left audio RX/TX circuit 35-L (e.g., from a processing module, etc.). The TX reference signal 95 includes a DC component and an oscillating component. Therefore, the left audible in/out transducer 32-L voltage as measured at the op-amp 100 input will have a substantially matching DC component and oscillating component as the TX reference signal 95. The DAC module 104 and the TX reference signal 95 are described in greater detail with reference to FIGS. 6-7.

The feedback circuit 106 generates a regulation (reg) signal 91 based on the Vout signal and provides the regulation signal 91 to the controlled source circuit 108. The regulation signal 91 may be the Vout signal (e.g., when the feedback circuit is a wire) or a processed version of the Vout signal depending on the components of the feedback circuit 106 and input requirements of the controlled source circuit 108.

The controlled source circuit 108 adjusts generation of its output based on the regulation signal 91 to keep the inputs of the op-amp 100 substantially matching. Thus, the left audio RX/TX circuit 35-L operates as a control loop that regulates the left audible in/out transducer 32-L voltage to substantially match the voltage of the TX reference signal 95 by adjusting the regulation signal 91 to compensate for the effects that the left audio RX signal 86-L has on the left audible in/out transducer 32-L voltage.

The right audible in/out transducer 32-R and the right audio RX/TX circuit 35-R operate similarly to the left audible in/out transducer 32-L and the left audio RX/TX circuit 35-L. The right digital TX signal 92-R may the same signal as the left digital TX signal 92-L (for mono sound) or a different signal than the left digital TX signal 92-L (for stereo sound).

Figure 17:
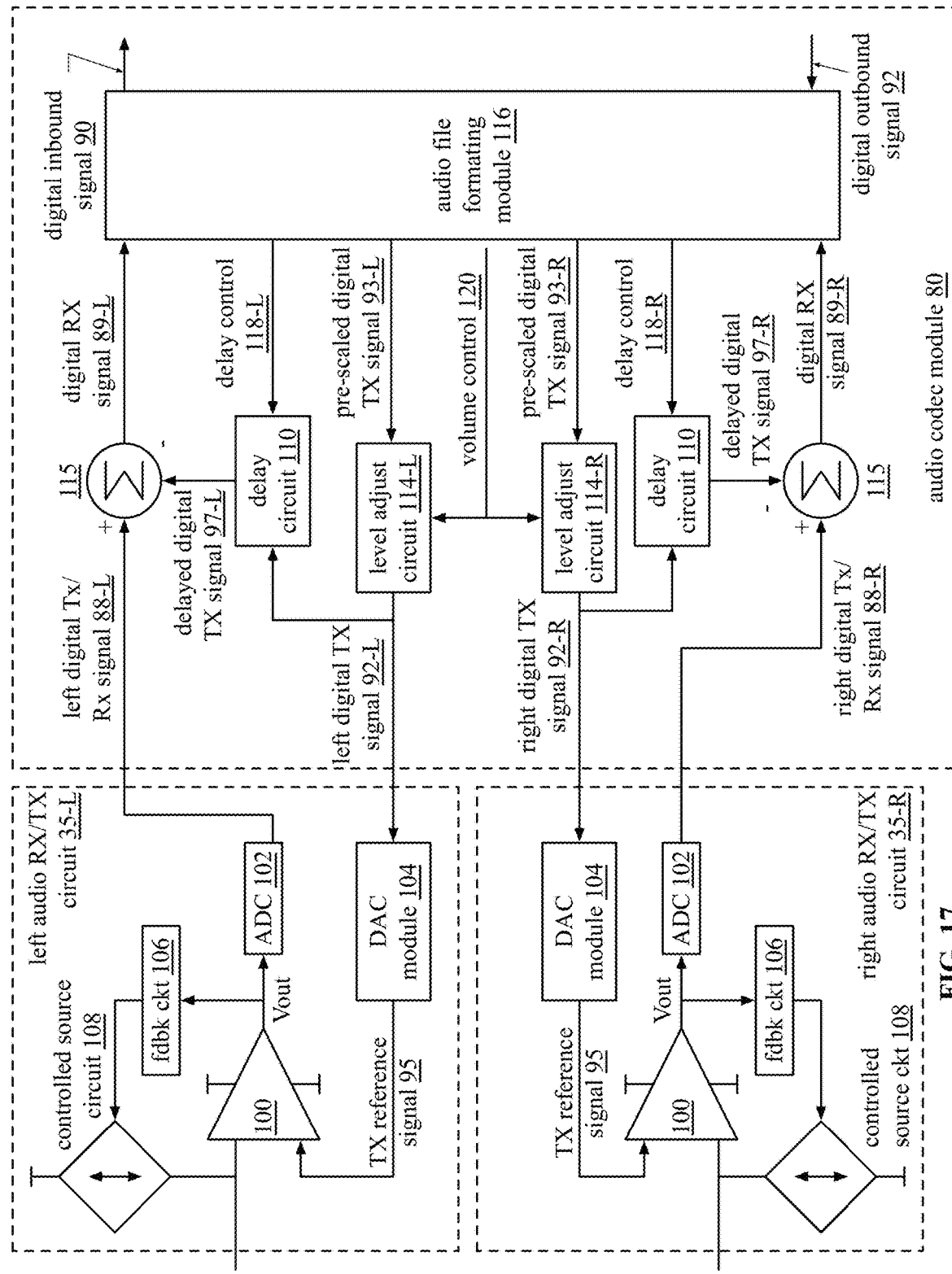
FIG. 17 is a schematic block diagram of another embodiment of an audio in/out device in accordance with the present invention.

FIG. 17 is a schematic block diagram of an embodiment of an audio in/out device 65 implementing stereophonic ("stereo") sound that includes left and right audible in/out transducers 32-L and 32-R (not shown), a left audio receive/transmit (RX/TX) circuit 35-L, a right audio RX/TX circuit 35-R, and an audio codec module 80. For example, the audio in/out device 65 is a stereophonic (stereo) headset, a stereo speaker pair, a conference speaker set, etc.

The left audio RX/TX circuit 35-L and the right audio RX/TX circuit 35-R operate similarly to the left audio RX/TX circuit 35-L and the right audio RX/TX circuit 35-R of FIG. 16. The audio codec module 80 operates similarly to the audio codec module 80 of FIG. 11 and includes delay circuits 110, level adjust circuits 114-L and 114-R, summing circuits 115, and an audio file formatting module 116.

The audio file formatting module 116 is operable to format digital signals into a desired audio file format for output and to format received digital audio files into digital signals for transmitting to the left and right audio RX/TX circuits 35-L and 35-R. The audio file formatting module 116 is further operable to generate control signals to adjust for transmit signal delays, generate control signals to adjust the magnitude of the digital outbound data (e.g., volume control 120), and pre-scale the digital outbound signal 92.

In an example of operation, the audio file formatting module 116 receives a digital outbound signal 92 (e.g., from a processing module via an interface module). Depending on the desired sound effect (e.g., stereo, mono, etc.), the audio file formatting module 116 processes the digital outbound signal 92 to produce one or more digital TX signals. Here, the digital outbound signal 92 is divided into two signals: a left digital TX signal and right digital TX signal.

The audio file formatting module 116 formats the digital outbound signal 92 from a particular audio format into a desired left digital transmit signal and a desired right digital transmit signal. The audio file formatting module 116 pre-scales the left digital transmit signal to produce a pre-scaled digital TX signal 93-L and pre-scales the right digital transmit signal to produce a pre-scaled digital TX signal 93-R. The audio file formatting module 116 communicates a volume control signal 120 to the level adjust circuits 114-L and 114-R. The level adjust circuits 114-L and 114-R adjust the magnitude of the pre-scaled digital TX signals 93-L and 93-R in accordance with the volume control signal 120 to produce the left digital TX signal 92-L and the right digital TX signal 92-R.

The left digital TX signal 92-L is provided to the DAC module 104 of the left audio RX/TX circuit 35-L where it is processed as discussed with reference to previous Figures. The left digital TX signal 92-L is also provided to a corresponding delay circuit 110. The audio file formatting module 116 communicates a delay control signal 118-L to the delay circuit 110. The delay control signal 118-L corresponds to the circuitry lag of the left audio in/out device 65-L. The delay control signal 118-L further includes a magnitude scale signal corresponding to an amount the magnitude of the left digital TX signal 92-L needs to be scaled to match the magnitude of the transmit component of the left digital Tx/Rx signal 88-L. The corresponding delay circuit 110 delays and magnitude adjusts the left digital TX signal 92-L in accordance with a delay control signal 118-L to produce a delayed digital TX signal 97-L.

The corresponding summing circuit 115 receives the left digital Tx/Rx signal 88-L from the left audio RX/TX circuit 35-L and subtracts the delayed digital TX signal 97-L from the left digital Tx/Rx signal 88-L to produce a digital RX signal 89-L. With the delayed digital TX signal 97-L, the correct transmit signal is subtracted from the left digital Tx/Rx signal 88-L and the correct digital Rx signal 89-L is produced.

The right digital TX signal 92-R is provided to the DAC module 104 of the right audio RX/TX circuit 35-R where it is processed as discussed with reference to previous Figures. The right digital TX signal 92-R is also provided to a corresponding delay circuit 110. The audio file formatting module 116 communicates a delay control signal 118-R to the delay circuit 110. The delay control signal 118-R corresponds to the circuitry lag of the right audio in/out device 65-R. The delay control signal 118-R further includes a magnitude scale signal corresponding to an amount the magnitude of the right digital TX signal 92-R needs to be scaled to match the magnitude of the transmit component of the right digital Tx/Rx signal 88-R. The corresponding delay circuit 110 delays and magnitude adjusts the right digital TX signal 92-R in accordance with the delay control signal 118-R to produce a delayed digital TX signal 97-R.

The corresponding summing circuit 115 receives the right digital Tx/Rx signal 88-R from the right audio RX/TX circuit 35-R and subtracts the delayed digital TX signal 97-R from the right digital Tx/Rx signal 88-R to produce a digital RX signal 89-R. With the delayed digital TX signal 97-R, the correct transmit signal is subtracted from the right digital Tx/Rx signal 88-R and the correct digital Rx signal 89-R is produced.

The digital RX signal 98-L and the digital RX signal 89-R are provided to the audio file formatting module 116 where the signals are processed for output to produce a digital inbound signal 90. For example, the digital inbound signal 92 may be the processed digital RX signal 89-R, the processed digital RX signal 89-L, or a mixed version of the digital RX signal 89-R and the digital RX signal 89-L.

Figure 18:
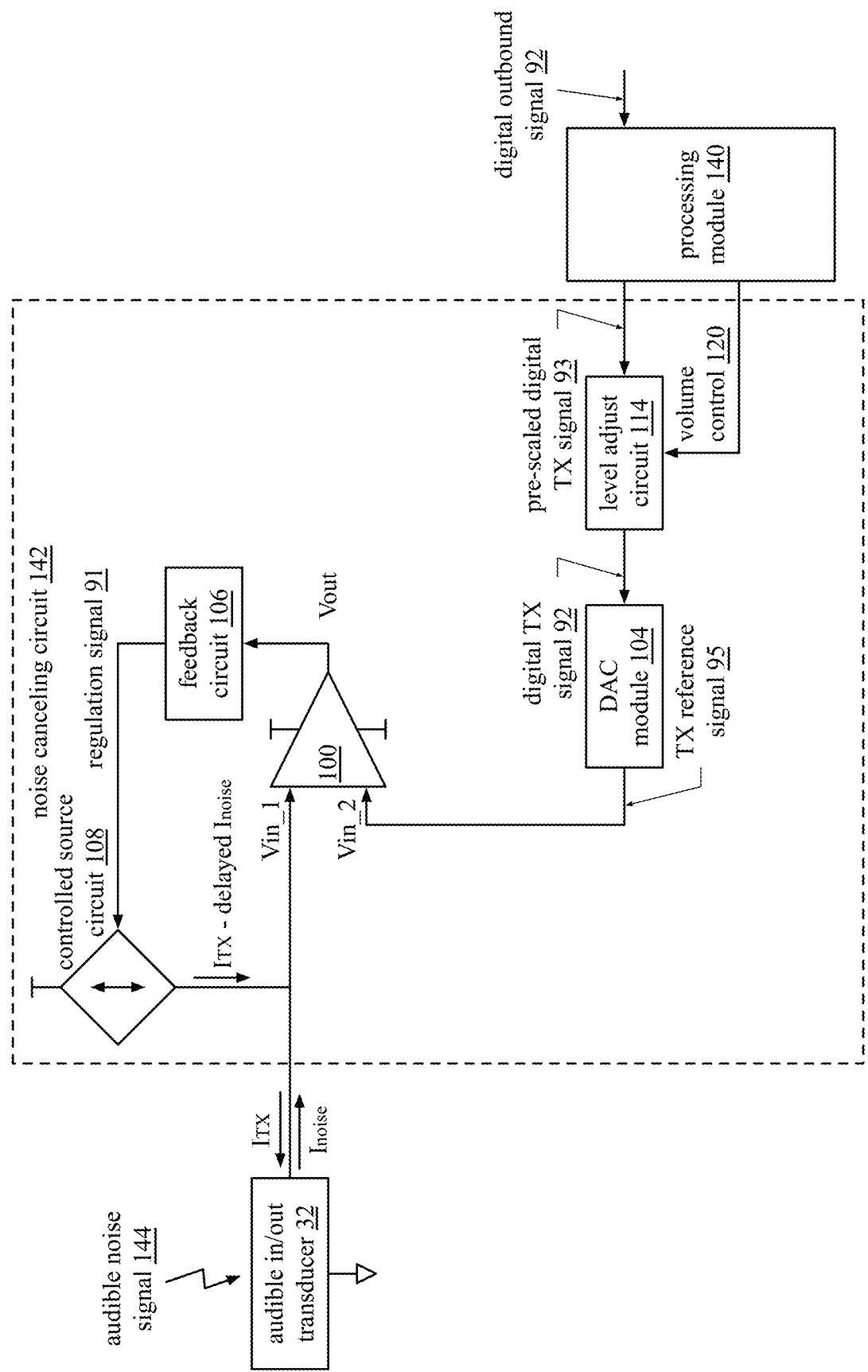
FIG. 18 is a schematic block diagram of an embodiment of an audio in/out device as a noise canceling speaker system in accordance with the present invention.

FIG. 18 is a schematic block diagram of an embodiment of an audio in/out device 65 as a noise canceling speaker system that includes an audible in/out transducer 32, a noise canceling circuit 142, and a processing module 140. Active noise-cancelation (ANC) works by using one or more microphones to detect low frequency noise where one or more noise-cancelation speakers emit a sound wave with the same amplitude but inverted phase compared to the detected low frequency noise. The sound wave emitted from the one or more speakers cancels out the detected low frequency noise in a process called destructive interference.

In conventional noise canceling speaker systems, the microphone and speaker are separate transducers that may be co-located or located in different locations (e.g., the transducer emitting the cancelation signal is located where sound attenuation is most desired). In small enclosed spaces, global noise reduction can be achieved via multiple speakers and feedback microphones using measurements of the modal responses of the enclosure.

Here, a single transducer (the audible in/out transducer 32) functions as both the microphone and the speaker of the audio in/out device 65 requiring less circuitry and allowing for greater accuracy in noise cancelation. Greater accuracy in noise cancelation is possible with the audio in/out device 65 because the exact noise signal present on the transmit signal can be identified and removed. Further, the noise canceling circuit 142 is operable to detect very small noise levels for removal due to the high I-to-V gain of the noise canceling circuit 142 loop.

In this embodiment, the audible in/out transducer 32 is in very close proximity to a user's ear (e.g., located in an ear bud style headphone) such that the electrical characteristic changes of the audible in/out transducer 32 caused by an audible noise signal is the acoustic noise heard by the listener. Eliminating the noise on the transmit/receive line, thus substantially eliminates the noise heard by the user. Further embodiments where the user's ear is not in such close proximity to the audible in/out transducer are described with reference to FIGS. 21-23.

The noise canceling circuit 142 includes a non-inverting operational amplifier (op-amp) 100, a digital to analog converter (DAC) module 104, a feedback circuit 106, a controlled source circuit 108, and a level adjust circuit 114. The DAC module 104 includes a DAC. The DAC may be implemented in a variety of ways. For example, the DAC is one of: a sigma-delta DAC, a pulse width modulator DAC, a binary weighted DAC, a successive approximation DAC, and/or a thermometer-coded DAC of desired resolution (e.g., 8-bit, 16-bit, 32-bit, etc.).

The controlled source circuit 108 may be implemented in a variety of ways. For example, the controlled source circuit 108 is a current mirror circuit sourced via a DC input voltage to produce an audio transmit signal based on a regulation signal generated at the output of the op-amp 100. As another example, the controlled source circuit 108 is a current controlled current source or a voltage controlled current source. As yet another example, the controlled source circuit 108 is a bidirectional dependent voltage source circuit or a bidirectional dependent current source circuit (e.g., Howland current pump circuit that produces a voltage controlled current and requires one op-amp and multiple resistors).

The feedback circuit 106 may be implemented with a controlled source regulation circuit, a biasing circuit, a wire, etc. The level adjust circuit 114 may be implemented by cascaded and differentially switched complimentary metal-oxide semiconductor (CMOS) transistors, by a non-inverting op-amp level shifter, etc.

In an example of operation, the processing module 140 receives a digital outbound signal 92. The digital outbound signal 92 is an audio file for output to the audible in/out transducer 32. The processing module 140 formats the digital outbound signal 92 from a particular audio format into a desired digital signal for processing by the noise canceling circuit 142. For example, the processing module 140 is operable to implement a variety of digital signal processing techniques such as up-sampling, down-sampling, digital filtering, encoding/decoding, and compression/decompression to produce a desired digital signal.

The processing module 140 pre-scales the desired digital signal to produce a pre-scaled digital TX signal 93. Pre-scaling reduces a high frequency signal to a lower frequency by integer division. The processing module 140 is further operable to communicate a volume control signal 120 to the level adjust circuit 114. The level adjust circuit 114 adjusts the magnitude of the pre-scaled digital TX signal 93 in accordance with the volume control signal 120 to produce a digital TX signal 92 at a desired volume level.

The digital TX signal 92 is provided to the DAC module 104 where the DAC module 104 produces a TX reference signal 95. The TX reference signal 95 is a voltage reference signal having an oscillating component and a DC (direct current) component. As such, the audible in/out transducer 32 voltage as measured at the op-amp 100 input will have a substantially matching DC component and oscillating component as the TX reference signal 95. The DAC module 104 and the TX reference signal 95 are discussed in more detail with reference to FIGS. 6-7.

The audible in/out transducer 32 is affected by an audible noise signal 144 that changes the electrical characteristics of the audible in/out transducer 32 which produces a noise (current) signal $I_{noise}$. When the audible in/out transducer 32 is both generating the noise (current) signal $I_{noise}$ and transmitting a transmit (current) signal $I_{TX}$, the voltage of the audible in/out transducer 32 created as a result of transmit signal $I_{TX}$ is affected by the noise signal $I_{noise}$.

The op-amp 100 compares the voltage of the audible in/out transducer 32 with the TX reference signal 95 to produce an analog comparison signal (Vout). The Vout signal includes a representation of the noise signal $I_{noise}$ and the transmit signal $I_{TX}$. In other words, the Vout signal is representative of an amount the transmit signal $I_{TX}$ (as affected by the noise signal $I_{noise}$) needs to be adjusted such that the audible in/out transducer 32 voltage matches the TX reference signal 95. Transmitting the TX reference signal 95 through the circuitry of the noise canceling circuit 142 results in a transmit signal $I_{TX}$ delay proportional to the bandwidth of the noise canceling circuit 142 loop.

The feedback circuit 106 generates a regulation signal 91 based on the Vout signal and provides the regulation signal 91 to the controlled source circuit 108. The regulation signal 91 may be the Vout signal (e.g., when the feedback circuit is a wire) or a processed version of the Vout signal depending on the components of the feedback circuit 106 and input requirements of the controlled source circuit 108.

The controlled source circuit 108 adjusts generation of its output based on the regulation signal 91 to keep the inputs of the op-amp 100 substantially matching. For example, based on the regulation signal 91, the controlled source circuit 108 outputs a signal $I_{TX}$–delayed $I_{noise}$ where delayed $I_{noise}$ is a delayed version of the noise signal $I_{noise}$ due to circuitry lag. With a noise canceling circuit 142 loop bandwidth of approximately 1 MHz, the circuitry lag is approximately 1 microsecond. The human audible frequency range spans from 20 Hz to 20 kHz with corresponding time periods spanning 0.05 seconds to 50 microseconds. Thus, a noise signal delayed by 1 microsecond substantially matches the noise signal heard by the human ear. As such, transmitting the transmit signal minus the delayed $I_{noise}$ substantially removes the effect of the noise signal $I_{noise}$ on the transmit signal $I_{TX}$.

In summary, the noise canceling circuit 142 operates as a control loop that regulates the audible in/out transducer 32 voltage to substantially match the voltage of the TX reference signal 95 by adjusting a regulation signal 91 to remove the effect that the noise signal $I_{noise}$ has on the audible in/out transducer 32 voltage.

Figure 19A:
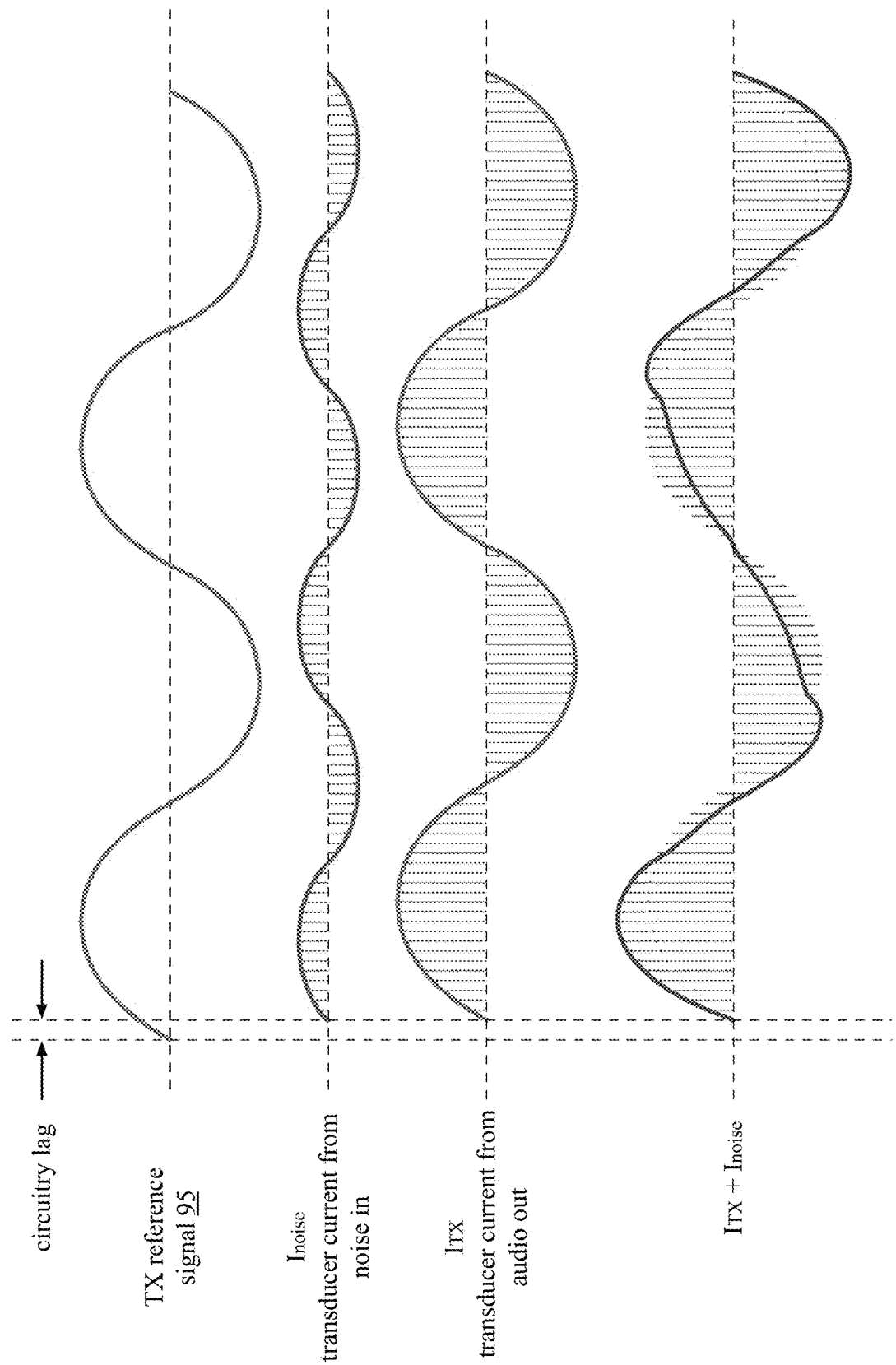
FIGS. 19A-19C are examples of the signals of the audio in/out device of FIG. 18 in accordance with the present invention.
Figure 19B:
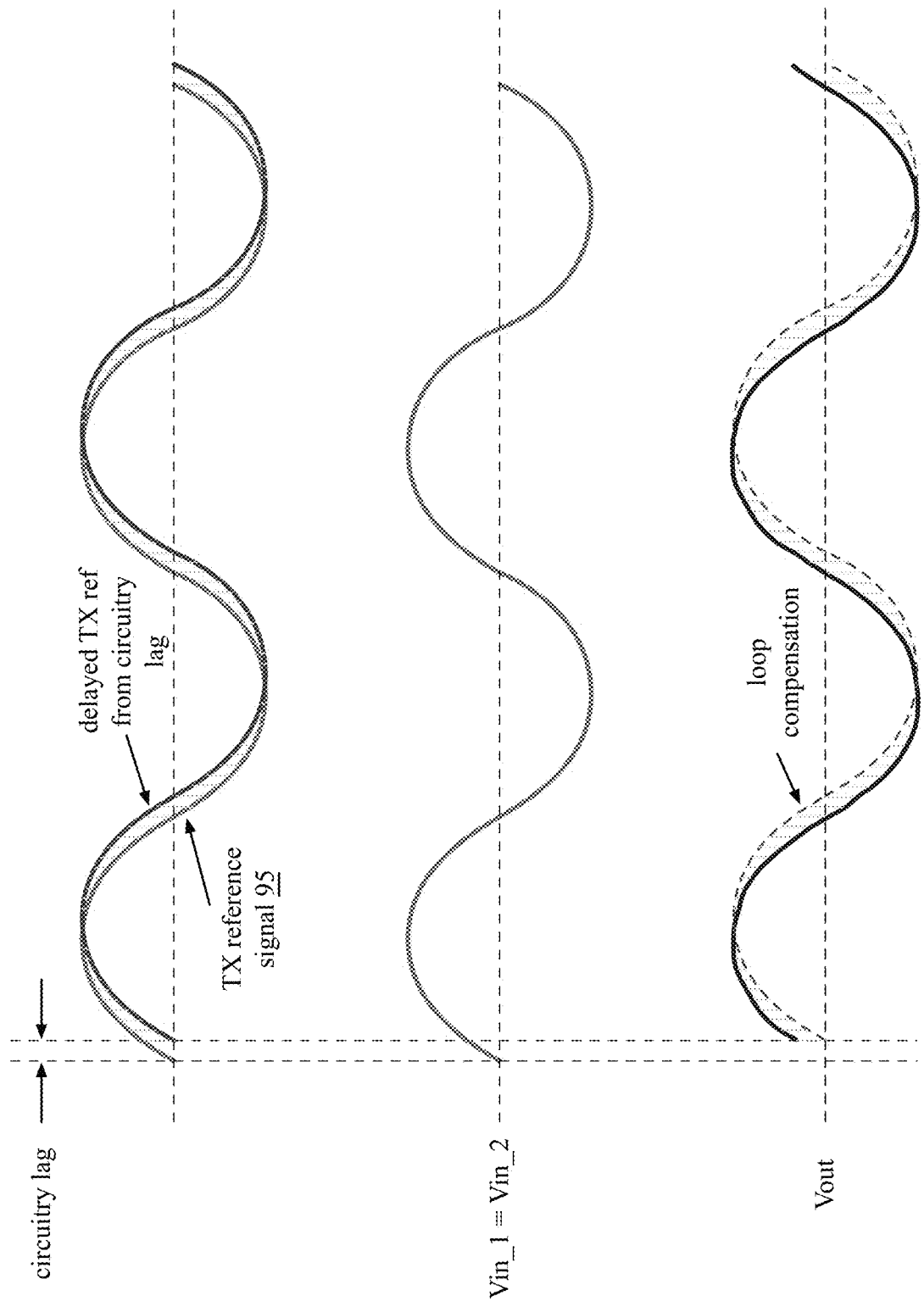
Figure 19C:
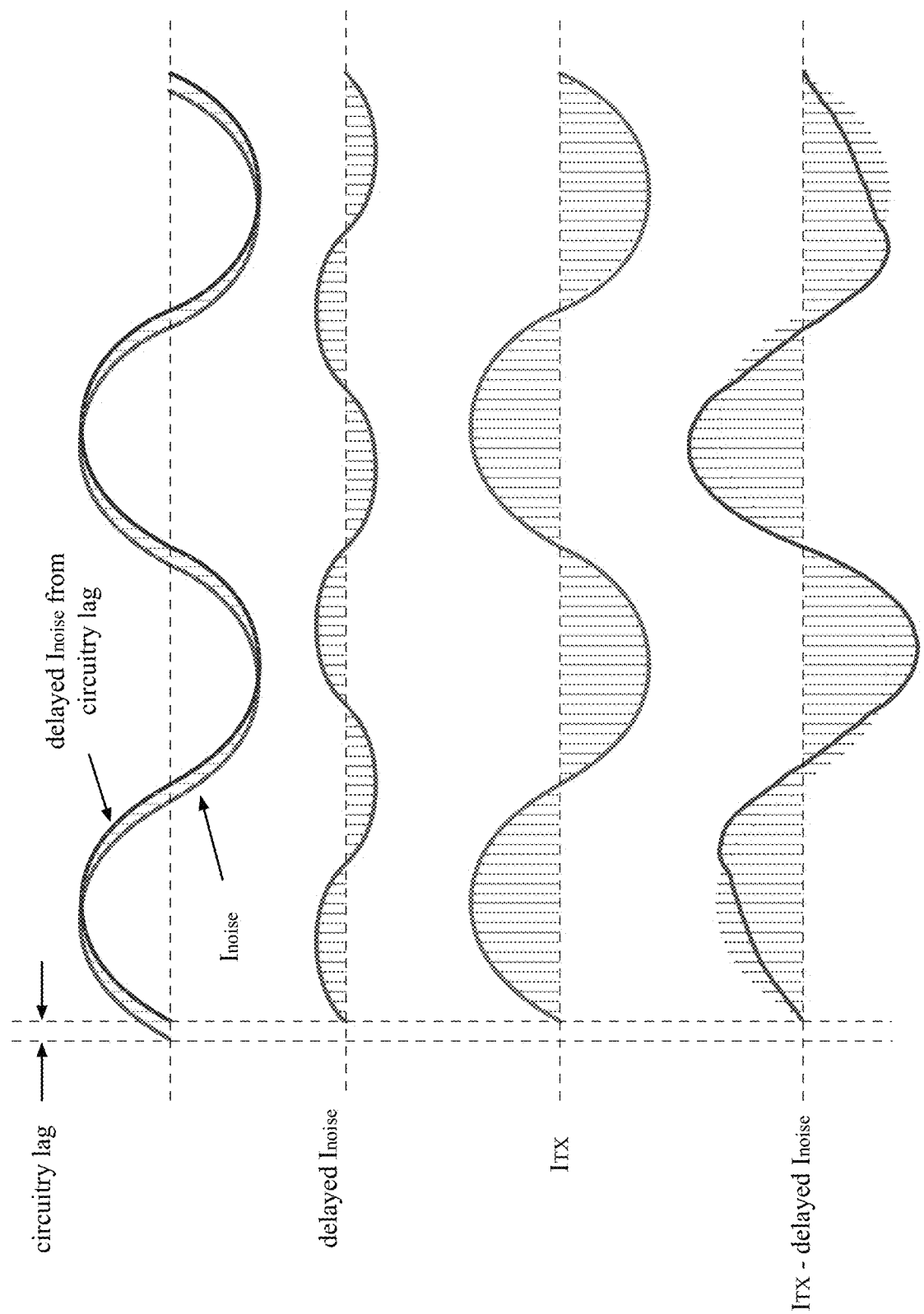

FIGS. 19A-19C are examples of the signals of the audio in/out device 65 as a noise canceling speaker system of FIG. 18. While pure tones sinusoids are shown for simplicity, other waveforms are possible. FIG. 19A shows an example of a TX reference signal 95 having a sinusoidal waveform at a particular magnitude, frequency, and phase.

The noise signal $I_{noise}$ (e.g., audible in/out transducer current from noise in) and the transmit signal $I_{TX}$ (e.g., audible in/out transducer current from audio out) are both delayed by the circuitry lag of the TX reference signal 95 going through the noise cancelling circuit loop. For example, an op-amp has a bandwidth of approximately 1 MHz or more such that processing takes approximately 1 microsecond.

As shown, the TX reference signal 95 is generated at a first time. After the circuitry lag, the transmit signal $I_{TX}$ is a current signal produced such that the voltage across the audible in/out transducer to substantially equal the TX reference signal 95. The noise signal $I_{noise}$ is the current signal generated based on the noise received at the time of the transmit signal correction and thus shares the same circuitry lag delay as the transmit signal $I_{TX}$. The currents that affect the voltage of the audible in/out transducer are shown as a combination of the transmit signal $I_{TX}$ and the noise signal $I_{noise}$ (e.g., $I_{TX}+I_{noise}$). The voltage output (Vout) of the op-amp follows this current signal.

FIG. 19B shows a comparison between the TX reference signal 95 as generated and when it is delayed by the circuitry (delayed TX ref from circuitry lag). The next signal shows the inputs to the op-amp that are regulated by the control loop of the noise canceling circuit to be substantially equal. Vin_2 is the TX reference signal 95 and Vin_1 is the audible in/out transducer voltage at the input of the op-amp. Vin_1 and Vin_2 are input signals thus not delayed by the circuitry lag.

The control loop of the noise canceling circuit regulates the delay offset from the TX reference signal as shown in the Vout signal. As the load and current varies, the non-inverting op-amp regulates voltage. Thus, the Vout signal follows the varying current signals (e.g., the delayed combination of the transmit signal $I_{TX}$ and the noise signal $I_{noise}$ (e.g., $I_{TX}+I_{noise}$) of FIG. 19A).

FIG. 19C shows a comparison between the noise signal $I_{noise}$ when generated by the audible in/out transducer and when it is sensed/processed by the noise canceling circuit (delayed $I_{noise}$). The difference in the noise signal $I_{noise}$ and the delayed $I_{noise}$ signal is residual noise. When the bandwidth of the control loop of the noise canceling circuit is greater than 1 MHz, then the residual noise should be negligible (e.g., less than 1%).

The transmit signal $I_{TX}$ and the delayed $I_{noise}$ signal share the same circuitry lag delay. The transmit signal $I_{TX}$ minus delayed $I_{noise}$ is the current signal generated by the controlled source circuit to substantially cancel the effect of that the noise signal $I_{noise}$ has on the transmit signal $I_{TX}$.

Figure 20:
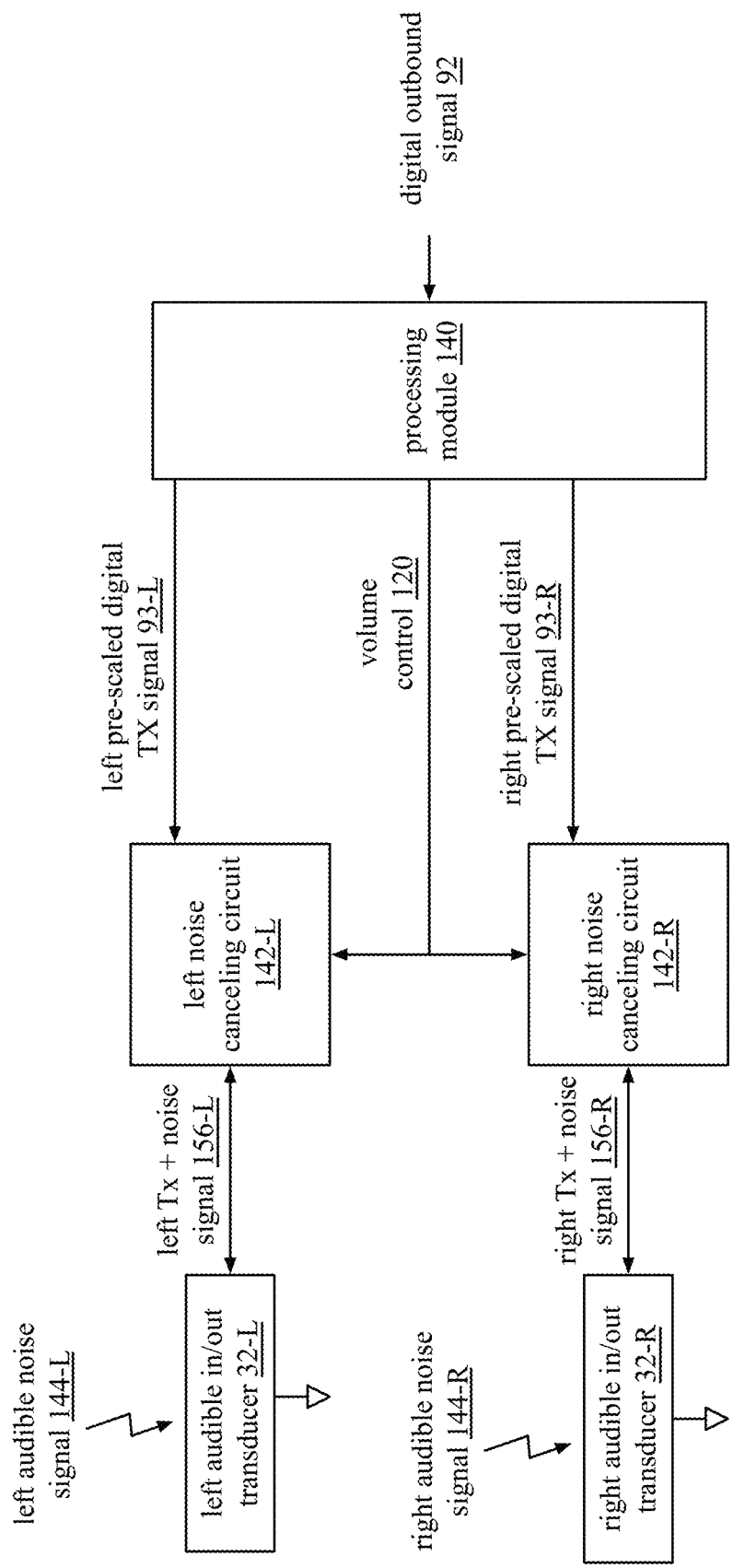
FIG. 20 is a schematic block diagram of another embodiment of an audio in/out device as a noise canceling speaker system in accordance with the present invention.

FIG. 20 is a schematic block diagram of an embodiment of an audio in/out device 65 that includes a left audible in/out transducer 32-L, a right audible in/out transducer 32-R, a left noise canceling circuit 142-L, a right noise canceling circuit 142-R, and a processing module 140. For example, the audio in/out device 65 is noise canceling stereo headphones.

The left audible in/out transducer 32-L and the right audible in/out transducer 32-R operate similarly to the audible in/out transducer 32 of FIG. 18. The left noise canceling circuit 142-L and the right noise canceling circuit 142-R operate similarly to the noise canceling circuit 142 of FIG. 18.

In an example of operation, the processing module 140 receives a digital outbound signal 92. The processing module 140 is operable to format digital signals into a desired audio file format for output and to format received digital audio files into digital signals for transmitting to the left and right audio noise canceling circuits 142-L and 142-R. The digital outbound signal 92 is an audio file to be output to the audible in/out transducers 32-L and 32-R.

The processing module 140 formats the digital outbound signal 92 from a particular audio format into a desired digital signal format for processing by each noise canceling circuit 142-L and 142-R. For example, the processing module 140 is operable to implement a variety of digital signal processing techniques such as up-sampling, down-sampling, digital filtering, encoding/decoding, and compression/decompression to produce a desired digital signal. Depending on the desired sound effect (e.g., stereo, mono, etc.), the processing module 140 processes the digital outbound signal 92 to produce one or more digital TX signals. Here, the digital outbound signal 92 is divided into two signals for stereo sound: a left digital TX signal and right digital TX signal.

The processing module 140 pre-scales the left and right digital TX signals to produce a pre-scaled digital TX signal 93-L and a pre-scaled digital TX signal 93-R. Pre-scaling reduces a high frequency signal to a lower frequency by integer division. The processing module 140 is further operable to communicate a volume control signal 120 to each noise canceling circuit 142-L and 142-R where each noise canceling circuit 142-L and 142-R adjusts the magnitude of the pre-scaled digital TX signals 93-L and 93-R in accordance with the volume control signal 120 to produce digital TX signals at a desired volume level. Each noise canceling circuit 142-L and 142 -R generates a voltage TX reference signal based on its digital TX signal input.

The left audible in/out transducer 32-L is affected by a left audible noise signal 144-L that changes the electrical characteristics of the left audible in/out transducer 32-L which produces a left noise (current) signal $I_{noise}$. The right audible in/out transducer 32-R is affected by a right audible noise signal 144-R that changes the electrical characteristics of the right audible in/out transducer 32-R which produces a right noise (current) signal $I_{noise}$. Therefore, a left Tx+noise signal 156-L is the current on the left audible in/out transducer 32-L and a right Tx+noise signal 156-R is the current on the right audible in/out transducer 32-R.

Each noise canceling circuit 142-L and 142-R operates as previously described with reference to FIGS. 18-19C to adjust the left Tx+noise signal 156-L and the right Tx+noise signal 156-R to regulate the transducer voltages to substantially match the voltage of the TX reference signals thus removing the effect that the noise signals have on the audible in/out transducer voltage and canceling out the noise signals on the transmit signals.

Figure 21:
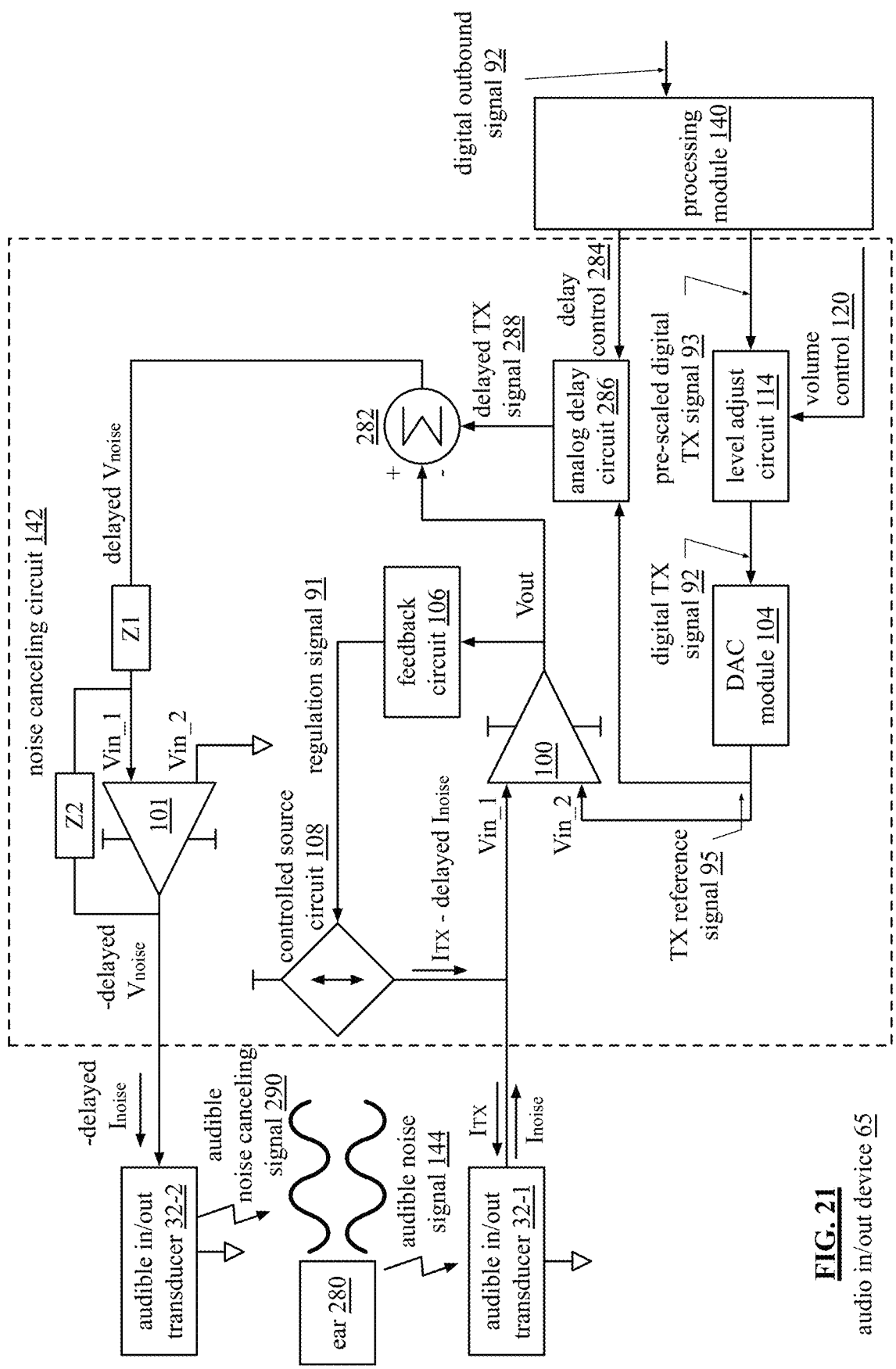
FIG. 21 is a schematic block diagram of another embodiment of an audio in/out device as a noise canceling speaker system in accordance with the present invention.

FIG. 21 is a schematic block diagram of an embodiment of an audio in/out device 65 as a noise canceling speaker system that includes co-located audible in/out transducers 32-1 and 32-2, a noise canceling circuit 142, and a processing module 140. FIG. 21 operates similarly to FIG. 18 except that, in this embodiment, a user's ear 280 hears the audible noise signal 144 as an acoustic wave (e.g., there is space between the ear 280 and the audible in/out transducer). In order to cancel the noise that the ear 280 hears, the noise on the line needs to be canceled (as described in FIG. 18) but also, an equal and opposite noise canceling signal 290 needs to be emitted to cancel the acoustic wave heard by the ear 280.

The noise canceling circuit 142 includes a non-inverting operational amplifier (op-amp) 100, a digital to analog converter (DAC) module 104, a feedback circuit 106, a controlled source circuit 108, a level adjust circuit 114, an analog delay circuit 286, a summing circuit 282, and an inverting op-amp 101. The DAC module 104 includes a DAC. The DAC may be implemented in a variety of ways. For example, the DAC is one of: a sigma-delta DAC, a pulse width modulator DAC, a binary weighted DAC, a successive approximation DAC, and/or a thermometer-coded DAC of desired resolution (e.g., 8-bit, 16-bit, 32-bit, etc.).

The controlled source circuit 108 may be implemented in a variety of ways. For example, the controlled source circuit 108 is a current mirror circuit sourced via a DC input voltage to produce an audio transmit signal based on a regulation signal generated at the output of the op-amp 100. As another example, the controlled source circuit 108 is a current controlled current source or a voltage controlled current source. As yet another example, the controlled source circuit 108 is a bidirectional dependent voltage source circuit or a bidirectional dependent current source circuit (e.g., Howland current pump circuit that produces a voltage controlled current and requires one op-amp and multiple resistors).

The feedback circuit 106 may be implemented with a controlled source regulation circuit, a biasing circuit, a wire, etc. The analog delay circuit 130 may be implemented using a timer circuit (e.g., such as a differentiator circuit, a resistor-capacitor (RC) circuit delay line, etc.). The level adjust circuit 114 may be implemented by cascaded and differentially switched complimentary metal-oxide semiconductor (CMOS) transistors, by a non-inverting op-amp level shifter, etc.

In an example of operation, the processing module 140 receives a digital outbound signal 92. The digital outbound signal 92 is an audio file for output to the audible in/out transducer 32. The processing module 140 formats the digital outbound signal 92 from a particular audio format into a desired digital signal for processing by the noise canceling circuit 142. For example, the processing module 140 is operable to implement a variety of digital signal processing techniques such as up-sampling, down-sampling, digital filtering, encoding/decoding, and compression/decompression to produce a desired digital signal.

The processing module 140 pre-scales the desired digital signal to produce a pre-scaled digital TX signal 93. Pre-scaling reduces a high frequency signal to a lower frequency by integer division. The processing module 140 is further operable to communicate a volume control signal 120 to the level adjust circuit 114. The level adjust circuit 114 adjusts the magnitude of the pre-scaled digital TX signal 93 in accordance with the volume control signal 120 to produce a digital TX signal 92 at a desired volume level.

The digital TX signal 92 is provided to the DAC module 104 where the DAC module 104 produces a TX reference signal 95. The TX reference signal 95 is a voltage reference signal having an oscillating component and a DC (direct current) component. The TX reference signal 95 is provided to the analog delay circuit 286 and an input of the non-inverting op-amp 100. As such, the audible in/out transducer 32 voltage as measured at the op-amp 100 input will have a substantially matching DC component and oscillating component as the TX reference signal 95. The DAC module 104 and the TX reference signal 95 are discussed in more detail with reference to FIGS. 6-7.

The audible in/out transducer 32-1 is affected by an audible noise signal 144 that changes the electrical characteristics of the audible in/out transducer 32-1 which produces a noise (current) signal $I_{noise}$. When the audible in/out transducer 32-1 is both generating the noise (current) signal $I_{noise}$ and transmitting a transmit (current) signal $I_{TX}$, the voltage of the audible in/out transducer 32-1 created as a result of transmit signal $I_{TX}$ is affected by the noise signal $I_{noise}$.

The op-amp 100 compares the voltage of the audible in/out transducer 32-1 with the TX reference signal 95 to produce an analog comparison signal (Vout). The Vout signal includes a representation of the noise signal $I_{noise}$ and the transmit signal $I_{TX}$. In other words, the Vout signal is representative of an amount the transmit signal $I_{TX}$ (as affected by the noise signal $I_{noise}$) needs to be adjusted such that the audible in/out transducer 32-1 voltage matches the TX reference signal 95. Transmitting the TX reference signal 95 through the circuitry of the noise canceling circuit 142 results in a transmit signal $I_{TX}$ delay proportional to the bandwidth of the noise canceling circuit 142 loop.

The feedback circuit 106 generates a regulation signal 91 based on the Vout signal and provides the regulation signal 91 to the controlled source circuit 108. The regulation signal 91 may be the Vout signal (e.g., when the feedback circuit is a wire) or a processed version of the Vout signal depending on the components of the feedback circuit 106 and input requirements of the controlled source circuit 108.

The controlled source circuit 108 adjusts generation of its output based on the regulation signal 91 to keep the inputs of the op-amp 100 substantially matching. For example, based on the regulation signal 91, the controlled source circuit 108 outputs a signal $I_{TX}$–delayed $I_{noise}$ where delayed $I_{noise}$ is a delayed version of the noise signal $I_{noise}$ (due to circuitry lag). Transmitting the transmit signal minus the delayed $I_{noise}$ substantially removes the effect of the noise signal $I_{noise}$ on the transmit signal $I_{TX}$.

The processing module 140 communicates a delay control signal 284 corresponding to amount of delay created by the lag in the circuitry. The delay control signal 284 further includes a magnitude scale signal corresponding to an amount the magnitude of the TX reference signal 95 needs to be scaled to match the magnitude of the transmit component of the Vout signal. The TX reference signal 95 is delayed and magnitude adjusted in accordance with the delay control signal 284 to produce a delayed analog TX signal 288.

The summing circuit 282 receives the Vout signal from the non-inverting op-amp 100 and subtracts the delayed TX signal 288 from the Vout signal to produce a delayed $V_{noise}$ signal. The delayed $V_{noise}$ signal corresponds to the delayed $I_{noise}$ component of the Vout signal. The delayed $V_{noise}$ signal is provided to the inverting op-amp 101. The impedances Z1 and Z2 of the inverting op-amp 101 are set such that the inverting op-amp 101 has a unity gain. The impedances Z1 and Z2 may be variable impedances (e.g., variable resistors) such that the gain can be adjusted as desired.

The output of the inverting op-amp 101 is an inverted delayed $V_{noise}$ signal (–delayed $V_{noise}$). The –delayed $V_{noise}$ signal produces a –delayed $I_{noise}$ signal to drive the audible in/out transducer 32-2. The electrical characteristics of the audible in/out transducer 32-2 change based on the –delayed $I_{noise}$ signal causing it to emit the audible noise canceling signal 290. The audible in/out transducer 32-2 is in very close proximity to the audible in/out transducer 32-1 such that the audible noise canceling signal 290 substantially eliminates the audible noise signal 144 heard by the ear 280.

Figure 22:
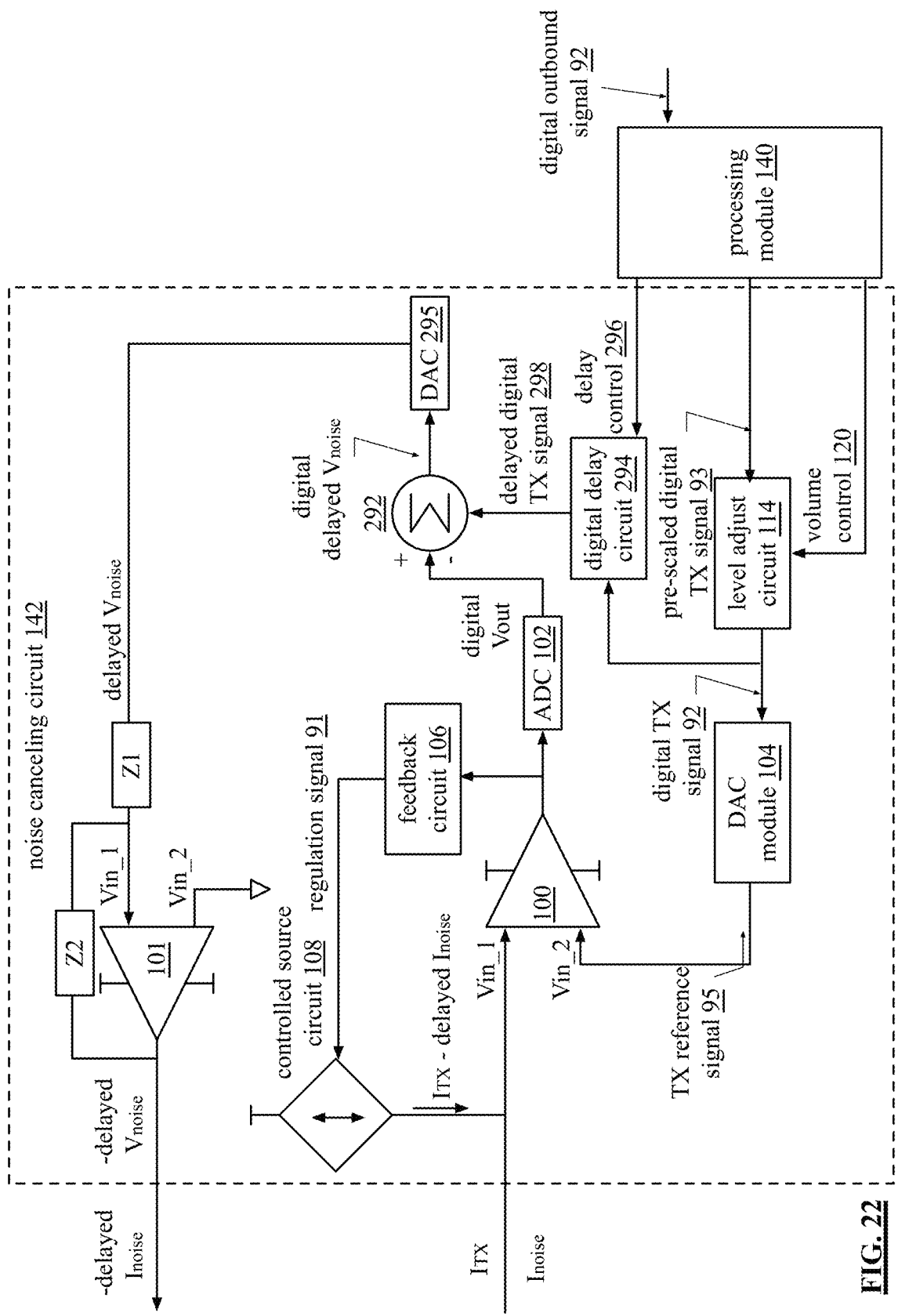
FIG. 22 is a schematic block diagram of an embodiment of a portion of an audio in/out device as a noise canceling speaker system in accordance with the present invention.

FIG. 22 is a schematic block diagram of an embodiment of a portion of an audio in/out device 65 as a noise canceling speaker system that includes a noise canceling circuit 142 and a processing module 140. FIG. 22 operates similarly to FIG. 21 except that the Vout signal is processed digitally. While processing the Vout signal in analog may be faster, subtracting signals in a digital format produces a more accurate result.

The noise canceling circuit 142 includes a non-inverting operational amplifier (op-amp) 100, a digital to analog converter (DAC) module 104, an analog to digital converter (ADC), a feedback circuit 106, a controlled source circuit 108, a level adjust circuit 114, a digital delay circuit 294, a summing circuit 292, a DAC 295, and an inverting op-amp 101. The DAC module 104 includes a DAC. The DAC of the DAC module 104 and the DAC 295 may be implemented in a variety of ways. For example, the DAC is one of: a sigma-delta DAC, a pulse width modulator DAC, a binary weighted DAC, a successive approximation DAC, and/or a thermometer-coded DAC of desired resolution (e.g., 8-bit, 16-bit, 32-bit, etc.).

The ADC 102 may be implemented in a variety of ways. For example, the (ADC) is one of: a flash ADC, a successive approximation ADC, a ramp-compare ADC, a Wilkinson ADC, an integrating ADC, a delta encoded ADC, and/or a sigma-delta ADC of adequate resolution (e.g., 8-bit, 16-bit, 32-bit, etc.).

The feedback circuit 106 may be implemented with a controlled source regulation circuit, a biasing circuit, a wire, etc. The digital delay circuit 294 implemented using a timer circuit (e.g., a digital timer circuit using flip flops). The level adjust circuit 114 may be implemented by cascaded and differentially switched complimentary metal-oxide semiconductor (CMOS) transistors, by a non-inverting op-amp level shifter, etc.

In an example of operation, the processing module 140 formats the digital outbound signal 92 from a particular audio format into a desired digital signal for processing by the noise canceling circuit 142. For example, the processing module 140 is operable to implement a variety of digital signal processing techniques such as up-sampling, down-sampling, digital filtering, encoding/decoding, and compression/decompression to produce a desired digital signal.

The processing module 140 pre-scales the desired digital signal to produce a pre-scaled digital TX signal 93. Pre-scaling reduces a high frequency signal to a lower frequency by integer division. The processing module 140 is further operable to communicate a volume control signal 120 to the level adjust circuit 114. The level adjust circuit 114 adjusts the magnitude of the pre-scaled digital TX signal 93 in accordance with the volume control signal 120 to produce a digital TX signal 92 at a desired volume level.

The digital TX signal 92 is provided to the DAC module 104 where the DAC module 104 produces a TX reference signal 95. The digital TX signal 92 is also provided to the digital delay circuit 294. The TX reference signal 95 is provided to an input of the non-inverting op-amp 100. As such, the audible in/out transducer 32 voltage as measured at the op-amp 100 input will have a substantially matching DC component and oscillating component as the TX reference signal 95.

The audible in/out transducer 32-1 is affected by an audible noise signal 144 that changes the electrical characteristics of the audible in/out transducer 32-1 which produce a noise (current) signal $I_{noise}$. When the audible in/out transducer 32-1 is both generating the noise (current) signal $I_{noise}$ and transmitting a transmit (current) signal $I_{TX}$, the voltage of the audible in/out transducer 32 created as a result of transmit signal $I_{TX}$ is affected by the noise signal $I_{noise}$.

The op-amp 100 compares the voltage of the audible in/out transducer 32-1 with the TX reference signal 95 to produce an analog comparison signal (Vout). The Vout signal includes a representation of the noise signal $I_{noise}$ and the transmit signal $I_{TX}$. Transmitting the TX reference signal 95 through the circuitry of the noise canceling circuit 142 results in a transmit signal $I_{TX}$ delay proportional to the bandwidth of the noise canceling circuit 142 loop.

The feedback circuit 106 generates a regulation signal 91 based on the Vout signal and provides the regulation signal 91 to the controlled source circuit 108. The regulation signal 91 may be the Vout signal (e.g., when the feedback circuit is a wire) or a processed version of the Vout signal depending on the components of the feedback circuit 106 and input requirements of the controlled source circuit 108.

The controlled source circuit 108 adjusts generation of its output based on the regulation signal 91 to keep the inputs of the op-amp 100 substantially matching. For example, based on the regulation signal 91, the controlled source circuit 108 outputs a signal $I_{TX}$–delayed $I_{noise}$ where delayed $I_{noise}$ is a delayed version of the noise signal $I_{noise}$ (due to circuitry lag) to substantially remove the effect of the noise signal $I_{noise}$ on the transmit signal $I_{TX}$.

The ADC 102 converts the analog Vout signal to a digital Vout signal. The processing module 140 communicates a delay control signal 296 corresponding to amount of delay created by the lag in the circuitry. The delay control signal 296 further includes a magnitude scale signal corresponding to an amount the magnitude of the digital TX signal 92 needs to be scaled to match the magnitude of the transmit component of the digital Vout signal. The digital TX signal 92 is delayed and magnitude adjusted in accordance with the delay control signal 296 to produce a delayed digital TX signal 298.

The summing circuit 292 receives the digital Vout signal from the ADC 102 and subtracts the delayed digital TX signal 298 from the digital Vout signal to produce a digital delayed $V_{noise}$ signal. The digital delayed $V_{noise}$ signal corresponds to the digital delayed $I_{noise}$ component of digital Vout signal. The digital delayed $V_{noise}$ signal is provided to the DAC 295 where the DAC 295 converts the digital delayed $V_{noise}$ signal to an analog delayed $V_{noise}$ signal. The analog delayed $V_{noise}$ signal is provided to the inverting op-amp 101.

The output of the inverting op-amp 101 is an inverted delayed $V_{noise}$ signal (–delayed $V_{noise}$). The –delayed $V_{noise}$ signal generates a –delayed $I_{noise}$ signal to drive the audible in/out transducer 32-2 and cancel the noise signal heard by the ear.

Figure 23:
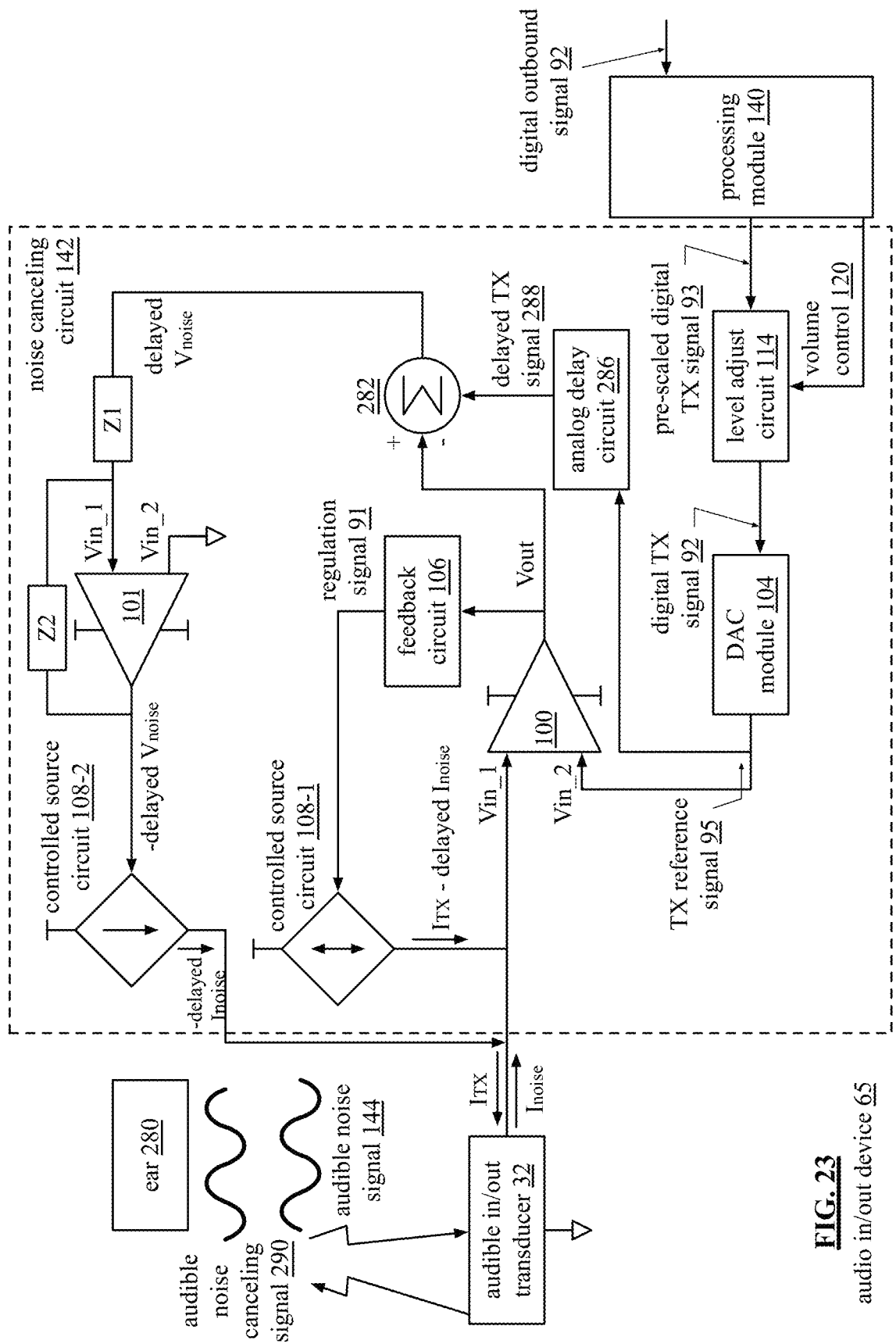
FIG. 23 is a schematic block diagram of another embodiment of an audio in/out device as a noise canceling speaker system in accordance with the present invention.

FIG. 23 is a schematic block diagram of an embodiment of an audio in/out device 65 as a noise canceling speaker system that includes an audible in/out transducer 32, a noise canceling circuit 142, and a processing module 140. FIG. 23 operates similarly to FIG. 21 except that an additional controlled source circuit is used so that only one audible in/out transducer 32 is needed to cancel the acoustic noise and the noise on the line.

The noise canceling circuit 142 includes a non-inverting operational amplifier (op-amp) 100, a digital to analog converter (DAC) module 104, a feedback circuit 106, controlled source circuits 108-1 and 108-2, a level adjust circuit 114, an analog delay circuit 286, a summing circuit 282, and an inverting op-amp 101

In an example of operation, the processing module 140 receives a digital outbound signal 92. The digital outbound signal 92 is an audio file for output to the audible in/out transducer 32. The processing module 140 formats the digital outbound signal 92 from a particular audio format into a desired digital signal for processing by the noise canceling circuit 142.

The processing module 140 pre-scales the desired digital signal to produce a pre-scaled digital TX signal 93. Pre-scaling reduces a high frequency signal to a lower frequency by integer division. The processing module 140 is further operable to communicate a volume control signal 120 to the level adjust circuit 114. The level adjust circuit 114 adjusts the magnitude of the pre-scaled digital TX signal 93 in accordance with the volume control signal 120 to produce a digital TX signal 92 at a desired volume level.

The digital TX signal 92 is provided to the DAC module 104 where the DAC module 104 produces a TX reference signal 95. The TX reference signal 95 is provided to the analog delay circuit 286 and an input of the non-inverting op-amp 100.

The audible in/out transducer 32 is affected by an audible noise signal 144 that changes the electrical characteristics of the audible in/out transducer 32 which produces a noise (current) signal $I_{noise}$. When the audible in/out transducer 32 is both generating the noise (current) signal $I_{noise}$ and transmitting a transmit (current) signal $I_{TX}$, the voltage of the audible in/out transducer 32 created as a result of transmit signal $I_{TX}$ is affected by the noise signal $I_{noise}$.

The non-inverting op-amp 100 compares the voltage of the audible in/out transducer 32 with the TX reference signal 95 to produce an analog comparison signal (Vout). The Vout signal includes a representation of the noise signal $I_{noise}$ and the transmit signal $I_{TX}$. Transmitting the TX reference signal 95 through the circuitry of the noise canceling circuit 142 results in a transmit signal $I_{TX}$ delay proportional to the bandwidth of the noise canceling circuit 142 loop.

The feedback circuit 106 generates a regulation signal 91 based on the Vout signal and provides the regulation signal 91 to the controlled source circuit 108-1. The controlled source circuit 108-1 adjusts generation of its output based on the regulation signal 91 to keep the inputs of the op-amp 100 substantially matching. For example, based on the regulation signal 91, the controlled source circuit 108 outputs a signal $I_{TX}$–delayed $I_{noise}$ to substantially remove the effect of the noise signal $I_{noise}$ on the transmit signal $I_{TX}$.

The processing module 140 communicates a delay control signal 284 corresponding to amount of delay created by the lag in the circuitry. The delay control signal 284 further includes a magnitude scale signal corresponding to an amount the magnitude of the TX reference signal 95 needs to be scaled to match the magnitude of the transmit component of the Vout signal. The TX reference signal 95 is delayed and magnitude adjusted in accordance with the delay control signal 284 to produce a delayed analog TX signal 288.

The summing circuit 282 receives the Vout signal from the non-inverting op-amp 100 and subtracts the delayed TX signal 288 from the Vout signal to produce a delayed $V_{noise}$ signal. The delayed $V_{noise}$ signal corresponds to the delayed $I_{noise}$ component of Vout. The delayed $V_{noise}$ signal is provided to the inverting op-amp 101. The impedances Z1 and Z2 of the inverting op-amp are set such that the inverting op-amp 101 has a unity gain.

The inverting op-amp 101 inverts the delayed $V_{noise}$ signal and outputs a –delayed $V_{noise}$ signal. The output is provided to the controlled source circuit 108-2. The controlled source circuit 108-2 is a voltage controlled current source that adjusts generation of its current output based on the –delayed $V_{noise}$ signal. For example, based on the –delayed $V_{noise}$ signal, the controlled source circuit 108 outputs a –delayed $I_{noise}$ signal.

The controlled source circuit 108-2 injects the –delayed $I_{noise}$ signal onto the transmit/receive line of the audible in/out transducer 32. The electrical characteristics of the audible in/out transducer 32-2 change based on the –delayed $I_{noise}$ signal causing it to emit the audible noise canceling signal 290. The audible noise canceling signal 290 substantially eliminates the audible noise signal 144 heard by the ear 280.

Figure 24:
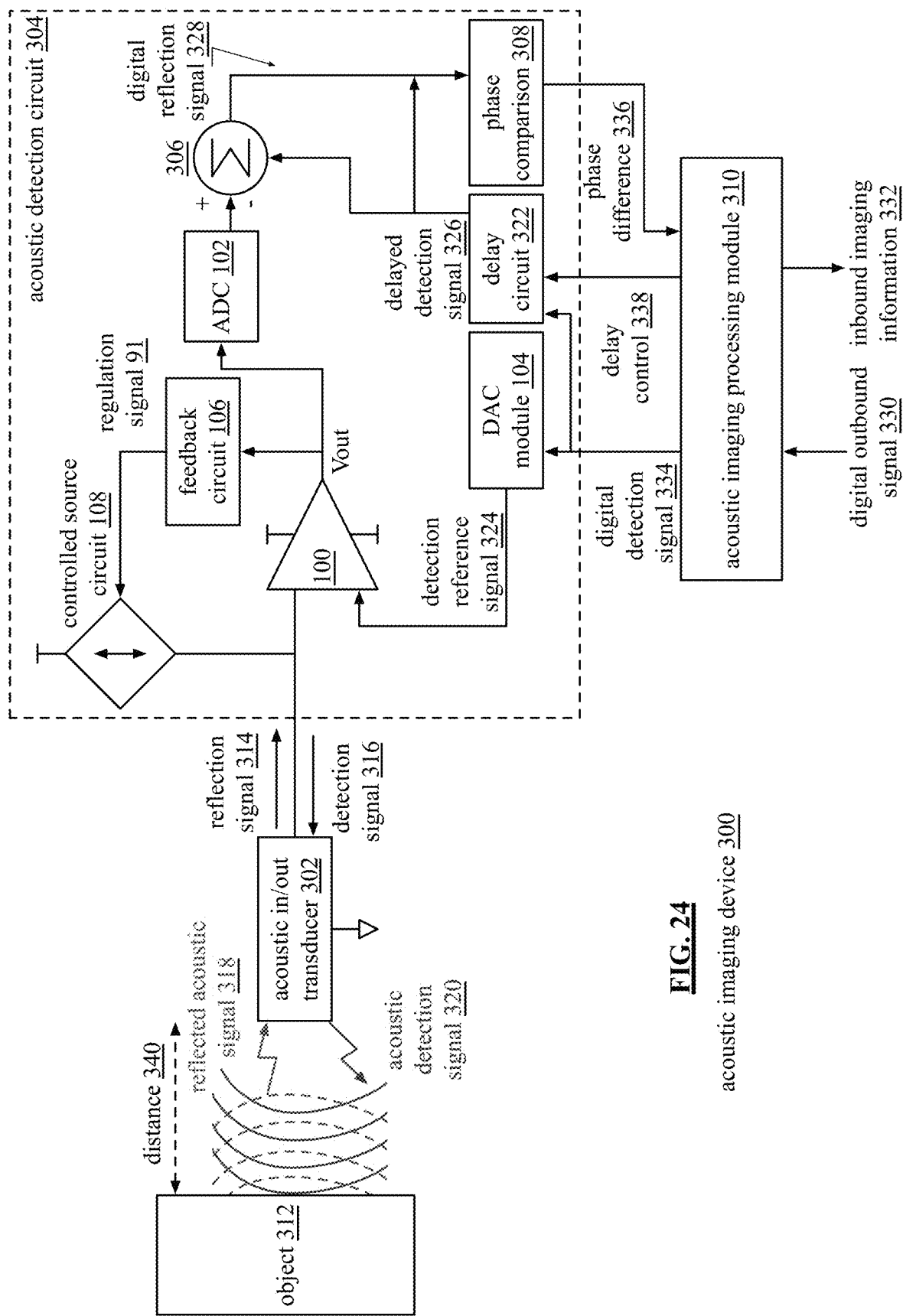
FIG. 24 is a schematic block diagram of an embodiment of an acoustic imaging device in accordance with the present invention.

FIG. 24 is a schematic block diagram of an embodiment of an acoustic imaging device 300 that includes an acoustic in/out transducer 302, an acoustic detection circuit 304, and an acoustic imaging processing module 310. The acoustic in/out transducer 302 operates similarly to the audible in/out transducer of previous Figures in that it functions to convert sound to and from an electrical signal. However, the acoustic in/out transducer 302 is affected by high frequency sound waves used for object 312 detection and measurement that are typically out of the human audible range (e.g., greater than 20 kHz). For example, the acoustic in/out transducer 302 is an ultrasonic piezoelectric transducer that is capable of generating and receiving ultrasonic signals.

The acoustic detection circuit 304 includes a non-inverting operational amplifier (op-amp) 100, an analog to digital converter (ADC) 102, a digital to analog converter (DAC) module 104, a feedback circuit 106, a delay circuit 322, a phase comparison circuit 308, and a controlled source circuit 108.

The ADC may be implemented in a variety of ways. For example, the (ADC) is one of: a flash ADC, a successive approximation ADC, a ramp-compare ADC, a Wilkinson ADC, an integrating ADC, a delta encoded ADC, and/or a sigma-delta ADC of adequate resolution (e.g., 8-bit, 16-bit, 32-bit, etc.). The DAC module 104 includes a DAC. The DAC may be implemented in a variety of ways. For example, the DAC is one of: a sigma-delta DAC, a pulse width modulator DAC, a binary weighted DAC, a successive approximation DAC, and/or a thermometer-coded DAC of desired resolution (e.g., 8-bit, 16-bit, 32-bit, etc.). The delay circuit 322 may be implemented using a timer circuit (e.g., a digital timer circuit using flip flops). The phase comparison circuit 308 may be implemented with a XOR phase detector, an edge triggered JK flip flop phase frequency detector, a dual D-Type phase detector circuit, etc.

The controlled source circuit 108 may be implemented in a variety of ways. For example, the controlled source circuit 108 is a current mirror circuit sourced via a DC input voltage to produce a detection transmit signal based on a regulation signal generated at the output of the op-amp 100. As another example, the controlled source circuit 108 is a current controlled current source or a voltage controlled current source. As yet another example, the controlled source circuit 108 is a bidirectional dependent voltage source circuit or a bidirectional dependent current source circuit (e.g., Howland current pump circuit that produces a voltage controlled current and requires one op-amp and multiple resistors).

In an example of operation, the acoustic processing module 310 formats a digital outbound signal 92 into a desired digital detection signal 334 for output by the acoustic detection circuit 304. For example, the acoustic processing module 310 is operable to implement a variety of digital signal processing techniques such as up-sampling, down-sampling, digital filtering, encoding/decoding, and compression/decompression to produce a desired digital detection signal 334.

The digital detection signal 334 is provided to the DAC module 104 where the DAC module 104 produces a detection reference signal 324. The digital detection signal 334 is also provided to the delay circuit 322. The detection reference signal 324 is a voltage reference signal having an oscillating component and a DC (direct current) component. For example, the detection reference signal 324 is a high frequency ultrasound pulse signal. The acoustic in/out transducer 302 voltage as measured at the op-amp 100 input will have a substantially matching DC component and oscillating component as the detection reference signal 324. The DAC module 104 operates similarly to the example discussed with reference to FIGS. 6-7.

The op-amp 100 compares the voltage of the acoustic in/out transducer 302 with the detection reference signal 324 to produce an analog comparison signal (Vout). The Vout signal includes a representation of the current signals on the transmit/receive line. Transmitting the detection reference signal 324 through the circuitry of the acoustic detection circuit 304 results in a detection signal delay proportional to the bandwidth of the acoustic detection circuit 304 loop.

The feedback circuit 106 generates a regulation signal 91 based on the Vout signal and provides the regulation signal 91 to the controlled source circuit 108. The regulation signal 91 may be the Vout signal (e.g., when the feedback circuit is a wire) or a processed version of the Vout signal depending on the components of the feedback circuit 106 and input requirements of the controlled source circuit 108.

The controlled source circuit 108 adjusts generation of its output based on the regulation signal 91 to keep the inputs of the op-amp 100 substantially matching. For example, before a reflection signal is received, the controlled source circuit 108 outputs a detection signal 316 to the acoustic in/out transducer 302. The detection signal 316 changes the electrical characteristics of the acoustic in/out transducer 302 such that the acoustic in/out transducer 302 outputs an acoustic detection signal 320. The acoustic detection signal 320 is reflected off of an object 312 (e.g., the ocean floor, an internal organ, etc.) to produce a reflected acoustic signal 318.

After a time delay, the acoustic in/out transducer 302 receives the reflected acoustic signal 318. The reflected acoustic signal 318 changes the electrical characteristics of the acoustic in/out transducer 302 such that it generates a reflection signal 314. Typically, a reflected ultrasound wave loses strength and requires amplification upon input to be sensed. However, with the acoustic detection circuit 304, very low receive signals can be detected due to the high I-to-V gain of the acoustic detection circuit 304 loop such that input amplification is not needed.

The op-amp 100 compares the voltage of the acoustic in/out transducer 302 (now affected by the reflection signal 314) with the detection reference signal 324 to produce an analog comparison signal (Vout). For a non-inverting op-amp with unity gain, Vout is equal to the current on the acoustic in/out transducer 302 (e.g., a combination of the detection signal 316 and the reflection signal 314) multiplied by an I-to-V loop gain.

The I-to-V loop gain is the ratio of how much the voltage output changes as a result of a current change on the acoustic in/out transducer 302. The I-to-V loop gain is very high which allows for very small current changes (e.g., microamp differences) to be detected. As such, the Vout signal follows the current on the acoustic in/out transducer 302 and includes a representation of the delayed detection signal 316 and the reflection signal 314. The controlled source circuit 108 adjusts generation of its output based on the regulation signal 91 to keep the inputs of the op-amp 100 substantially matching (e.g., to remove the effect of the reflection signal 314 on the transmit/receive line).

The ADC 102 converts the Vout signal to a digital Vout signal. The acoustic imaging processing module 310 communicates a delay control signal 338 corresponding to amount of delay created by the lag in the circuitry (e.g., 1 microsecond). The delay control signal 338 further includes a magnitude scale signal corresponding to an amount the magnitude of the digital detection signal 334 needs to be scaled to match the magnitude of the transmit component of the digital Vout signal. The digital detection signal 334 is delayed and magnitude adjusted in accordance with the delay control signal 338 to produce a delayed detection signal 326.

The summing circuit 306 subtracts the delayed detection signal 326 from the digital Vout signal to produce a digital reflection signal 328 representative of the reflected acoustic signal received by the acoustic in/out transducer 302. The delayed detection signal 326 and the digital reflection signal 328 are provided to the phase comparison circuit 308. The phase comparison circuit 308 generates a phase difference 336 signal representative of the phase difference between the delayed detection signal 326 (the detection signal transmitted) and the digital reflection signal 328 (the reflected version of the detection signal received).

The acoustic imaging processing module 310 is operable to determine a time delay between sending the detection signal and receiving the reflection signal based off of the phase difference 336 signal. For example, the time delay between two waveforms having the same frequency can be calculated using the equation $\varnothing=360°*f*\Delta t$, where $\varnothing$ is the phase angle difference in degrees, f is the system frequency, and $\Delta t$ is the time delay between the two waveforms. The acoustic imaging processing module 310 is further operable to determine a distance measurement from the calculated time delay using the equation $d=\frac{1}{2} vt$ where d is the distance to object 312, t is the time delay, and v is the speed of sound.

The distance measurement is halved because the time delay accounts for a round trip distance measurement but only a one-way distance measurement is needed. The speed of sound will vary based on the medium in which the acoustic waves are traveling. For example, the speed of sound travels faster in water than air (e.g., at about 1500 meters per second through water and at about 343 meters per second through air). Temperature of the medium also affects the speed of sound (e.g., sound travels faster in higher temperatures). Therefore, the acoustic imaging processing module 310 requires information (e.g., via user input, lookup table, default setting, etc.) pertaining to the medium the sound waves are traveling through in order to calculate accurate distance measurements.

The distance measurement is used to generate inbound imaging information 332. For example, a scanning process is used (e.g., the acoustic in/out transducer 302 moves across the object 312) to generate a plurality of distance measurements. The acoustic imaging processing module 310 converts the plurality of distance measurements into imaging information using known image processing techniques. Alternatively, the acoustic imaging processing module 310 outputs the plurality of distance measurements to another processing module and the other processing module generates imaging information. The inbound imaging information may be provided to a video graphics processing module for output to a display. When multiple acoustic in/out transducers are used, many distance measurements at different perspectives can be acquired to generate a 3D mapping of a detected object.

Figure 25:
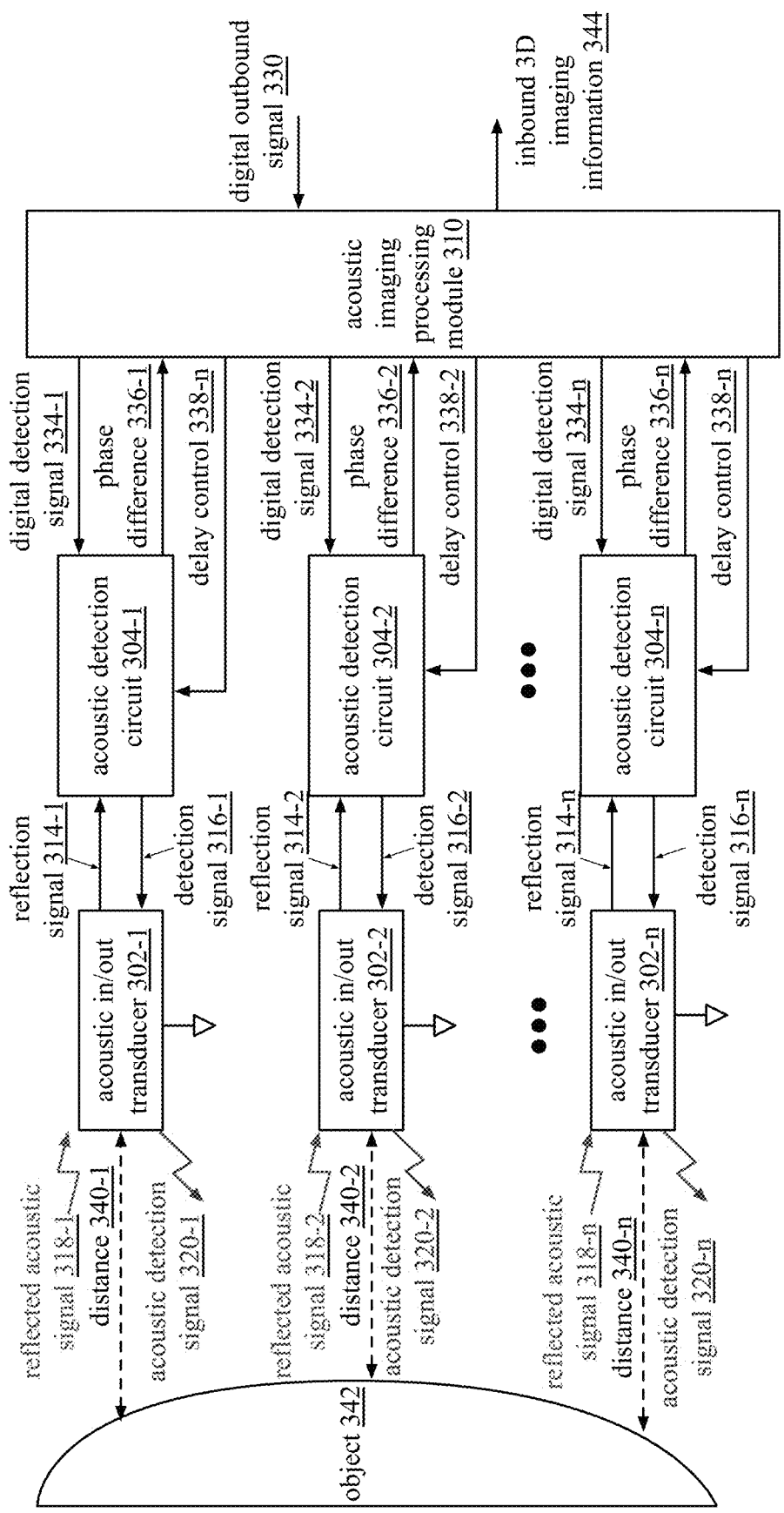
FIG. 25 is a schematic block diagram of another embodiment of an acoustic imaging device in accordance with the present invention.

FIG. 25 is a schematic block diagram of another embodiment of an acoustic imaging device 300 that includes a plurality of acoustic in/out transducers 302-1 through 302-n, a plurality of acoustic detection circuits 304-1 through 304-n, and an acoustic imaging processing module 310. FIG. 25 operates similarly to FIG. 24 except that a plurality of acoustic in/out transducers 302-1 through 302-n are used such that the acoustic imaging processing module 310 is operable to produce inbound 3D imaging information 344 through the use of a plurality of distance measurements. For example, the acoustic imaging processing module 310 receives the plurality of phase difference 336-1 through 338-n and generates the inbound 3D imaging information 344 using known image processing techniques.

Figure 26:
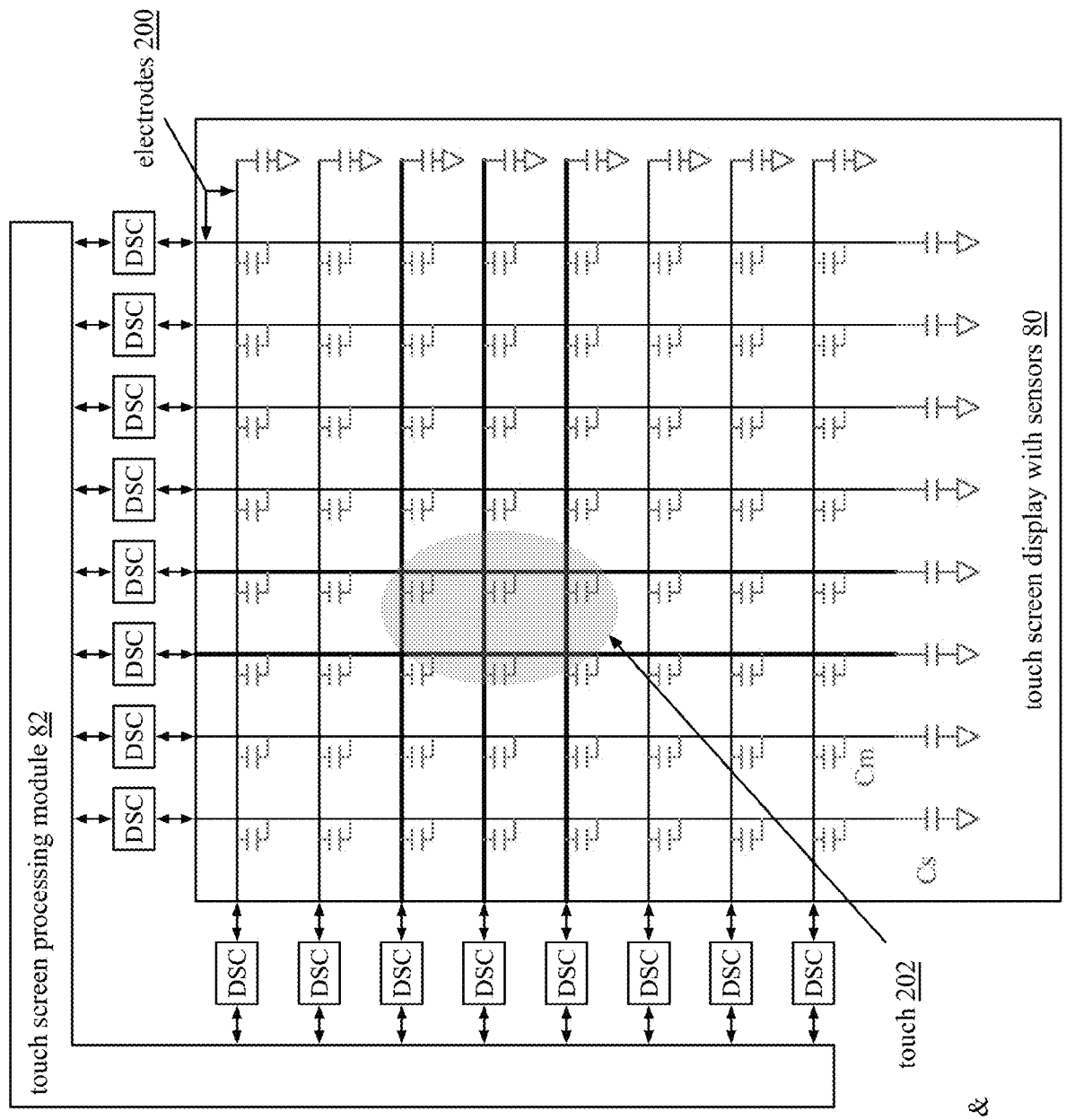
FIG. 26 is a schematic block diagram of an embodiment of a touch screen with sensors and drive sense circuits (DSC) in accordance with the present invention.

FIG. 26 is a schematic block diagram of a touch screen with sensors and drive-sense circuits (DSC) 16 that includes a plurality of drive-sense circuits (DSC), a touch screen processing module 82, and a touch screen display with sensors 80. The touch screen display with sensors 80 may be part of an interactive display, or other device that includes a touch screen display. An interactive display functions to provide users with an interactive experience (e.g., touch the screen to obtain information, be entertained, etc.). For example, a store provides interactive displays for customers to find certain products, to obtain coupons, to enter contests, etc.

There are a variety of other devices that include a touch screen display. For example, a vending machine includes a touch screen display to select and/or pay for an item. As another example of a device having a touch screen display is an Automated Teller Machine (ATM). As yet another example, an automobile includes a touch screen display for entertainment media control, navigation, climate control, etc.

The touch screen display with sensors 80 may include a large display that has a resolution equal to or greater than full high-definition (HD), an aspect ratio of a set of aspect ratios, and a screen size equal to or greater than thirty-two inches. The following table lists various combinations of resolution, aspect ratio, and screen size for the display, but it is not an exhaustive list.

| Resolution | Width (lines) | Height (lines) | pixel aspect ratio | screen aspect ratio | screen size (inches) |
|---|---|---|---|---|---|
| HD (high definition) | 1280 | 720 | 1:1 | 16:9 | 32, 40, 43, 50, 55, 60, 65, 70, 75, &/or >80 |
| Full HD | 1920 | 1080 | 1:1 | 16:9 | 32, 40, 43, 50, 55, 60, 65, 70, 75, &/or >80 |
| HD | 960 | 720 | 4:3 | 16:9 | 32, 40, 43, 50, 55, 60, 65, 70, 75, &/or >80 |
| HD | 1440 | 1080 | 4:3 | 16:9 | 32, 40, 43, 50, 55, 60, 65, |

-continued

| Resolution | Width (lines) | Height (lines) | pixel aspect ratio | screen aspect ratio | screen size (inches) |
|---|---|---|---|---|---|
| HD | 1280 | 1080 | 3:2 | 16:9 | 70, 75, &/or >80<br>32, 40, 43, 50, 55, 60, 65, 70, 75, &/or >80 |
| QHD (quad HD) | 2560 | 1440 | 1:1 | 16:9 | 32, 40, 43, 50, 55, 60, 65, 70, 75, &/or >80 |
| UHD (Ultra HD) or 4K | 3840 | 2160 | 1:1 | 16:9 | 32, 40, 43, 50, 55, 60, 65, 70, 75, &/or >80 |
| 8K | 7680 | 4320 | 1:1 | 16:9 | 32, 40, 43, 50, 55, 60, 65, 70, 75, &/or >80 |
| HD and above | 1280->=7680 | 720->=4320 | 1:1, 2:3, ect. | 2:3 | 50, 55, 60, 65, 70, 75, &/or >80 |

The display is one of a variety of types of displays that is operable to render frames of data into visible images. For example, the display is one or more of: a light emitting diode (LED) display, an electroluminescent display (ELD), a plasma display panel (PDP), a liquid crystal display (LCD), an LCD high performance addressing (HPA) display, an LCD thin film transistor (TFT) display, an organic light emitting diode (OLED) display, a digital light processing (DLP) display, a surface conductive electron emitter (SED) display, a field emission display (FED), a laser TV display, a carbon nanotubes display, a quantum dot display, an interferometric modulator display (IMOD), and a digital microshutter display (DMS). The display is active in a full display mode or a multiplexed display mode (i.e., only part of the display is active at a time).

The display further includes integrated electrodes 200 that provide the sensors for the touch sense part of the touch screen display. The electrodes 200 are distributed throughout the display area or where touch screen functionality is desired. For example, a first group of the electrodes are arranged in rows and a second group of electrodes are arranged in columns. For example, the row electrodes are separated from the column electrodes by a dielectric material.

The electrodes 200 are comprised of a transparent conductive material and are in-cell or on-cell with respect to layers of the display. For example, a conductive trace is placed in-cell or on-cell of a layer of the touch screen display. The transparent conductive material, which is substantially transparent and has negligible effect on video quality of the display with respect to the human eye. For instance, an electrode is constructed from one or more of: Indium Tin Oxide, Graphene, Carbon Nanotubes, Thin Metal Films, Silver Nanowires Hybrid Materials, Aluminum-doped Zinc Oxide (AZO), Amorphous Indium-Zinc Oxide, Gallium-doped Zinc Oxide (GZO), and poly polystyrene sulfonate (PEDOT).

Each electrode 200 has a self-capacitance (Cs), which corresponds to a parasitic capacitance created by the electrode with respect to other conductors in the display (e.g., ground, conductive layer(s), and/or one or more other electrodes). Note that each electrode includes a resistance component and, as such, produces a distributed R-C circuit. The longer the electrode, the greater the impedance of the distributed R-C circuit. For simplicity of illustration the distributed R-C circuit of an electrode will be represented as a single parasitic capacitance. In addition to self-capacitance, a mutual capacitance (Cm) exists between a row and column electrode.

In an example of operation, the touch screen display with sensors 80 receives frames of video (e.g., frames of a video file, refresh rate for a word processing document, a series of images, etc.) from a processing module (e.g., the video graphics processing module 48 of FIG. 3B). The touch screen display with sensors 80 renders the frames of video into visible images.

While the touch screen display with sensors 80 is rendering the frames of video into visible images, the drive-sense circuits (DSC) provide sensor signals to the electrodes 200. When the screen is touched (e.g., touch 202), capacitance of the electrodes 200 proximal to the touch 202 (i.e., directly or close by) is changed. In essence, a finger touch creates a parallel capacitance with the parasitic self-capacitances. For example, during a touch, the self-capacitance of an electrode 200 is $C_s$ (self capacitance)+$C_{f1}$ (finger capacitance). As such, a touch increases the self-capacitance of the affected electrodes, which decreases the impedance for a given frequency (based on $\frac{1}{2\pi fC}$).

A finger capacitance is effectively in series with the mutual capacitance (Cm), which decreases capacitance of the mutual capacitance. As such, a touch decreases the mutual capacitance of the affected electrodes, which increases the impedance for a given frequency (based on based on $\frac{1}{2\pi fC}$).

The DSCs detect the changes in impedance of the self-capacitance and mutual capacitance and provide the detected changes to the touch screen processing module 82. The touch screen processing module 82 processes the capacitance changes of the affected electrodes to determine one or more specific locations of touch and may provide this information to another processing module (e.g., processing module 42 of FIG. 3B). The processing module 42 processes the one or more specific locations of touch to determine if an operation of the application is to be altered. For example, the touch is indicative of a pause command, a fast forward command, a reverse command, an increase volume command, a decrease volume command, a stop command, a select command, a delete command, etc.

Figure 27:
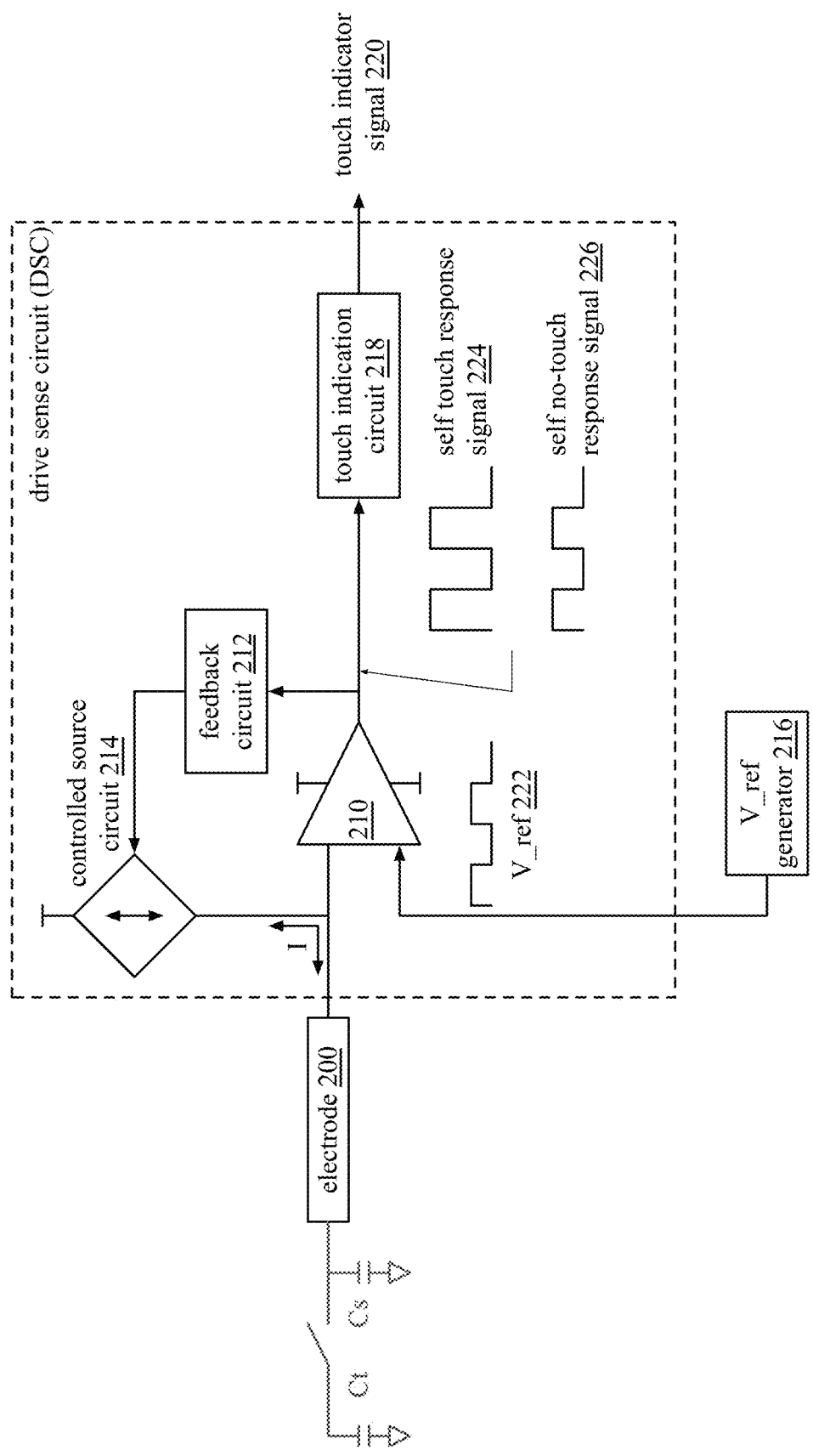
FIG. 27 is a schematic block diagram of an embodiment of a drive-sense circuit (DSC) coupled to an electrode and a voltage reference generator in accordance with the present invention.

FIG. 27 is a schematic block diagram of an embodiment of a drive-sense circuit (DSC) coupled to an electrode 200 and a voltage reference (V_ref) generator 216. The DSC includes a non-inverting operational amplifier (op-amp) 210, a feedback circuit 212, a controlled source circuit 214, and a touch indication circuit 218. In another embodiment, the V_ref generator 216 is included in the DSC. In another embodiment, the touch indication circuit 218 is external to the DSC.

The controlled source circuit 214 may be implemented in a variety of ways. For example, the controlled source circuit 214 is a current mirror circuit sourced via a DC input voltage to produce a drive signal based on a regulation signal generated at the output of the op-amp 210. As another example, the controlled source circuit 214 is a current controlled current source or a voltage controlled current source. As yet another example, the controlled source circuit 214 is a bidirectional dependent current source circuit (e.g., Howland current pump circuit that produces a voltage controlled current and requires one op-amp and multiple resistors).

The feedback circuit 212 may be implemented with a controlled source regulation circuit, a biasing circuit, a wire, etc. The V_ref generator 216 may be implemented in a variety of ways. For example, the V_ref generator 216 includes a DC (direct current) voltage generator, an AC (alternating current) voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the voltage reference signal. Here, the V_ref 222 signal generated by the V_ref generator 216 is a square wave at a particular magnitude, phase, and frequency but could be another type of waveform.

In an example of operation, the controlled source circuit 214 provides a drive signal (e.g., a current signal (I)) to the electrode 200. The current (I) signal in combination with the impedance (Z) of the electrode creates an electrode voltage (V), where V=I*Z. As the impedance (Z) of electrode changes, the current (I) signal is adjusted to keep the electrode voltage (V) substantially unchanged (e.g., equal to the voltage reference signal).

When the electrode 200 is affected by a touch (e.g., demonstrated by the switch closing), touch capacitance (Ct) is in parallel with the self capacitance (Cs) of the electrode 200. Thus, the touch capacitance increases the self-capacitance of the electrode. A change in capacitance, changes the impedance of the electrode 200 and thus the electrode voltage. For example, an increase in self capacitance decreases the impedance of the electrode 200 and thus decreases the electrode voltage.

Each DSC in the touch screen display is operable to detect the self-capacitance of its corresponding electrode. For example, each DSC using the same V_ref (e.g., a low voltage sinusoid at the same frequency) to measure self capacitance of each electrode. However, because mutual capacitance is between a column and a row electrode, a set of DSCs are used to detect mutual capacitance (e.g., a row DSC emits a mutual capacitance signal and a column DSC detects mutual capacitance of its corresponding column electrode). An example of detecting mutual capacitance and self capacitance is discussed with reference to FIG. 28.

The electrode 200 voltage signal at the input of the op-amp 210 will have a substantially matching DC component and oscillating component as the V_ref 222 signal. The op-amp 210 compares the electrode 200 voltage and the voltage reference signal (V_ref 222) to produce a comparison signal. The comparison signal is representative of an amount the drive signal (I) needs to be adjusted so that the electrode voltage matches the V_ref 222 signal. When a touch is detected, the amount the drive signal (I) needs to be adjusted to match the V_ref 222 signal is representative of the amount the electrode 200 impedance changed due to the touch. For example, with electrode voltage decreasing due to a touch, the drive signal (I) needs to be increased.

As such, the comparison signal includes a representation of the self capacitance change of the electrode. The exact change in electrode self capacitance does not need to be measured to determine if a touch has occurred. For example, the comparison signal can be compared to a known magnitude indicative of a touch. When the comparison signal is at or above the known level, the comparison signal is a self-touch response signal 224 and when the self capacitance is below the known level, the comparison signal is a self no-touch response signal 226. The self-touch response signal 224 has a higher magnitude than the self no-touch response signal 226.

The feedback circuit 212 generates a regulated signal based on the comparison signal and provides the regulated signal to the controlled source circuit 214. The regulated signal may simply be the comparison signal (e.g., when the feedback circuit is a wire) or a processed version of the comparison signal depending on the components of the feedback circuit 212. The controlled source circuit 214 adjusts generation of the drive signal I based on the regulated signal to keep the inputs of the op-amp 210 substantially matching.

The comparison signal (e.g., either the self-touch response signal 224 or self no-touch response signal 226) is provided to the touch indication circuit 218 (e.g., a processing module) where the touch indication circuit 218 determines whether the comparison signal is indicative of a touch or a no touch. The touch indication circuit 218 outputs a touch indicator signal 220 to indicate whether a touch has been detected. For example, the touch indicator signal 220 is a digital output at a logic 1 when a touch is detected and a digital output at a logic 0 when a touch is not detected. The touch indication circuit 218 is discussed in more detail with reference to FIGS. 29-30.

Figure 28:
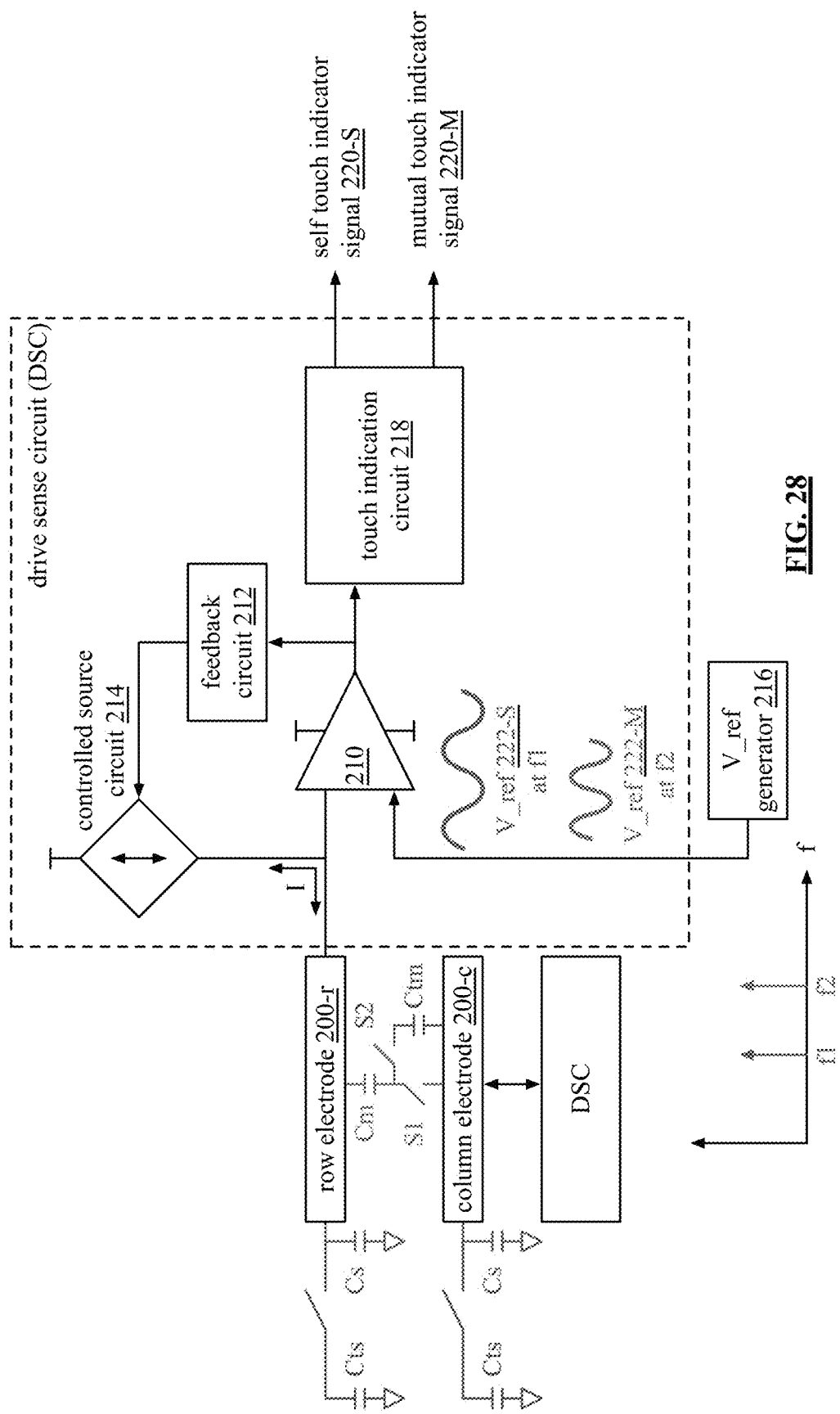
FIG. 28 is a schematic block diagram of an embodiment of a drive-sense circuit (DSC) coupled to a row electrode and a voltage reference generator in accordance with the present invention.

FIG. 28 is a schematic block diagram of an embodiment of a drive-sense circuit (DSC) coupled to a row electrode 200-$r$ and a voltage reference (V_ref) generator 216. FIG. 28 operates similarly to FIG. 27 except that mutual capacitance and self-capacitance of a row electrode 200-$r$ are detected. The DSC includes a non-inverting operational amplifier (op-amp) 210, a feedback circuit 212, a controlled source circuit 214, and a touch indication circuit 218. An additional DSC is shown connected to a column electrode 200-$c$. A mutual capacitance (Cm) exists between the row electrode 200-$r$ and the column electrode 200-$c$.

When there is no touch, switch S1 between the row and column electrodes is closed to indicate that the mutual capacitance is at a value Cm. When the row electrode 200-$r$ is affected by a touch (e.g., demonstrated by the self capacitance switch closing, the switch S1 opening, and the switch S2 closing), the touch capacitance (Cts) is in parallel with the self-capacitance of the electrode 200 (Cs) such that the self-capacitance of the electrode increases. Further, the touch capacitance (Ctm) is in series with the mutual-capacitance (Cm) such that the mutual capacitance of the row electrode 200-$r$ decreases.

A change in capacitance, changes the impedance of the electrode 200 and thus the electrode voltage. A touch increases the self capacitance of the affected electrodes, which decreases the impedance for a given frequency (based on based on $\frac{1}{2\pi f C}$). A touch decreases the mutual capacitance of the affected electrodes, which increases the impedance for a given frequency (based on based on $\frac{1}{2\pi f C}$).

To detect changes to the self and mutual capacitances concurrently, the V_ref generator 216 generates a voltage reference signal V_ref 222-S with an oscillating component at frequency f1 to measure impedance of self-capacitance and a voltage reference signal V-ref 222-M with an oscillating component at frequency f2 for measuring impedance of mutual-capacitance. The voltage reference signal V_ref 222-S at f1 and V-ref 222-M at f2 each include a DC component. The oscillating components at frequencies f1 and f2 are shown in the frequency domain as pure tones.

While each DSC can use the same frequency to measure self capacitance of its corresponding electrode, a different frequency must be used for every mutual capacitance measurement. Further, mutual capacitance is measured/detected by a set of DSCs corresponding to a column electrode and a row electrode. For example, one DSC (e.g., the DSC connected to the column electrode 200-$c$) drives a mutual capacitance frequency signal and another DSC (e.g., the DSC connected to the row electrode 200-$r$) measures the mutual capacitance.

In an example of operation, the op-amp 210 compares the row electrode 200-$r$ voltage with the concurrent voltage reference signals V_ref 222-S at f1 and V-ref 222-M at f2 to produce an analog comparison signal having frequency components at f1 and f2.

The impedance of the self-capacitance at f1 of the electrode 200 includes the effect of the finger/touch capacitance (Cts). As such, the impedance of the self-capacitance of the electrode equals $1/(2\pi f_1 *(Cs+Cts))$, which is included in the analog comparison signal. The second frequency component at f2 corresponds to the impedance of the mutual-capacitance at f2, which includes the effect of the finger/touch capacitance. As such, the impedance of the mutual capacitance equals $1/(2\pi f_2 Cm\_1)$, where Cm_1=(Cm*Ctm)/(Cm+Ctm), which is included in the analog comparison signal.

When a touch is detected, the amount the drive signal (I) needs to be adjusted to match the V_ref 222-S at f1 and V-ref 222-M at f2 signal is representative of the amount the electrode 200 impedance changed due to the touch. For a self-capacitance increase due to touch, the drive signal (I) needs to be increased to keep the inputs of the op-amp matching. For a mutual-capacitance decrease due to touch, the drive signal (I) needs to be decreased to keep the inputs of the op-amp matching.

The feedback circuit 212 generates a regulated signal based on the comparison signal and provides the regulated signal to the controlled source circuit 214. The regulated signal may simply be the comparison signal (e.g., when the feedback circuit is a wire) or a processed version of the comparison signal depending on the components of the feedback circuit 212. The controlled source circuit 214 adjusts generation of the drive signal I based on the regulated signal to keep the inputs of the op-amp 210 substantially matching.

The comparison signal is provided to the touch indication circuit 218 (e.g., a processing module) where the touch indication circuit 218 determines a magnitude corresponding to the self capacitance frequency component of the analog comparison signal and a magnitude corresponding to the mutual capacitance frequency component of the analog comparison signal. The touch indication circuit 218 determines whether the magnitudes are indicative of a touch or a no touch.

The touch indication circuit 218 outputs a self touch indicator signal 220-S indicating whether the self capacitance measurement is indicative of a touch and a mutual touch indicator signal 220-M indicating whether the mutual capacitance measurement is indicative of a touch. For example, the self touch indicator signal 220-S and mutual touch indicator signal 220-M are a digital output at a logic 1 when a touch is detected and a digital output at a logic 0 when a touch is not detected. The touch indication circuit 218 is discussed in more detail with reference to FIGS. 29-30.

Figure 29:
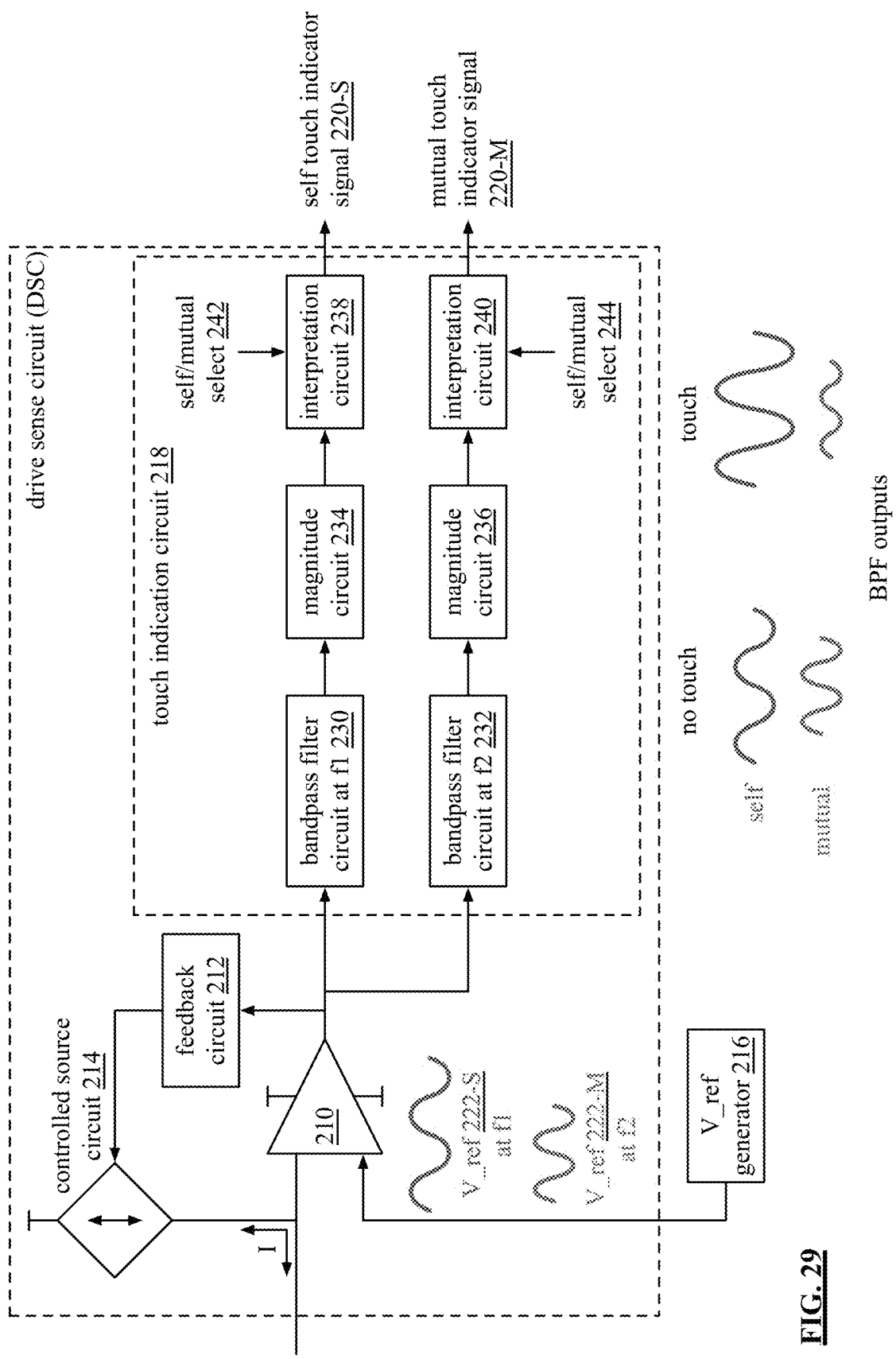
FIG. 29 is a schematic block diagram of another embodiment of a drive-sense circuit (DSC) coupled to an electrode and a voltage reference generator in accordance with the present invention.

FIG. 29 is a schematic block diagram of an embodiment of a drive-sense circuit (DSC) of FIG. 28 coupled to a voltage reference (V_ref) generator 216 and an electrode (not shown). The DSC includes a non-inverting operational amplifier (op-amp) 210, a feedback circuit 212, a controlled source circuit 214, and a touch indication circuit 218. In another embodiment, the V_ref generator 216 is included in the DSC. In another embodiment, the touch indication circuit 218 is external to the DSC.

FIG. 29 operates similarly to FIG. 28 except that the touch indication circuit 218 is shown in more detail. The touch indication circuit 218 includes a bandpass filter circuit at frequency f1 230, a bandpass filter circuit at frequency f2 232, magnitude circuits 234-246, and interpretation circuits 238-240.

In an example of operation, when the electrode 200 is affected by a touch, the touch has an effect on the self-capacitance of the electrode 200 and an effect on the mutual capacitance of the electrode 200. A change in capacitance, changes the impedance of the electrode 200 and thus the electrode voltage.

The op-amp 210 compares the electrode 200 voltage and the concurrent voltage reference signals V_ref 222-S at f1 and V_ref 222-M at f2 to produce an analog comparison signal with frequency components at f1 and f2. The analog comparison signal is representative of the amount the drive signal (I) needs to be adjusted so that the electrode voltage matches the voltage reference signals V_ref 222-S at f1 and V_ref 222-M at f2. The amount the drive signal (I) needs to be adjusted to match the V_ref 222-S at f1 is representative of electrode self-capacitance. The amount the drive signal (I) needs to be adjusted to match the V_ref 222-M at f2 is representative of electrode mutual capacitance.

The feedback circuit 212 generates a regulated signal based on the analog comparison signal and provides the regulated signal to the controlled source circuit 214. The controlled source circuit 214 adjusts generation of the drive signal I based on the regulated signal to keep the inputs of the op-amp 210 substantially matching.

The analog comparison signal is provided to the bandpass filter circuit at f1 230 of the touch indication circuit 218 and the the bandpass filter circuit at f2 232 of the touch indication circuit 218. The bandpass filter circuits 230-232 are analog bandpass filters such as RLC (resistor-inductor-capacitor) circuits, a combination of low pass filters and high pass filters, etc. Analog bandpass filters process signals faster than digital bandpass filters.

The bandpass filter circuit at f1 230 passes (i.e., substantially unattenuated) signals in a bandpass region (e.g., tens of Hertz to hundreds of thousands of Hertz, or more) centered about frequency f1 and attenuates signals outside of the bandpass region. As such, the bandpass filter circuit at frequency f1 230 passes the portion of the analog comparison signal that corresponds to the self-capacitance of the electrode.

The bandpass filter circuit at f2 232 passes (i.e., substantially unattenuated) signals in a bandpass region (e.g., tens of Hertz to hundreds of thousands of Hertz, or more) centered about frequency f2 and attenuates signals outside of the bandpass region. As such, the bandpass filter circuit at frequency f2 232 passes the portion of the analog comparison signal that corresponds to the mutual-capacitance of the electrode.

The magnitude circuit 234 determines the magnitude of the self-capacitance signal and the magnitude circuit 236 determines the magnitude of the mutual capacitance signal. The interpretation circuits 238-240 receive a control signal (self/mutual select 242-244) to direct the interpretation circuits 238-240 as to whether it is interpreting a self or mutual capacitance signal. Based on the self/mutual select 242 control signal and the magnitude value received from the magnitude circuit 234, the interpretation circuit 238 generates a self-touch indicator signal 220-S. Based on the self/mutual select 244 and the magnitude received from the magnitude circuit 236, the interpretation circuit 240 generates a mutual touch indicator signal 220-M.

For example, a first magnitude value for self-capacitance is indicative of no touch and a second magnitude value for self-capacitance is indicative of a touch where the second magnitude is greater than the first magnitude. An another example, a first magnitude for mutual capacitance is indicative of no touch and a second magnitude for mutual capacitance is indicative of a touch where the first magnitude is greater than the second magnitude. The self-touch indicator signals 220-S and 220-M may be a digital output at a logic 1 when a touch is detected and each a digital output at a logic 0 when a touch is not detected.

The DSC may detect more than one mutual capacitance measurement. For each additional mutual capacitance measurement, an additional voltage reference signal at its own frequency is required and an additional stage in the touch indication circuit is required.

While bandpass filtering is easier with sinusoids, other waveforms may be used for the voltage reference signals. Depending on the waveform used, bandpass filter characteristics (e.g., bandwidth, slew rate, etc.) can be adjusted for proper filtering. Because analog filtering is used and a specific measurement of impedance change is not required to detect a touch, the DSC has a substantially reduced processing time and power in comparison with known or conventional capacitive touch detection.

Figure 30:
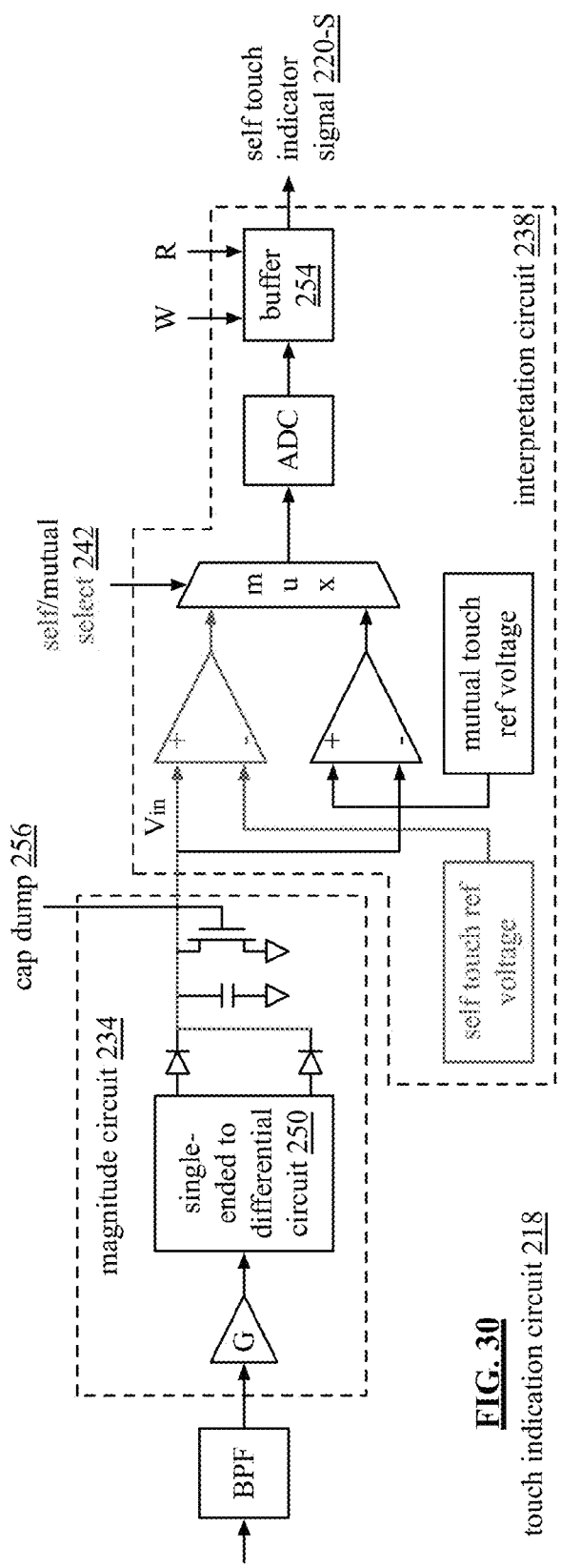
FIG. 30 is a schematic block diagram of an embodiment of a touch indication circuit in accordance with the present invention.

FIG. 30 is a schematic block diagram of an embodiment of a touch indication circuit 218 that includes a bandpass filter (BPF) circuit, a magnitude circuit 234, and an interpretation circuit 238. The magnitude circuit 234 includes a gain stage, a single ended to differential circuit 250, diodes, a capacitor, and a transistor (e.g., a metal-oxide-silicon (MOS) transistor). The interpretation circuit 238 includes a self-touch reference (ref) voltage, a mutual touch reference (ref) voltage, op-amps, a multiplexer (mux), an analog to digital converter (ADC), and a buffer 254.

In an example of operation, a bandpass filtered signal is provided to the gain stage of the magnitude circuit 234. In this example, the bandpass filtered signal includes self-capacitance information (e.g., the signal was filtered about frequency f1). The gain stage amplifies the bandpass filtered signal to a desired amount for input to the single ended to differential circuit 250.

The single ended to differential circuit 250 may be implemented with a differential operational amplifier (op-amp) having two outputs and where one input is provided a reference signal (e.g., ground). The single ended to differential circuit 250 creates a differential voltage at the output proportional to the single ended input voltage. As such, when the reference signal is set to ground, one output of the single ended to differential circuit 250 outputs a non-inverted representation of the single ended input voltage and the other output outputs an inverted representation of the single ended input voltage. For example, the top output of the single ended to differential circuit 250 outputs the non-inverted signal and the bottom of the output single ended to differential circuit 250 outputs the inverted signal.

During a positive cycle of the analog single ended input voltage signal (e.g., the amplified bandpass filtered signal), the non-inverted output is positive and the inverted output is negative. The top diode receiving the positive output is forward biased and "on" whereas the bottom diode receiving the negative output is reversed biased and "off." The current from the top output flows from the "on" diode and charges the capacitor.

During a negative cycle of the analog single ended input voltage signal (e.g., the amplified bandpass filtered signal), the non-inverted output is negative and the inverted output is positive. The bottom diode receiving the positive output is forward biased and "on" whereas the top diode receiving the negative output is reversed biased and "off" The current from the bottom output flows from the "on" diode and charges the capacitor. As the capacitor charges, a voltage is built across the capacitor.

The capacitor is discharged or dumped in accordance with the cap dump 256 signal. For example, the cap dump 256 signal is a signal that provides enough voltage to turn the transistor on. When the transistor is off, no current flows through the transistor and the voltage charged on the capacitor is passed to the op-amps. When the transistor is on, the capacitor discharges current to the transistor and no voltage flows to the op-amps. Therefore, the magnitude circuit 234 produces a rectified signal representative of the magnitude of the input signal as the capacitor is charged.

The output voltage signal from the magnitude circuit 234 (Vin) is provided to a non-inverting input of a first operational amplifier (op-amp) and to an inverting input of a second op-amp of the interpretation circuit 238. The first op-amp compares Vin with a self-touch reference (ref) voltage to produce a comparison signal. The second op-amp compares Vin with a mutual touch reference (ref) voltage to produce a comparison signal. The self-touch and mutual touch reference voltages may be default voltages or determined as discussed with reference to FIGS. 34A-35B. The self-touch reference voltage corresponds to a magnitude indicative of touch and the mutual touch reference voltage corresponds to a magnitude indicative of a no-touch.

The self touch comparison signal includes a comparison of Vin to the self touch ref voltage. For example, when Vin matches or exceeds the self touch ref voltage, the comparison signal is high, and when Vin is lower than the self touch ref voltage, the comparison signal is low. The mutual touch comparison signal includes an inverted comparison of Vin to the mutual touch ref voltage. For example, when Vin matches or exceeds the mutual touch ref voltage, the comparison signal is low, and when Vin is lower than the mutual touch ref voltage, the comparison signal is high. The comparison signals are provided to the multiplexer.

The multiplexer selects either the self or mutual comparison signal output from the op-amps to provide to the ADC based on a self/mutual select 242 command signal. Here, the self-select 242 signal is provided to the multiplexer, so that the comparison signal from the first op-amp is selected for input to the ADC. The ADC converts the analog comparison signal to a desired digital signal. The ADC may be implemented in a variety of ways. For example, the (ADC) is one of: a flash ADC, a successive approximation ADC, a ramp-compare ADC, a Wilkinson ADC, an integrating ADC, a delta encoded ADC, and/or a sigma-delta ADC of adequate resolution (e.g., 8-bit, 16-bit, 32-bit, etc.).

The buffer 254 receives input from the ADC when the write control signal (W) is received and sends data out as the self-touch indicator signal 220-S when the read control signal (R) is received. The buffer 254 may include or be a 1-bit ADC. For example, the buffer 254 processes the output from the ADC to produce a 1-bit value representative of a touch or no touch (e.g., logic 1 indicates a touch and a logic 0 indicates a no touch).

Figure 31:
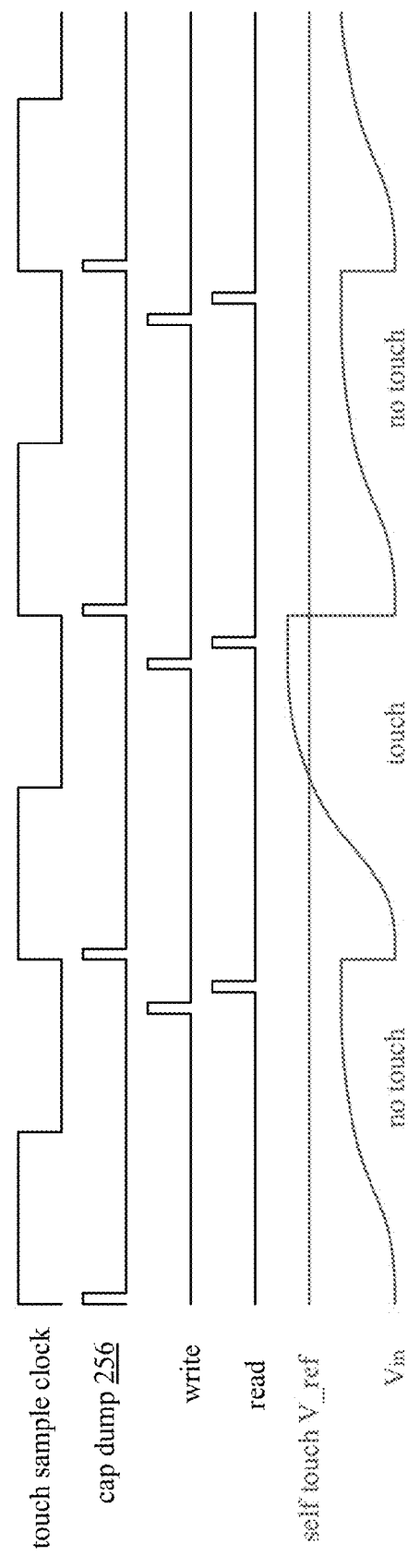
FIG. 31 is an example of signals of the touch indication circuit of FIG. 30 in accordance with the present invention.

FIG. 31 is a schematic block diagram of signals of the touch indication circuit 218 of FIG. 30. A touch sample clock signal dictates how long touch samples are measured from an electrode. For example, the touch sample clock signal is at 300 Hz. The capacitor (cap) dump 256 signal is a pulse signal repeating at the beginning of a clock cycle such that the transistor turns on briefly every 300 Hz to discharge the capacitor. The write command signal is a pulse signal repeating towards the end of a clock cycle to instruct the buffer 254 to write data from the ADC. The read command is a pulse signal repeating towards the end of a clock cycle and after the write command signal to instruct the buffer 254 to read out the data just written from the ADC.

The self-touch voltage reference (V_ref) signal is a set DC voltage with a magnitude indicative of a touch. The Vin signal depicts the voltage generated by the capacitor charging from outputs of the single-ended to differential circuit 250. Vin drops to zero when the capacitor is dumped at the end of a clock cycle. If during a clock cycle, the Vin signal is lower than the self-touch V_ref signal, the interpretation circuit generates a self touch indicator signal 220-S indicating a no touch. If during a clock cycle, the Vin signal meets or exceeds the self-touch V_ref signal, the interpretation circuit generates a self touch indicator signal 220-S indicating a touch.

Figure 32:
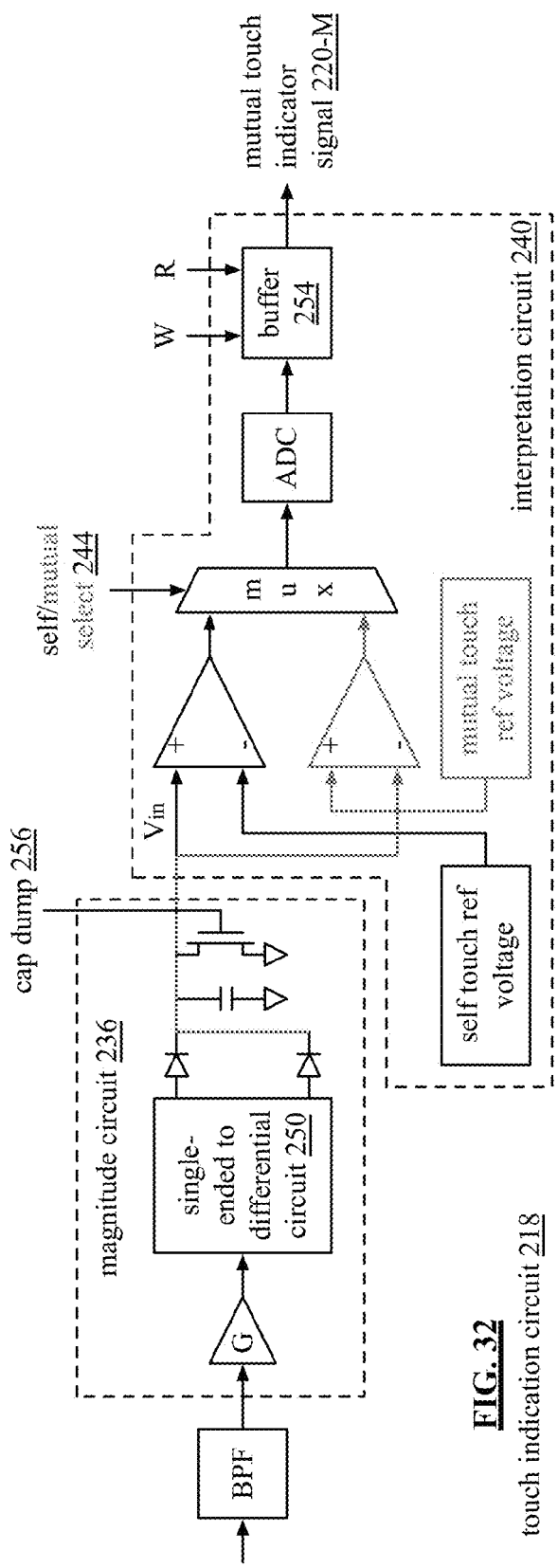
FIG. 32 is a schematic block diagram of another embodiment of a touch indication circuit in accordance with the present invention.

FIG. 32 is a schematic block diagram of an embodiment of a touch indication circuit 218 that includes a bandpass filter (BPF) circuit, a magnitude circuit 236, and an interpretation circuit 240. FIG. 32 operates similarly to FIG. 30 except that detected mutual capacitance is analyzed by the touch interpretation circuit 240.

In an example of operation, a bandpass filtered signal is provided to the gain stage of the magnitude circuit 236. In this example, the bandpass filtered signal includes mutual capacitance information (e.g., the signal was filtered about frequency f2). The gain stage amplifies the bandpass filtered signal to a desired amount for input to the single ended to differential circuit 250.

The single ended to differential circuit 250 creates a differential voltage at the output proportional to the single ended input voltage. As such, when the reference signal is set to ground, one output of the single ended to differential circuit 250 outputs a non-inverted representation of the single ended input voltage and the other output outputs an inverted representation of the single ended input voltage. For example, the top output of the single ended to differential circuit 250 outputs the non-inverted signal and the bottom of the output single ended to differential circuit 250 outputs the inverted signal.

During a positive cycle of the analog single ended input voltage signal, the non-inverted output is positive and the inverted output is negative. The top diode receiving the positive output is forward biased and "on" whereas the bottom diode receiving the negative output is reversed biased and "off." The current from the top output flows from the "on" diode and charges the capacitor.

During a negative cycle of the analog single ended input voltage signal, the non-inverted output is negative and the inverted output is positive. The bottom diode receiving the positive output is forward biased and "on" whereas the top diode receiving the negative output is reversed biased and "off." The current from the bottom output flows from the "on" diode and charges the capacitor. As the capacitor charges, a voltage is built across the capacitor.

The capacitor is discharged or dumped in accordance with the cap dump 256 signal. For example, the cap dump 256 signal is a signal that turns the transistor on and off. When the transistor is on, the capacitor discharges current to the transistor. Therefore, the magnitude circuit 236 produces a rectified signal representative of the magnitude of the input signal as the capacitor is charged.

The output voltage signal from the magnitude circuit 236 (Vin) is provided to a non-inverting input of a first operational amplifier (op-amp) and to an inverting input of a second op-amp of the interpretation circuit 240. The first op-amp compares Vin with a self-touch reference (ref) voltage to produce a comparison signal. The second op-amp compares Vin with a mutual touch reference (ref) voltage to produce a comparison signal. The self-touch and mutual touch reference voltages may be default voltages or determined as discussed with reference to FIGS. 34A-35B. The self-touch touch reference voltage corresponds to a magnitude indicative of a touch and the mutual touch reference voltage corresponds to a magnitude indicative of a no-touch.

The self touch comparison signal includes a comparison of Vin to the self touch ref voltage. For example, when Vin matches or exceeds the self touch ref voltage, the comparison signal is high, and when Vin is lower than the self touch ref voltage, the comparison signal is low. The mutual touch comparison signal includes an inverted comparison of Vin to the mutual touch ref voltage. For example, when Vin matches or exceeds the mutual touch ref voltage, the comparison signal is low, and when Vin is lower than the mutual touch ref voltage, the comparison signal is high. The comparison signals are provided to the multiplexer.

The multiplexer selects either a self or mutual comparison signal to provide to the ADC based on a self/mutual select 244 command signal. Here, the mutual select 244 signal is provided to the multiplexer, so that the comparison signal from the second op-amp is selected for input to the ADC. The ADC converts the analog comparison signal to a desired digital signal. The ADC may be implemented in a variety of ways. For example, the (ADC) is one of: a flash ADC, a successive approximation ADC, a ramp-compare ADC, a Wilkinson ADC, an integrating ADC, a delta encoded ADC, and/or a sigma-delta ADC of adequate resolution (e.g., 8-bit, 16-bit, 32-bit, etc.).

The buffer 254 receives input from the ADC when the write control signal (W) is received and sends data out as the mutual touch indicator signal 220-M when the read control signal (R) is received. The buffer 254 may include or be a 1-bit ADC. For example, the buffer 254 processes the output from the ADC to produce a 1-bit value representative of a touch or no touch (e.g., logic 1 indicates a no touch and a logic 0 indicates a touch).

Figure 33:
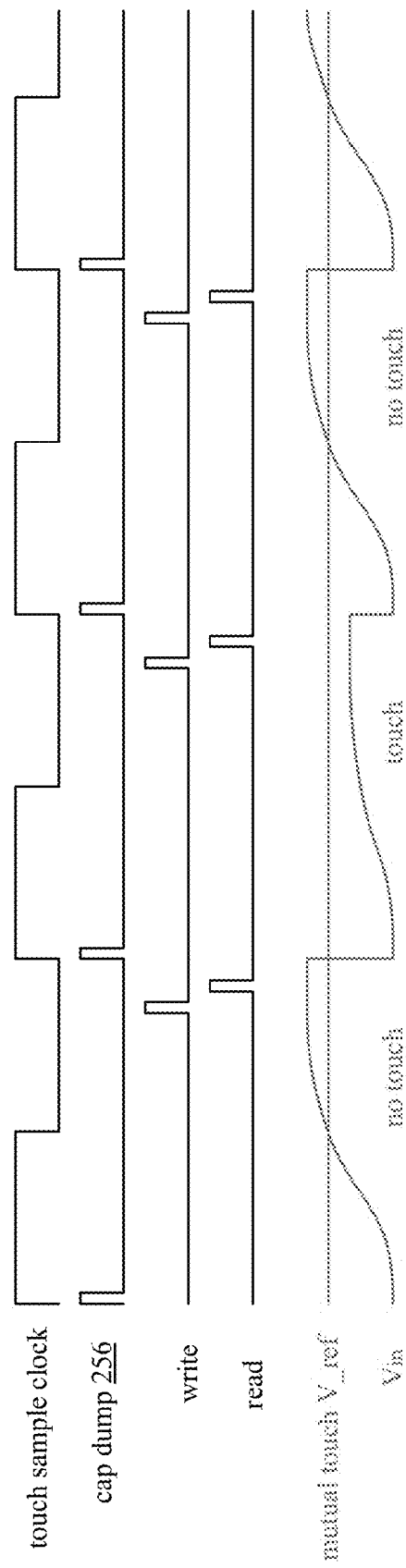
FIG. 33 is an example of signals of the touch indication circuit of FIG. 32 in accordance with the present invention.

FIG. 33 is a schematic block diagram of signals of the touch indication circuit 218 of FIG. 32. A touch sample clock signal dictates how long a touch sample is measured from an electrode. For example, the touch sample clock signal is at 300 Hz. The capacitor (cap) dump 256 signal is a pulse signal repeating at the beginning of a clock cycle such the transistor turns on briefly every 300 Hz to discharge the capacitor. The write command signal is a pulse signal repeating towards the end of a clock cycle to instruct the buffer 254 to write data from the ADC. The read command is a pulse signal repeating towards the end of a clock cycle and after the write command signal to instruct the buffer 254 to read out the data just written from the ADC.

The mutual touch voltage reference (V_ref) signal is a set DC voltage with a magnitude indicative of a no touch. The Vin signal depicts the voltage created by the capacitor charging from the voltage outputs of the single-ended to differential circuit 250. Vin drops to zero when the capacitor is dumped at the end of a clock cycle. If during the clock cycle, the Vin signal is lower than the mutual touch V_ref signal, the interpretation circuit generates a mutual touch indicator signal 220-M indicating a touch. If during the clock cycle, the Vin signal is meets or exceeds the mutual touch V_ref signal, the interpretation circuit generates a mutual touch indicator signal 220-M indicating a no touch.

Figures 34A, 34B:
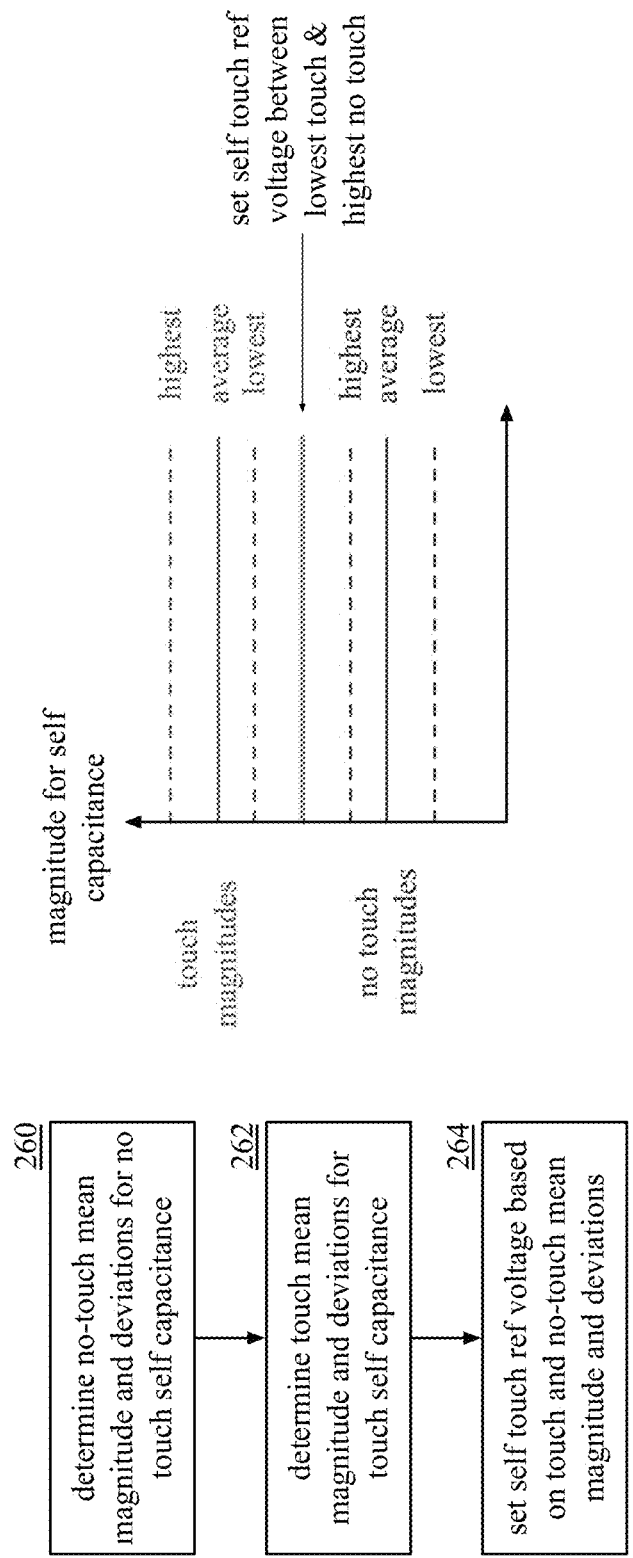
FIG. 34A is a flowchart of an example of a method of determining a self touch reference voltage in accordance with the present invention.
FIG. 34B is an example of determining a self touch reference voltage in accordance with the present invention.

FIG. 34A is a flowchart of an example of a method of determining a self touch reference voltage. The method begins with step 260 where a no-touch mean magnitude and deviations for no touch self-capacitance are determined. For example, when the touch screen display is off and no touches are present, self-capacitance measurements are taken and analyzed.

The method continues with step 262 where a touch mean magnitude and deviations for touch self capacitance are determined. For example, in a calibration mode, a set of test touches on the touchscreen are required and the self capacitance caused by those touches is measured and analyzed.

The method continues with step 264 where the self touch reference voltage is set based on the touch and no-touch mean magnitude and deviations. For example, the self touch reference voltage is set between a lowest deviation from the touch mean magnitude and a highest deviation from the no touch mean magnitude.

FIG. 34B is an example of determining a self touch reference voltage. The measurements discussed with reference to FIG. 34A are shown graphically. A no touch mean magnitude is shown as the solid maroon line where a lowest deviation from the average is shown with a dotted line below the average and a highest deviation of the average is shown with a dotted line above the average.

A touch mean magnitude is shown as the solid red line where a lowest deviation from the average is shown with a dotted line below the average and a highest deviation of the average is shown with a dotted line above the average. The self touch reference voltage is shown as the solid orange line where it is set between lowest deviation from the touch mean magnitude and a highest deviation from the no touch mean magnitude.

Figures 35A, 35B:
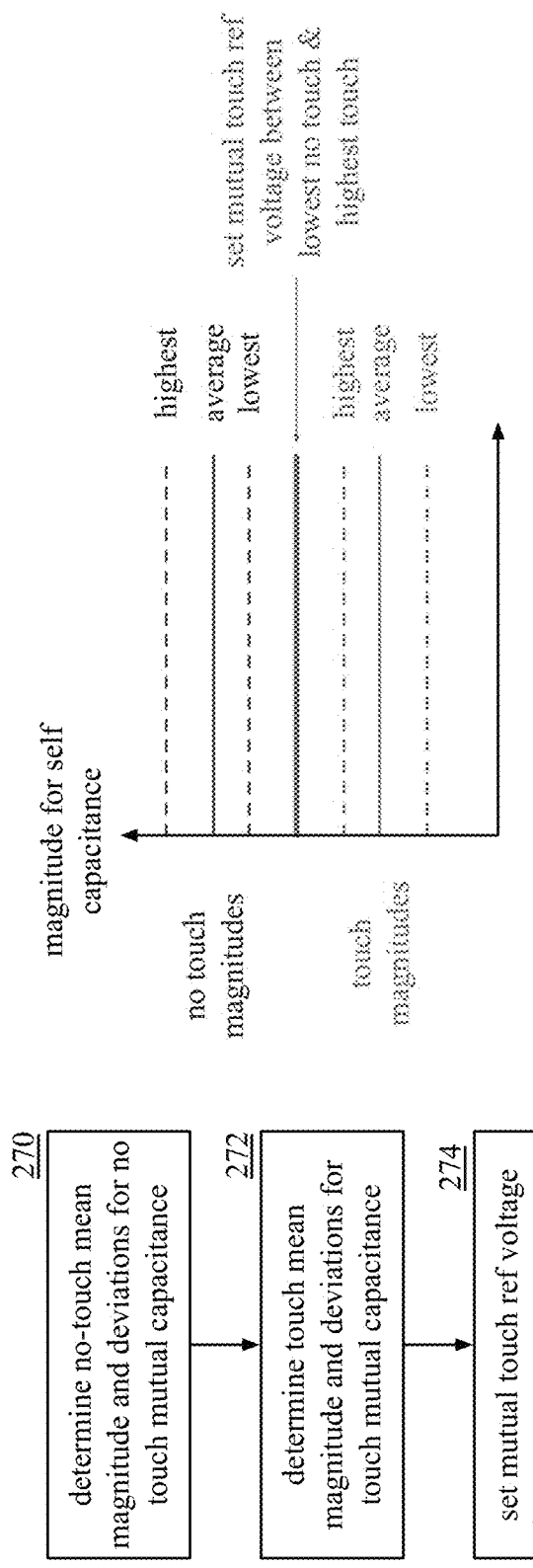
FIG. 35A is a flowchart of an example of a method of determining a mutual touch reference voltage in accordance with the present invention.
FIG. 35B is an example of determining a mutual touch reference voltage in accordance with the present invention.

FIG. 35A is a flowchart of an example of a method of determining a mutual touch reference voltage. The method begins with step 270 where a no-touch mean magnitude and deviations for no touch mutual capacitance are determined. For example, when the touch screen display is off and no touches are present, mutual capacitance measurements are taken and analyzed.

The method continues with step 272 where touch mean magnitude and deviations for touch mutual capacitance are determined. For example, in a calibration mode, a set of test touches on the touchscreen are required and the mutual capacitance caused by those touches is measured and analyzed.

The method continues with step 274 where the mutual touch reference voltage is set based on the touch and no-touch mean magnitude and deviations. For example, the mutual touch reference voltage is set between a lowest deviation from the no touch mean magnitude and a highest deviation from the touch mean magnitude.

FIG. 35B is an example of determining a mutual touch reference voltage. The measurements discussed with reference to FIG. 35A are shown graphically. A touch mean magnitude is shown as the solid light blue line where a lowest deviation from the average is shown with a dotted line below the average and a highest deviation of the average is shown with a dotted line above the average.

A no touch mean magnitude is shown as the solid dark blue line where a lowest deviation from the average is shown with a dotted line below the average and a highest deviation of the average is shown with a dotted line above the average. The mutual touch reference voltage is shown as the solid teal line set between lowest deviation from the no touch mean magnitude and a highest deviation from the touch mean magnitude.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/ or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. An audio in/out device comprises:
an audible in/out transducer operable to:
   convert an audible input signal to an audio receive (RX) signal; and
   convert an audio transmit (TX) signal to an audible output signal; and
an audio receive/transmit (RX/TX) circuit including:
   a digital to analog converter module operable to convert the digital TX signal to an analog TX reference signal;
   an operational amplifier operable to compare an audible in/out transducer voltage with the analog TX reference signal to a produce an analog comparison signal;
   a feedback circuit operable to convert the analog comparison signal to an analog regulation signal;
   a controlled source circuit operable to provide the audio TX signal to the audible in/out transducer based on the regulation signal, wherein the audio TX signal is adjusted based on the regulation signal in order to keep the audible in/out transducer voltage and the analog TX reference signal substantially matching; and
   an analog to digital converter operable to convert the analog comparison signal to the digital Tx/Rx signal, wherein the digital Tx/Rx signal includes a representation of the audio RX signal.

2. The audio in/out device of claim 1 further comprises:
an audio codec module operable to:
   convert the digital Tx/Rx signal into a digital inbound signal in accordance with a desired inbound audio file format; and
   convert a digital outbound signal having an outbound audio file format into the digital TX signal.

3. The audio in/out device of claim 2, wherein the audio codec module comprises:
an audio file formatting module operable to:
   convert the digital outbound signal into the digital TX signal; and
   convert a digital RX signal into the digital inbound signal;
a summing circuit operable to subtract a delayed digital TX signal from the digital Tx/Rx signal to produce the digital RX signal; and
a delay circuit operable to:
   determine the delayed digital TX signal based on the digital TX signal; and
   provide the delayed digital TX signal to the summing circuit.

4. The audio in/out device of claim 2, wherein the audio codec module further comprises:
a level adjust circuit operable to adjust magnitude of the digital TX signal.

5. The audio in/out device of claim 2 further comprises:
an interface module coupled to the audio codec module, wherein the interface module is operable to:
   transmit the digital inbound signal in accordance with an inbound communication protocol; and
   receive the digital outbound signal in accordance with an outbound communication protocol.

6. The audio in/out device of claim 1 further comprises:
a left audible in/out transducer operable to:
   convert a left audible input signal to a left audio receive (RX) signal; and
   convert a left audio transmit (TX) signal to a left audible output signal; and
a left audio receive/transmit (RX/TX) circuit operable to:
   convert a left digital TX signal to the left audio TX signal for transmission to the left audible in/out transducer;
   receive the left audio RX signal from the left audible in/out transducer; and
   convert the left audio RX signal into a left digital transmit/receive (Tx/Rx) signal, wherein the left digital Tx/Rx signal includes a representation of the left audio RX signal; and
a right audible in/out transducer operable to:

convert a right audible input signal to a right audio receive (RX) signal; and convert a right audio transmit (TX) signal to a right audible output signal; and a right audio receive/transmit (RX/TX) circuit operable to:

convert a right digital TX signal to the right audio TX signal for transmission to the right audible in/out transducer;

receive the right audio RX signal from the right audible in/out transducer; and convert the right audio RX signal into a right digital transmit/receive (Tx/Rx) signal, wherein the right digital Tx/Rx signal includes a representation of the right audio RX signal.

7. The audio in/out device of claim 6, wherein the right audio TX signal and the left audio TX signal include different audio information.

8. The audio in/out device of claim 7, wherein the right audio TX signal and the left audio TX signal include substantially matching audio information.

9. An audio in/out device comprises:
an audible in/out transducer operable to:
convert an audible input signal to an audio receive (RX) signal; and
convert an audio transmit (TX) signal to an audible output signal; and
an audio receive/transmit (RX/TX) circuit operable to:
convert an analog TX reference signal to the audio TX signal for transmission to the audible in/out transducer;
receive the audio RX signal from the audible in/out transducer; and
convert the audio RX signal into an analog comparison signal, wherein the analog comparison signal includes a representation of the audio RX signal; and
an audio codec module operable to:
convert the analog comparison signal into a digital inbound signal in accordance with a desired inbound audio file format; and
convert a digital outbound signal having an outbound audio file format into the analog TX reference signal.

10. The audio in/out device of claim 9, wherein the audio RX/TX circuit comprises:
an operational amplifier operable to compare an audible in/out transducer voltage with the analog TX reference signal to produce the analog comparison signal;
a feedback circuit operable to convert the analog comparison signal to an analog regulation signal; and
a controlled source circuit operable to adjust the audio TX signal provided to the audible in/out transducer based on the analog regulation signal in order to keep the audible in/out transducer voltage and the analog TX reference signal substantially matching.

11. The audio in/out device of claim 9, wherein the audio codec module comprises:
an audio file formatting module operable to convert the digital outbound signal into a digital TX signal;
a digital to analog converter module operable to convert the digital TX signal into the analog TX reference signal;
a summing circuit operable to subtract a delayed TX signal from the analog comparison signal to produce an analog receive signal;
an analog delay circuit operable to:
determine the delayed TX signal based on the digital TX signal; and provide the delayed TX signal to the summing circuit; and
an analog to digital converter operable to convert the analog receive signal to a digital receive signal, wherein the audio file formatting module is further operable to convert the digital receive signal into the digital inbound signal in accordance with the desired inbound audio file format.

12. The audio in/out device of claim 11, wherein the audio codec module further comprises:
a level adjust circuit operable to control magnitude of the digital TX signal.

13. The audio in/out device of claim 9 further comprises:
an interface module coupled to the audio codec module, wherein the interface module is operable to:
transmit the digital inbound signal in accordance with an inbound communication protocol; and
receive the digital outbound signal in accordance with an outbound communication protocol.

14. The audio in/out device of claim 9 further comprises:
a left audible in/out transducer operable to:
convert a left audible input signal to a left audio receive (RX) signal; and
convert a left audio transmit (TX) signal to a left audible output signal; and
a left audio receive/transmit (RX/TX) circuit operable to:
convert a left analog TX reference signal to the left audio TX signal for transmission to the left audible in/out transducer;
receive the left audio RX signal from the left audible in/out transducer; and
convert the left audio RX signal into a left analog comparison signal, wherein the left analog comparison signal includes a representation of the left audio RX signal; and
a right audible in/out transducer operable to:
convert a right audible input signal to a right audio receive (RX) signal; and
convert a right audio transmit (TX) signal to a right audible output signal; and
a right audio receive/transmit (RX/TX) circuit operable to:
convert a right analog TX reference signal to the right audio TX signal for transmission to the right audible in/out transducer;
receive the right audio RX signal from the right audible in/out transducer; and
convert the right audio RX signal into a right analog comparison signal, wherein the right analog comparison signal includes a representation of the right audio RX signal; and
the audio codec module operable to:
convert the left and right analog comparison signals into left and right digital inbound signals in accordance with the desired inbound audio file format; and
convert a stereo digital outbound signal having a stereo outbound audio file format into the left and right analog TX reference signals.

15. The audio in/out device of claim 14, wherein the left and right analog TX reference signals include substantially matching audio information.

16. The audio in/out device of claim 14, wherein the left and right analog TX reference signals include different audio information.

* * * * *